(12) United States Patent
Shimizu et al.

(10) Patent No.: US 11,616,453 B2
(45) Date of Patent: Mar. 28, 2023

(54) INTEGRATED CIRCUIT, METHOD FOR MANUFACTURING SAME, AND RADIO COMMUNICATION DEVICE USING SAME

(71) Applicant: TORAY INDUSTRIES, INC., Tokyo (JP)

(72) Inventors: Hiroji Shimizu, Otsu (JP); Seiichiro Murase, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 374 days.

(21) Appl. No.: 16/652,579

(22) PCT Filed: Oct. 25, 2018

(86) PCT No.: PCT/JP2018/039736
§ 371 (c)(1),
(2) Date: Mar. 31, 2020

(87) PCT Pub. No.: WO2019/087937
PCT Pub. Date: May 9, 2019

(65) Prior Publication Data
US 2020/0244182 A1 Jul. 30, 2020

(30) Foreign Application Priority Data
Nov. 2, 2017 (JP) .............................. JP2017-212539

(51) Int. Cl.
*H02M 7/48* (2007.01)
*C01B 32/158* (2017.01)
(Continued)

(52) U.S. Cl.
CPC .............. *H02M 7/48* (2013.01); *C01B 32/158* (2017.08); *G06K 19/02* (2013.01); *G06K 19/07* (2013.01);
(Continued)

(58) Field of Classification Search
CPC ....... H02M 7/48; C01B 32/158; G06K 19/02; G06K 19/07; G06K 19/0723;
(Continued)

(56) References Cited

U.S. PATENT DOCUMENTS

2008/0017923 A1* 1/2008 Akimoto .......... H01L 27/11293
257/E21.678
2008/0019723 A1 1/2008 Akimoto
(Continued)

FOREIGN PATENT DOCUMENTS

JP 2008-47882 A 2/2008
JP 2009-4745 A 1/2009
(Continued)

OTHER PUBLICATIONS

International Search Report, issued in PCT/JP2018/039736, PCT/ISA/210, dated Jan. 8, 2019.
(Continued)

*Primary Examiner* — S M Sohel Imtiaz
(74) *Attorney, Agent, or Firm* — Birch, Stewart, Kolasch & Birch, LLP

(57) ABSTRACT

An integrated circuit includes a memory array that stores data, a rectifying circuit that rectifies an alternating current and generates a direct-current voltage, and a logic circuit that reads data stored in a memory. The memory array includes a first semiconductor memory element having a first semiconductor layer. The rectifying circuit includes a second semiconductor rectifying element having a second semiconductor layer. The logic circuit includes a third semiconductor logic element having a third semiconductor layer. The second semiconductor layer is a functional layer exhibiting a rectifying action and the third semiconductor layer is a channel layer of a logic element. All the first, second and third semiconductor layers, the functional layer exhibiting a rectifying action and the channel layer are formed of the same material including at least one selected from an organic semiconductor, a carbon nanotube, graphene, or fullerene.

14 Claims, 9 Drawing Sheets

(51) Int. Cl.
  *G06K 19/02* (2006.01)
  *G06K 19/07* (2006.01)
  *H01L 27/088* (2006.01)
  *H01L 27/10* (2006.01)
  *H01L 29/786* (2006.01)

(52) U.S. Cl.
  CPC ............ *H01L 27/088* (2013.01); *H01L 27/10* (2013.01); *H01L 29/786* (2013.01)

(58) Field of Classification Search
  CPC ..... H01L 27/088; H01L 27/10; H01L 29/786; H01L 27/283; H01L 51/0048; H01L 29/78684; H01L 51/0541; H01L 51/0545; H01L 51/0558
  See application file for complete search history.

(56) References Cited

U.S. PATENT DOCUMENTS

| | | | | |
|---|---|---|---|---|
| 2008/0283837 | A1* | 11/2008 | Tanada | H01L 27/12 257/E29.295 |
| 2010/0079203 | A1* | 4/2010 | Furutani | G06K 19/0723 327/564 |
| 2016/0035762 | A1* | 2/2016 | Cleeves | H01L 29/66143 257/350 |
| 2018/0026197 | A1* | 1/2018 | Shimizu | H01L 29/868 343/907 |
| 2018/0210337 | A1 | 7/2018 | Wakita et al. | |
| 2019/0027700 | A1* | 1/2019 | Shimizu | H01L 51/052 |
| 2020/0321399 | A1 | 10/2020 | Kawai et al. | |

FOREIGN PATENT DOCUMENTS

| | | |
|---|---|---|
| JP | 2013-45835 A | 3/2013 |
| JP | 2014-112853 A | 6/2014 |
| WO | WO 2016/158862 A1 | 10/2016 |
| WO | WO 2017/030070 A1 | 2/2017 |
| WO | WO 2017/130836 A1 | 8/2017 |
| WO | WO-2017130836 A1 * | 8/2017 .......... C07C 211/02 |
| WO | WO 2017/212972 A1 | 12/2017 |

OTHER PUBLICATIONS

Written Opinion of the International Searching Authority, issued in PCT/JP2018/039736, PCT/ISA/237, dated Jan. 8, 2019.

Taiwanese Search Report for Taiwanese Application No. 107138335, dated Apr. 12, 2022.

Extended European Search Report for European Application No. 18872980.0, dated Jun. 30, 2021.

* cited by examiner

INTEGRATED CIRCUIT, METHOD FOR MANUFACTURING SAME, AND RADIO COMMUNICATION DEVICE USING SAME

TECHNICAL FIELD

The present invention relates to an integrated circuit, a method for manufacturing the same, and a radio communication device including the same.

BACKGROUND ART

In recent years, the development of radio communication systems using RFID (Radio Frequency IDentification) technology as non-contact tags have been promoted. In the RFID system, radio communication is performed between a radio transceiver called a reader/writer and an RFID tag.

RFID tags are expected to be utilized in various applications such as logistics management, product management, and prevention of shoplifting, and the introduction of RFID tags has begun in some IC cards such as traffic cards and product tags. RFID tags have an IC chip and an antenna for radio communication with a reader/writer. The antenna installed in the tag receives the carrier waves transmitted from the reader/writer, and the integrated circuit in the IC chip operates.

RFID tags are expected to be used in all products. For this purpose, it is necessary to cut down the manufacturing cost, and flexible and inexpensive ones that are ridded of a manufacturing process conducted in a vacuum at a high temperature and fabricated using coating and printing technique have been investigated.

For example, as an integrated circuit in an IC chip, a field effect transistor (hereinafter, referred to as FET) fabricated using an organic semiconductor exhibiting excellent moldability as a semiconductor layer has been proposed. By utilizing an organic semiconductor as an ink, a circuit pattern can be directly formed on a flexible substrate by an ink-jet technique, a screening technique and the like. Hence, FETs fabricated using carbon nanotubes (CNT) and organic semiconductors instead of conventional inorganic semiconductors have been actively investigated (for example, see Patent Document 1).

RFID tags include at least a memory circuit which stores data, a rectifying circuit which generates a power supply voltage from an alternating current signal transmitted from a reader/writer, and a logic circuit which demodulates the alternating current signal and reads data stored in the memory circuit. The required functions of elements constituting the respective circuits vary depending on the circuit. Specifically, a rectifying element constituting a rectifying circuit is required to have high power conversion efficiency, namely, low power loss. In addition, the logic circuit is required to be constituted by a logic element which can operate at a high speed. For this reason, it is common to use different elements according to the required functions. For this reason, an integrated circuit cannot be formed using the same material, the material is required to be selected separately for each circuit element, the manufacturing process is complicated, and there arises a problem that the production efficiency decreases and the manufacturing cost increases.

Hence, it has been investigated to decrease the number of fabrication steps by fabricating a third element by utilizing a step of fabricating a first element and a second element having different properties (for example, see Patent Document 2) and to form different elements according to the required functions by separately fabricating elements exhibiting different crystallinity using a continuous wave laser (for example, see Patent Document 3).

PRIOR ART DOCUMENTS

Patent Documents

Patent Document 1: International Publication No. 2009/139339
Patent Document 2: Japanese Patent Laid-open Publication No. 2011-243959
Patent Document 3: Japanese Patent Laid-open Publication No. 2005-277406

SUMMARY OF THE INVENTION

Problems to be Solved by the Invention

In Patent Document 2, a method is investigated in which at the same time as the step of fabricating a semiconductor element having a single crystal semiconductor layer and a semiconductor element having an oxide semiconductor film, these different semiconductor layers are laminated and a rectifying element constituting a rectifying circuit is fabricated. However, the single crystal semiconductor layer and the oxide semiconductor layer are different from each other, and there are a plurality of steps for forming the semiconductor layers.

In Patent Document 3, it is investigated to fabricate an element constituting a memory circuit and an element constituting a logic circuit by separately fabricating elements exhibiting different crystallinity using a continuous wave laser. However, there has been a problem that a laser irradiation step for crystallization is added and the properties of elements exhibiting poor crystallinity vary.

Attention has been paid to the above problems, and an object of the present invention is to provide an excellent integrated circuit by a simple process.

Solutions to the Problems

In order to solve the above problems, the present invention has the following configurations.

In other words, the present invention is an integrated circuit, which includes at least
a memory array that stores data;
a rectifying circuit that rectifies an alternating current and generates a direct-current voltage; and
a logic circuit that reads data stored in the memory array, and
in which
the memory array includes a first semiconductor element having a first semiconductor layer,
the rectifying circuit includes a second semiconductor element having a second semiconductor layer,
the logic circuit includes a third semiconductor element having a third semiconductor layer,
the first semiconductor element is a memory element, the second semiconductor element is a rectifying element, the third semiconductor element is a logic element,
the second semiconductor layer is a functional layer exhibiting a rectifying action, the third semiconductor layer is a channel layer of a logic element, and
the first semiconductor layer, the second semiconductor layer, and the third semiconductor layer are all formed of the same material including at least one selected from an organic semiconductor, a carbon nanotube, graphene, or fullerene.

Effects of the Invention

According to the present invention, a high-performance integrated circuit and a radio communication device including the same can be fabricated by a simple process.

EMBODIMENTS OF THE INVENTION

An integrated circuit of the present invention is an integrated circuit including at least a memory array that stores data, a rectifying circuit that rectifies an alternating current and generates a direct-current voltage, and a logic circuit that reads data stored in the memory array.

<Memory Array>

A memory array according to the present invention includes a first semiconductor element having a first semiconductor layer, and the first semiconductor element is a memory element. The memory array according to the present invention includes a plurality of first wires, at least one second wire intersecting these plural first wires, and a plurality of memory elements provided in accordance with the respective intersections of these plural first wires and at least one second wire on an insulating substrate. These plural memory elements are a memory element equipped with a source electrode and a drain electrode which are disposed apart from each other, a gate electrode connected to one of the at least one second wire, and a gate insulating layer which electrically insulates the source electrode and the drain electrode from the gate electrode. In each of the plurality of memory elements, either of the source electrode or the drain electrode is connected to one of the plurality of first wires. Furthermore, at least one of the plurality of memory elements has a semiconductor layer in contact with the source electrode and the drain electrode, and the semiconductor layer contains at least one selected from an organic semiconductor, carbon nanotubes, graphene, or fullerene.

These plural memory elements are composed of two kinds of elements in which the electric properties of the source electrode and the drain electrode are different from each other depending on the semiconductor layer. The information (for example, unique information such as an ID number) to be recorded in the memory array is determined by the arrangement in which these two kinds of memory elements are arbitrarily combined.

In the present invention, the "region between the source electrode and the drain electrode" is a region located between these source electrode and drain electrode in a case in which the source electrode and the drain electrode are viewed in plan from the thickness direction of the memory element (for example, the film thickness direction of the gate insulating layer). Such a region includes a region (a region not sandwiched between the source electrode and the drain electrode) facing this sandwiched region from the thickness direction (for example, from above) of the memory element as well as the region sandwiched between the source electrode and the drain electrode.

Figure 1:
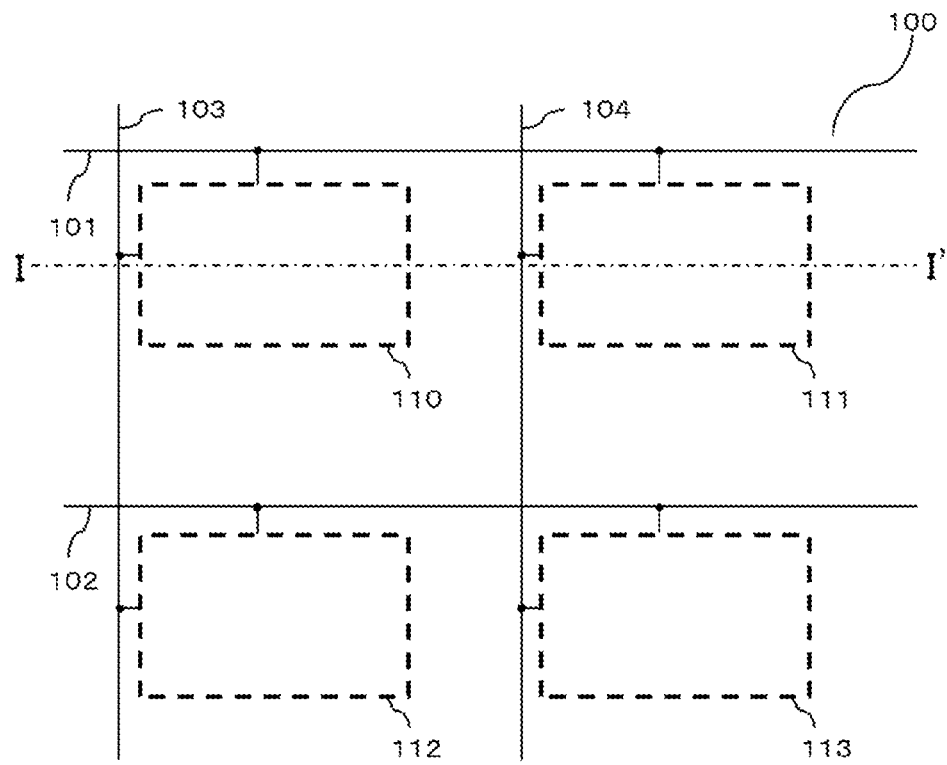
FIG. 1 is a schematic view illustrating a configuration example of a memory array of the present invention.

Examples of a method for forming the two kinds of memory elements in which the electric properties of the source electrode and the drain electrode are different from each other include a method in which two kinds of memory elements are formed in which the electric properties of the source electrode and the drain electrode are different from each other depending on the presence or absence of a semiconductor layer. FIG. 1 illustrates a configuration example of the memory array. As illustrated in FIG. 1, a memory array 100 includes two first wires 101 and 102, two second wires 103 and 104, and four memory elements 110, 111, 112, and 113 on a substrate (not illustrated). As illustrated in FIG. 1, the first wires 101 and 102 are disposed so as to be lined up apart from each other with a predetermined direction as a longitudinal direction. The second wires 103 and 104 are disposed so as to be lined up apart from each other with the direction intersecting these first wires 101 and 102 as a longitudinal direction. In addition, the first wires 101 and 102 and the second wires 103 and 104 are disposed so as to intersect each other in a state of being insulated from each other. Meanwhile, the memory elements 110, 111, 112, and 113 are disposed in four regions (regions surrounded by broken lines in FIG. 1) defined by the respective intersections of the first wires 101 and 102 and the second wires 103 and 104, respectively.

Incidentally, the memory array 100 for 4 bits is illustrated in FIG. 1 for the simplification of description, but it is needless to say that the memory array 100 is not limited to one for 4 bits but may be one for 2 bits or more.

Figure 2:
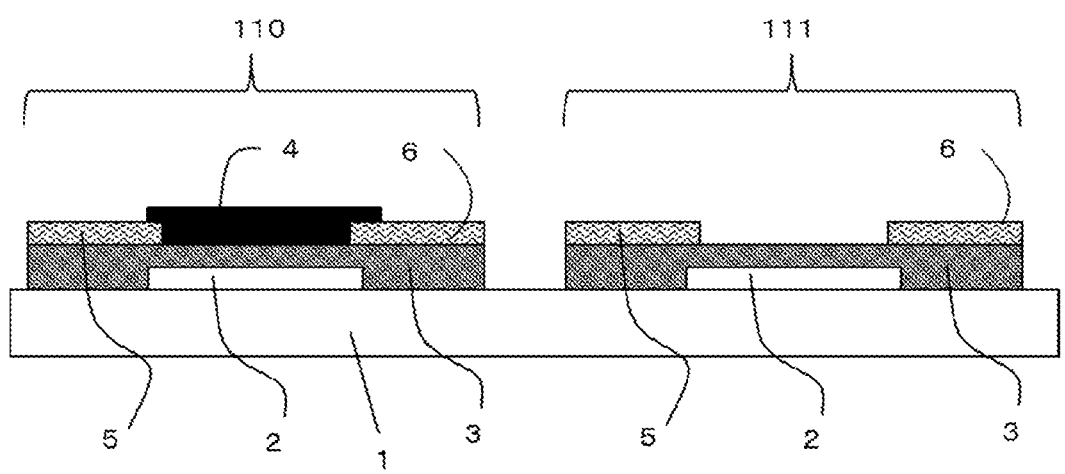
FIG. 2 is a schematic cross-sectional view taken along line I-I' of the memory array illustrated in FIG. 1.

FIG. 2 is a schematic cross-sectional view taken along the line I-I' of the memory array illustrated in FIG. 1. A configuration example of a memory element of the memory array is illustrated in FIG. 2. As illustrated in FIG. 2, the memory elements 110 and 111, which are an example of the two kinds of memory elements, are formed on a substrate 1. The memory elements 110 and 111 both have a source electrode 5, a drain electrode 6, a gate insulating layer 3, and a gate electrode 2 on the substrate 1. The gate electrode 2 is electrically insulated from the source electrode 5 and the drain electrode 6 by the gate insulating layer 3. The source electrode 5 and the drain electrode 6 are lined up on the gate insulating layer 3 in a state of being apart from each other. For example, one memory element 110 of these two kinds of memory elements further has the semiconductor layer 4 in a region between the source electrode 5 and the drain electrode 6. The other memory element 111 does not have the semiconductor layer 4 in this region. The information, for example, "0" or "1" to be recorded in the memory element 110 and the memory element 111 is determined by this. In other words, the memory element 110 and the memory element 111 respectively record information different from each other depending on the presence or absence of the semiconductor layer 4. The reason why the information to be recorded in the two kinds of elements is different from each other in this manner is because a current flows through the memory element 110 having the semiconductor layer 4 but a current does not flow through the memory element 111 which does not have the semiconductor layer 4 when the respective memory elements 110 and 111 are selected, that is, when a certain voltage is applied to the gate electrodes 2 of the respective memory elements 110 and 111.

The structure of the memory element applied to the memory array 100 described above is a so-called bottom gate and bottom contact structure in which the gate electrode 2 is disposed on the lower side (substrate 1 side) of the semiconductor layer 4 and the source electrode 5 and the drain electrode 6 are disposed on the lower surface of the semiconductor layer 4 as illustrated in FIG. 2. However, the structure of the memory element is not limited to this and may be, for example, a so-called top gate structure in which the gate electrode 2 is disposed on the upper side (the side opposite to the substrate 1) of the semiconductor layer 4 or a so-called top contact structure in which the source electrode 5 and the drain electrode 6 are disposed on the upper surface of the semiconductor layer 4.

In addition, other examples of the method for forming the two kinds of memory elements in which the electric properties of the source electrode and the drain electrode are different from each other include a difference in film thickness of the semiconductor layer and a difference in CNT concentration. The difference in CNT concentration refers to a difference in the total length of CNTs present in an arbitrary 1 μm$^2$ region in the semiconductor layer. Examples of a method for measuring the total length of CNTs include a method in which an arbitrary 1 μm$^2$ region is selected from the image of the semiconductor layer attained using an atomic force microscope and the lengths of all CNTs contained in the region are measured and summed. In addition, the difference in configuration between the first semiconductor layer and the second semiconductor layer is not limited to these as long as the respective electric properties are sufficiently differentiated.

As still another method, for example, the plurality of memory elements each have a semiconductor layer in contact with the gate insulating layer in a region between the source electrode and the drain electrode. Furthermore, a method is exemplified in which the two kinds of memory elements in which the electric properties of the source electrode and the drain electrode are different from each other are formed as at least one of the plurality of memory elements has a coating layer formed of an insulating material applied so as to be in contact with the semiconductor layer on the side opposite to the gate insulating layer in a region between the source electrode and the drain electrode.

(Insulating Substrate)

The insulating substrate of the memory array may be formed of any material as long as at least the surface on which the electrode system is disposed is insulating. For example, inorganic materials such as silicon wafer, glass, sapphire, and alumina sintered body and organic materials such as polyimide, polyvinyl alcohol, polyvinyl chloride, polyethylene terephthalate, polyvinylidene fluoride, polysiloxane, polyvinylphenol (PVP), polyester, polycarbonate, polysulfone, polyethersulfone, polyethylene, polyphenylene sulfide, and polyparaxylene are suitably used. Moreover, the insulating substrate may be, for example, an insulating substrate in which a plurality of materials are laminated such as an insulating substrate in which a PVP film is formed on a silicon wafer or an insulating substrate in which a polysiloxane film is formed on polyethylene terephthalate.

(Electrode and Wire)

The material to be used in the electrodes and wires in the memory elements of the memory array may be any one as along as it is a conductive material which can be generally used as an electrode. Examples of such a conductive material include conductive metal oxides such as tin oxide, indium oxide, and indium tin oxide (ITO). Examples thereof also include metals such as platinum, gold, silver, copper, iron, tin, zinc, aluminum, indium, chromium, lithium, sodium, potassium, cesium, calcium, magnesium, palladium, molybdenum, amorphous silicon, and polysilicon, alloys of a plurality of metals selected from these, and inorganic conductive substances such as copper iodide and copper sulfide. Examples thereof also include polythiophene, polypyrrole, polyaniline, a complex of polyethylene dioxythiophene and polystyrene sulfonic acid, and a conductive polymer of which the conductivity has been improved by being doped with iodine and the like. Examples thereof further include a carbon material and a material containing an organic component and a conductor.

The material containing an organic component and a conductor enhances the flexibility of the electrode and exhibits favorable adhesive property even when being bent and favorable electrical connection. The organic component is not particularly limited, and examples thereof include a monomer, an oligomer or a polymer, a photopolymerization initiator, a plasticizer, a leveling agent, a surfactant, a silane coupling agent, an antifoaming agent, and a pigment. An oligomer or a polymer is preferable from the viewpoint of improving the folding resistance of electrode. However, the conductive materials for the electrodes and wires are not limited to these. These conductive materials may be used singly, or a plurality of materials may be used by being laminated or mixed.

Moreover, the width and thickness of electrode and the interval between the respective electrodes (for example, the interval between the first electrode and the second electrode) are arbitrary. Specifically, the width of electrode is preferably 5 μm or more and 1 mm or less. The thickness of electrode is preferably 0.01 μm or more and 100 μm or less. The interval between the first electrode and the second electrode is preferably 1 μm or more and 500 μm or less. However, these dimensions are not limited to those described above.

Furthermore, the width and thickness of wire are also arbitrary. Specifically, the thickness of wire is preferably 0.01 μm or more and 100 μm or less. The width of wire is preferably 5 μm or more and 500 μm or less. However, these dimensions are not limited to those described above.

Examples of the method for forming the electrodes and wires include a method using a known technique such as resistive heating evaporation, electron beam, sputtering, plating, CVD, ion plating coating, inkjet, and printing. Examples thereof also include a method in which the electrodes and wires are formed by applying a paste of a material containing the above-described organic component and conductor to an insulating substrate by a known technique such as a spin coating method, a blade coating method, a slit die coating method, a screen printing method, a bar coater method, a mold method, a printing and transferring method, or a dipping and pulling method and drying the paste using an oven, a hot plate, infrared rays, or the like. However, the method for forming the electrodes and wires is not particularly limited as long as it is a method by which electric conduction can be achieved.

The method for forming the electrodes and wires in a pattern is not particularly limited, and examples thereof include a method in which the electrode thin film fabricated by the above method is patterned into a desired shape by a known photolithography method and the like. Alternatively, a method is exemplified in which a pattern is formed through a mask having a desired shape at the time of vapor deposition or sputtering of conductive materials for the electrodes and wires. In addition, a method is also exemplified in which a pattern is directly formed using an ink jet and by a printing method.

The electrode pattern and the wire pattern may be separately processed and formed or at least two of the plurality of electrode patterns and wire patterns may be collectively processed and formed. It is preferable to collectively process the electrode pattern and wire pattern from the viewpoint of a decrease in the number of processing steps, ease of pattern connection, and the accuracy of patterns.

(Gate Insulating Layer)

The material to be used in the gate insulating layer in the memory element of the memory array is not particularly limited, and examples thereof include inorganic materials such as silicon oxide and alumina; organic polymer materials such as polyimide, polyvinyl alcohol, polyvinyl chloride, polyethylene terephthalate, polyvinylidene fluoride, polysiloxane, and polyvinylphenol (PVP); or any mixture of inorganic material powders and organic materials. Among the organic materials, those containing an organic compound having a bond between silicon and carbon are preferable from the viewpoint of adhesive property to the substrate or the electrode.

Examples of the organic compound having a bond between silicon and carbon preferably include a silane compound represented by Formula (1). In addition, an epoxy group-containing silane compound represented by Formula (2), a condensate thereof, a polysiloxane containing these as a copolymer component, or the like is exemplified. Among these, polysiloxane is more preferable since it exhibits high insulating property and can be cured at a low temperature.

$$R^1_m Si(OR^2)_{4-m} \quad (1)$$

Here, $R^1$ represents hydrogen, an alkyl group, a heterocyclic group, an aryl group, or an alkenyl group and $R^1$s may be the same as or different from each other when there are a plurality of $R^1$s. $R^2$ represents hydrogen, an alkyl group, an acyl group, or an aryl group and $R^2$s may be the same as or different from each other when there are a plurality of $R^2$s. m represents an integer 1 to 3.

$$R^3_n R^4_l Si(OR^5)_{4-n-l} \quad (2)$$

Here, $R^3$ represents an alkyl group having one or more epoxy groups at a part of the chain and $R^3$s may be the same as or different from each other when there are a plurality of $R^3$s. $R^4$ represents hydrogen, an alkyl group, a heterocyclic group, an aryl group, or an alkenyl group and $R^4$s may be the same as or different from each other when there are a plurality of $R^4$s. $R^5$ represents hydrogen, an alkyl group, an acyl group, or an aryl group and $R^5$s may be the same as or different from each other when there are a plurality of $R^5$s. l represents an integer 0 to 2, and n represents 1 or 2. However, l+n≤3.

The description of the alkyl group, acyl group, and aryl group in $R^1$ to $R^5$ is the same as the description of $R^6$ to $R^{11}$ to be described later.

The heterocyclic group in $R^1$ and $R^4$ refers to, for example, a group derived from an aliphatic ring having atoms other than carbon in the ring such as a pyran ring, a piperidine ring, or an amide ring, and this may or may not have a substituent. The number of carbon atoms in the heterocyclic group is not particularly limited but is preferably in a range of 2 or more and 20 or less.

The alkenyl group in $R^1$ and $R^4$ refers to, for example, an unsaturated aliphatic hydrocarbon group having a double bond such as a vinyl group, an allyl group, or a butadienyl group, and this may or may not have a substituent. The number of carbon atoms in the alkenyl group is not particularly limited but is preferably in a range of 2 or more and 20 or less.

The alkyl group having an epoxy group at a part of the chain of $R^3$ refers to an alkyl group having a three-membered ring ether structure formed by bonding two adjacent carbon atoms to one oxygen atom at a part of the chain. This includes both a case in which two adjacent carbon atoms contained in the main chain, which is the moiety in which carbon atoms are continuously bonded to each other in the longest length in the alkyl group, are utilized and a case in which two adjacent carbon atoms contained in moieties other than the main chain, so-called side chains, are utilized.

By introducing a silane compound represented by Formula (1) as a copolymer component of polysiloxane, it is possible to form an insulating film which exhibits high insulating property and chemical resistance and has few traps therein while exhibiting high transparency in the visible light region.

Moreover, it is preferable that at least one of m $R^1$s in Formula (1) is an aryl group since the flexibility of the insulating film is improved and cracking can be prevented.

Specific examples of the silane compound represented by Formula (1) include vinyltrimethoxysilane, vinyltriethoxysilane, 3-methacryloxypropyltrimethoxysilane, 3-methacryloxypropyltriethoxysilane, methyltrimethoxysilane, methyltriethoxysilane, ethyltrimethoxysilane, ethyltriethoxysilane, propyltrimethoxysilane, propyltriethoxysilane, hexyltrimethoxysilane, octadecyltrimethoxysilane, octadecyltriethoxysilane, phenyltrimethoxysilane, phenyltriethoxysilane, p-tolyltrimethoxysilane, benzyltrimethoxysilane, α-naphthyltrimethoxysilane, β-naphthyltrimethoxysilane, 3-aminopropyltriethoxysilane, N-(2-aminoethyl)-3-aminopropyltrimethoxysilane, 3-chloropropyltrimethoxysilane, dimethyldimethoxysilane, dimethyldiethoxysilane, diphenyldimethoxysilane, diphenyldiethoxysilane, methylphenyldimethoxysilane, methylvinyldimethoxysilane, methylvinyldiethoxysilane, 3-aminopropylmethyldimethoxysilane, N-(2-aminoethyl)-3-aminopropylmethyldimethoxysilane, 3-chloropropylmethyldimethoxysilane, 3-chloropropylmethyldiethoxysilane, cyclohexylmethyldimethoxysilane, 3-methacryloxypropyldimethoxysilane, octadecylmethyldimethoxysilane, trimethoxysilane, trifluoroethyltrimethoxysilane, trifluoroethyltriethoxysilane, trifluoroethyltriisopropoxysilane, trifluoropropyltrimethoxysilane, trifluoropropyltriethoxysilane, trifluoropropyltriisopropoxysilane, heptadecafluorodecyltrimethoxysilane, heptadecafluorodecyltriethoxysilane, heptadecafluorodecyltriisopropoxysilane, tridecafluorooctyltriethoxysilane, tridecafluorooctyltrimethoxysilane, tridecafluorooctyltriisopropoxysilane, trifluoroethylmethyldimethoxysilane, trifluoroethylmethyldiethoxysilane, trifluoroethylmethyldiisopropoxysilane, trifluoropropylmethyldimethoxysilane, trifluoropropylmethyldiethoxysilane, trifluoropropylmethyldiisopropoxysilane, heptadecafluorodecylmethyldimethoxysilane, heptadecafluorodecylmethyldiethoxysilane, heptadecafluorodecylmethyldiisopropoxysilane, tridecafluorooctylmethyldimethoxysilane, tridecafluorooctylmethyldiethoxysilane, tridecafluorooctylmethyldiisopropoxysilane, trifluoroethylethyldimethoxysilane, trifluoroethylethyldiethoxysilane, trifluoroethylethyldiisopropoxysilane, trifluoropropylethyldimethoxysilane, trifluoropropylethyldiethoxysilane, trifluoropropylethyldiisopropoxysilane, heptadecafluorodecylethyldimethoxysilane, heptadecafluorodecylethyldiethoxysilane, heptadecafluorodecylethyldiisopropoxysilane, tridecafluorooctylethyldiethoxysilane, tridecafluorooctylethyldimethoxysilane, tridecafluorooctylethyldiisopropoxysilane, and p-trifluorophenyltriethoxysilane.

Among the silane compounds, it is preferable to use vinyltrimethoxysilane, vinyltriethoxysilane, methyltrimethoxysilane, methyltriethoxysilane, ethyltrimethoxysilane, ethyltriethoxysilane, propyltrimethoxysilane, propyltriethoxysilane, hexyltrimethoxysilane, octadecyltrimethoxysilane, octadecyltriethoxysilane, phenyltrimethoxysilane, p-tolyltrimethoxysilane, benzyltrimethoxysilane, α-naphthyltrimethoxysilane, β-naphthyltrimethoxysilane, trifluoroethyltrimethoxysilane, trimethoxysilane, and p-trifluorophenyltriethoxysilane in which m=1 in order to increase the crosslink density and improve the chemical resistance and insulating property. In addition, it is particularly preferable to use vinyltrimethoxysilane, methyltrimethoxysilane, ethyltrimethoxysilane, propyltrimethoxysilane, hexyltrimethoxysilane, octadecyltrimethoxysilane, phenyltrimethoxysilane, p-tolyltrimethoxysilane, benzyltrimethoxysilane, α-naphthyltrimethoxysilane, β-naphthyltrimethoxysilane, trifluoroethyltrimethoxysilane, and trimethoxysilane in which $R^2$ is a methyl group from the viewpoint of mass productivity.

Moreover, it is more preferable to combine two or more silane compounds represented by Formula (1). Among these, it is particularly preferable to combine a silane compound having an alkyl group and a silane compound having an aryl group since both high insulating property and flexibility for preventing cracking can be achieved.

In addition, specific examples of the epoxy group-containing silane compound represented by Formula (2) include γ-glycidoxypropyltrimethoxysilane, β-(3,4-epoxycyclohexyl)ethyltrimethoxysilane, γ-glycidoxypropyltriethoxysilane, β-(3,4-epoxycyclohexyl)ethyltriethoxysilane, γ-glycidoxypropyltriisopropoxysilane, β-(3,4-epoxycyclohexyl)ethyltriisopropoxysilane,
γ-glycidoxypropylmethyldimethoxysilane, β-(3,4-epoxycyclohexyl)ethylmethyldimethoxysilane, γ-glycidoxypropylmethyldiethoxysilane, β-(3,4-epoxycyclohexyl)ethylmethyldiethoxysilane,
γ-glycidoxypropylmethyldiisopropoxysilane, β-(3,4-epoxycyclohexyl)ethylmethylisopropoxysilane, γ-glycidoxypropylethyldimethoxysilane, β-(3,4-epoxycyclohexyl)ethylethyldimethoxysilane, γ-glycidoxypropylethyldietoxysilane, β-(3,4-epoxycyclohexyl)ethylethyldietoxysilane, γ-glycidoxypropylethyldiisopropoxysilane, β-(3,4-epoxycyclohexyl)ethylethyldiisopropoxysilane, β-(3,4-epoxycyclohexyl)propyltrimethoxysilane, and γ-glycidoxyethyltrimethoxysilane.

Among these, it is preferable to use γ-glycidoxypropyltrimethoxysilane, β-(3,4-epoxycyclohexyl)ethyltrimethoxysilane, γ-glycidoxypropyltriethoxysilane, β-(3,4-epoxycyclohexyl)ethyltriethoxysilane, -glycidoxypropyltriisopropoxysilane, β-(3,4-epoxycyclohexyl)ethyltriisopropoxysilane, β-(3,4-epoxycyclohexyl)propyltrimethoxysilane, and γ-glycidoxyethyltrimethoxysilane in which n=1 and l=0 in order to increase the crosslink density and improve the chemical resistance and insulating property. In addition, it is particularly preferable to use γ-glycidoxypropyltrimethoxysilane, β-(3,4-epoxycyclohexyl)ethyltrimethoxysilane, β-(3,4-epoxycyclohexyl)propyltrimethoxysilane, and γ-glycidoxyethyltrimethoxysilane in which $R^5$ is a methyl group from the viewpoint of mass productivity.

The film thickness of the gate insulating layer in the memory element of the memory array is preferably 0.05 to 5 μm and more preferably 0.1 to 1 μm. A uniform thin film can be easily formed by setting the film thickness to this range. The film thickness can be measured using an atomic force microscope and by an ellipsometry method, and the like.

The method for fabricating the gate insulating layer in the memory element of the memory array is not particularly limited, and examples thereof include a method in which a coating film obtained by applying a composition containing a material for forming the gate insulating layer to a substrate, and drying the composition is subjected to a heat treatment if necessary. Examples of the coating method include known coating methods such as a spin coating method, a blade coating method, a slit die coating method, a screen printing method, a bar coater method, a mold method, a printing and transferring method, a dipping and pulling method, and an ink jet method. The temperature for the heat treatment of the coating film is preferably in a range of 100° C. to 300° C.

The gate insulating layer may be a single layer or a plurality of layers. Moreover, one layer may be formed of a plurality of insulating materials or a plurality of gate insulating layers may be formed by laminating a plurality of insulating materials.

(Semiconductor Layer)

The first semiconductor layer in the memory element of the memory array contains at least one selected from an organic semiconductor, CNT, graphene, or fullerene.

Examples of the organic semiconductor include polythiophenes, polypyrroles, poly(p-phenylenevinylene)s such as poly(p-phenylenevinylene), polyanilines, polyacetylenes, polydiacetylenes, polycarbazoles, polyfurans, polyheteroaryls, fused polycyclic low molecular compound semiconductors, and low molecular compound semiconductors having heteroaromatic rings. Examples of polythiophenes include poly-3-hexylthiophene and polybenzothiophene. Examples of polyfurans include polyfuran and polybenzofuran. Examples of polyheteroaryls include those having a nitrogen-containing aromatic ring as a constitutional unit, such as pyridine, quinoline, phenanthroline, oxazole, and oxadiazole. Examples of fused polycyclic low-molecular compound semiconductors include anthracene, pyrene, naphthacene, pentacene, hexacene, and rubrene. Examples of low molecular compound semiconductors having heteroaromatic rings include furan, thiophene, benzothiophene, dibenzofuran, pyridine, quinoline, phenanthroline, oxazole, and oxadiazole.

Among these, the first semiconductor layer more preferably contains CNT from the viewpoint of being able to be formed at a low temperature of 200° C. or less and of exhibiting high semiconductor properties.

As CNT, any of single-walled CNT in which one carbon film (graphene sheet) is wound in a cylindrical shape, double-walled CNT in which two graphene sheets are concentrically wound, or multi-walled CNT in which a plurality of graphene sheets are concentrically wound may be used, but single-walled CNT is preferably used in order to attain high semiconductor properties. CNT can be obtained by an arc discharge method, a chemical vapor deposition method (CVD method), a laser ablation method, and the like.

In addition, CNT more preferably contains a CNT semiconductor at 80% by weight or more. CNT still more preferably contains a CNT semiconductor at 95% by weight or more. A known method can be used as a method for obtaining CNT containing a CNT semiconductor at 80% by weight or more. For example, a method in which ultracentrifugation is performed in the presence of a density gradient agent, a method in which a specific compound is selectively attached to the surface of a CNT semiconductor or a CNT metal and separation is performed utilizing the difference in solubility, and a method in which separation is performed utilizing the difference in electric properties by electrophoresis and the like. Examples of a method for measuring the content of CNT semiconductor include a method in which the content is calculated from the absorption area ratio in the visible-near infrared absorption spectrum and a method in which the content is calculated from the intensity ratio in the Raman spectrum.

In the present invention, in a case in which CNT is used in the semiconductor layer of a semiconductor element, the length of CNT is preferably shorter than the distance between the source electrode and the drain electrode. The average length of CNTs depends on the distance between the source electrode and the drain electrode but is preferably 2 µm or less.

The average length of CNTs refers to the average value of the lengths of 20 CNTs randomly picked up. Examples of a method for measuring the average CNT length include a method in which 20 CNTs are randomly picked up from an image attained using an atomic force microscope and the average value of the lengths thereof is attained.

In general, commercially available CNTs have distribution in length and contain CNTs longer than the distance between electrodes in some cases, and it is thus preferable to add a step of decreasing the CNT length so that the CNT length is shorter than the distance between the source electrode and the drain electrode. For example, a method is effective in which CNTs are cut into short fibers by an acid treatment using nitric acid, sulfuric acid or the like, an ultrasonic treatment, or a freezing and pulverization method. Moreover, it is still more preferable to concurrently utilize separation by a filter from the viewpoint of improving the purity of CNT.

Moreover, the diameter of CNT is not particularly limited but is preferably 1 nm or more and 100 nm or less and more preferably 50 nm or less. The diameter of CNT is still more preferably 5 nm or less.

In the present invention, it is preferable to provide a step of uniformly dispersing CNTs in a solvent and filtering the dispersion through a filter. CNT shorter than the distance between a pair of electrodes is efficiently obtained by obtaining CNT smaller than the filter pore size from the filtrate. In this case, a membrane filter is preferably used as the filter. The pore size of the filter to be used for filtration may be smaller than the distance between a pair of electrodes and is preferably 0.5 to 10 µm. Examples of other methods for shortening CNT include an acid treatment and a freezing and pulverization treatment.

In addition, it is preferable to use a carbon nanotube composite in which a conjugated polymer is attached to at least a part of the surface of CNT. The same applies not only to the first semiconductor layer but also to a functional layer exhibiting a rectifying action as the second semiconductor layer and a channel layer as the third semiconductor layer as to be described later. It is preferable that at least one of the semiconductor layer, functional layer exhibiting a rectifying action, or channel layer of the memory element contains a carbon nanotube composite in which a conjugated polymer is attached to at least a part of the surface of carbon nanotube.

The state in which a conjugated polymer is attached to at least a part of the surface of CNT means a state in which a part or the whole of the surface of CNT is covered with a conjugated polymer. It is presumed that the reason why a conjugated polymer can cover CNT is that interaction occurs as the π electron clouds derived from the conjugated structures of these two overlap each other. Whether or not CNT is covered with a conjugated polymer can be determined by the fact that the reflection color of covered CNT approaches the color of the conjugated polymer from the color of uncovered CNT. Quantitatively, the presence of attached matter and the weight ratio of attached matter to CNT can be identified by elemental analysis such as X-ray photoelectron spectroscopy (XPS).

Moreover, the weight average molecular weight of the conjugated polymer is preferably 1,000 or more from the viewpoint of easy attachment to CNT. Here, the conjugated polymer refers to a compound in which the repeating unit has a conjugated structure and has a degree of polymerization of 2 or more.

It is possible to uniformly disperse CNTs in a solution without impairing the high electric properties of CNTs by attaching a conjugated polymer to at least a part of the surface of CNT. In addition, it is possible to form a uniformly dispersed CNT film from a solution in which CNTs are uniformly dispersed by a coating method. This makes it possible to realize high semiconductor properties.

Examples of the method for attaching a conjugated polymer to CNT include (I) a method in which CNT is added to and mixed in a molten conjugated polymer, (II) a method in which a conjugated polymer is dissolved in a solvent and CNT is added to and mixed in this solution, (III) a method in which CNT is pre-dispersed in a solvent by ultrasonic waves and the like and a conjugated polymer is added to and mixed in the dispersion, and (IV) a method in which a conjugated polymer and CNT are added to a solvent and mixed together by irradiating this mixed system with ultrasonic waves. In the present invention, any method may be used or a plurality of methods may be combined.

Examples of the conjugated polymer include a polythiophene-based polymer, a polypyrrole-based polymer, a polyaniline-based polymer, a polyacetylene-based polymer, a poly-p-phenylene-based polymer, and a poly-p-phenylene-vinylene-based polymer, but the conjugated polymer is not particularly limited. As the polymer, those in which a single monomer unit is lined up are preferably used but those in which different monomer units are block-copolymerized and those in which different monomer units are random-copolymerized may be used. In addition, those obtained by graft polymerization can also be used.

In the present invention, a polythiophene-based polymer which is easily attached to CNT and easily forms a CNT composite is preferably used among the polymers. Those containing a fused heteroaryl unit having a nitrogen-containing double bond in the ring and a thiophene unit in the repeating unit are more preferable.

Examples of a fused heteroaryl unit having a nitrogen-containing double bond in the ring include units such as thienopyrrole, pyrrolothiazole, pyrrolopyridazine, benzimidazole, benzotriazole, benzoxazole, benzothiazole, benzothiadiazole, quinoline, quinoxaline, benzotriazine, thienooxazole, thienopyridine, thienothiazine, and thienopyrazine. Among these, a benzothiadiazole unit or a quinoxaline unit is particularly preferable. By having these units, the adhesive property between CNT and the conjugated polymer is enhanced and CNT can be more favorably dispersed in the semiconductor layer.

Furthermore, as the conjugated polymer, those having a structure represented by the following Formula (3) are particularly preferable.

[Chemical formula 1]

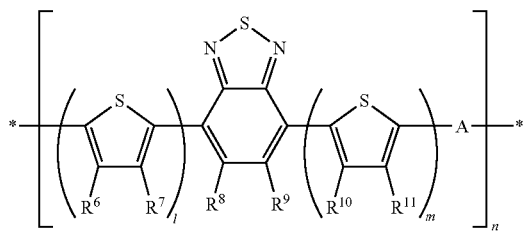

(3)

Here, $R^6$ to $R^{11}$ may be the same as or different from each other and each represent hydrogen, an alkyl group, a cycloalkyl group, a heterocyclic group, an alkenyl group, a cycloalkenyl group, an alkynyl group, an alkoxy group, an alkylthio group, an arylether group, an arylthioether group, an aryl group, a heteroaryl group, a halogen atom, a cyano group, a formyl group, a carbamoyl group, an amino group, an alkylcarbonyl group, an arylcarbonyl group, a carboxyl group, an alkoxycarbonyl group, an aryloxycarbonyl group, an alkylcarbonyloxy group, an arylcarbonyloxy group, or a silyl group. Moreover, $R^6$ to $R^{11}$ may form a ring structure with adjacent groups. A is selected from among a single bond, an arylene group, a heteroarylene group excluding a thienylene group, an ethenylene group, and an ethinylene group. l and m each represent an integer 0 to 10, and l+m≥1. n represents a range of 2 to 1000. In a case in which l, m, and n are 2 or more, $R^6$ to $R^{11}$ and A may be the same as or different from each other in each repeating unit.

An alkyl group refers to, for example, a saturated aliphatic hydrocarbon group such as a methyl group, an ethyl group, an n-propyl group, an isopropyl group, an n-butyl group, a sec-butyl group, or a tert-butyl group and may or may not have a substituent. In the case of having a substituent, the substituent is not particularly limited, examples thereof include an alkoxy group, an aryl group, and a heteroaryl group, and these substituents may further have a substituent. Moreover, the number of carbon atoms in the alkyl group is not particularly limited but is preferably 1 or more and 20 or less and more preferably 1 or more and 8 or less from the viewpoint of easy availability and cost.

A cycloalkyl group refers to, for example, a saturated alicyclic hydrocarbon group such as a cyclopropyl group, a cyclohexyl group, a norbornyl group, or an adamantyl group and may or may not have a substituent. In the case of having a substituent, the substituent is not particularly limited, examples thereof include an alkyl group, an alkoxy group, an aryl group, and a heteroaryl group, and these substituents may further have a substituent. The description of these substituents is common to the following description as well unless otherwise stated. The number of carbon atoms in the cycloalkyl group is not particularly limited but is preferably in a range of 3 or more and 20 or less.

A heterocyclic group refers to, for example, a group derived from an aliphatic ring having atoms other than carbon in the ring such as a pyran ring, a piperidine ring, or an amide ring and may or may not have a substituent. The number of carbon atoms in the heterocyclic group is not particularly limited but is preferably in a range of 2 or more and 20 or less.

An alkenyl group refers to, for example, an unsaturated aliphatic hydrocarbon group having a double bond such as a vinyl group, an aryl group, or a butadienyl group and may or may not have a substituent. The number of carbon atoms in the alkenyl group is not particularly limited but is preferably in a range of 2 or more and 20 or less.

A cycloalkenyl group refers to, for example, an unsaturated alicyclic hydrocarbon group having a double bond such as a cyclopentenyl group, a cyclopentadienyl group, a cyclohexenyl group and may or may not have a substituent. The number of carbon atoms in the cycloalkenyl group is not particularly limited but is preferably in a range of 3 or more and 20 or less.

An alkynyl group refers to, for example, an unsaturated aliphatic hydrocarbon group having a triple bond such as an ethynyl group and may or may not have a substituent. The number of carbon atoms in the alkynyl group is not particularly limited but is preferably in a range of 2 or more and 20 or less.

An alkoxy group refers to, for example, a functional group in which one of ether bonds is substituted with an aliphatic hydrocarbon group such as a methoxy group, an ethoxy group, or a propoxy group and may or may not have a substituent. The number of carbon atoms in the alkoxy group is not particularly limited but is preferably in a range of 1 or more and 20 or less.

An alkylthio group is one in which the oxygen atom in an ether bond in an alkoxy group is substituted with a sulfur atom and may or may not have a substituent. The number of carbon atoms in the alkylthio group is not particularly limited but is preferably in a range of 1 or more and 20 or less.

An aryl ether group refers to, for example, a functional group in which one of ether bonds is substituted with an aromatic hydrocarbon group such as a phenoxy group or a naphthoxy group and may or may not have a substituent. The number of carbon atoms in the aryl ether group is not particularly limited but is preferably in a range of 6 or more and 40 or less.

An aryl thioether group is one in which the oxygen atom in an ether bond in an aryl ether group is substituted with a sulfur atom and may or may not have a substituent. The number of carbon atoms in the aryl thioether group is not particularly limited but is preferably in a range of 6 or more and 40 or less.

An aryl group refers to, for example, an aromatic hydrocarbon group such as a phenyl group, a naphthyl group, a biphenyl group, an anthracenyl group, a phenanthryl group, a terphenyl group, or a pyrenyl group and may or may not have a substituent. The number of carbon atoms in the aryl group is not particularly limited but is preferably in a range of 6 or more and 40 or less.

A heteroaryl group refers to, for example, an aromatic group having one or plural atoms other than carbon in the ring such as a furanyl group, a thiophenyl group, a benzofuranyl group, a dibenzofuranyl group, a pyridyl group, or a quinolinyl group and may or may not have a substituent. The number of carbon atoms in the heteroaryl group is not particularly limited but is preferably in a range of 2 or more and 30 or less.

A halogen atom refers to fluorine, chlorine, bromine, or iodine.

An alkylcarbonyl group refers to, for example, a functional group in which one of carbonyl bonds is substituted with an aliphatic hydrocarbon group such as an acetyl group or a hexanoyl group and may or may not have a substituent. The number of carbon atoms in the alkylcarbonyl group is not particularly limited but is preferably in a range of 2 or more and 20 or less.

An arylcarbonyl group refers to, for example, a functional group in which one of carbonyl bonds is substituted with an aromatic hydrocarbon group such as a benzoyl group and may or may not have a substituent. The number of carbon atoms in the arylcarbonyl group is not particularly limited but is preferably in a range of 7 or more and 40 or less.

An alkoxycarbonyl group refers to, for example, a functional group in which one of carbonyl bonds is substituted with an alkoxy group such as a methoxycarbonyl group and may or may not have a substituent. The number of carbon atoms in the alkoxycarbonyl group is not particularly limited but is preferably in a range of 2 or more and 20 or less.

An aryloxycarbonyl group refers to, for example, a functional group in which one of carbonyl bonds is substituted with an aryloxy group such as a phenoxycarbonyl group and may or may not have a substituent. The number of carbon atoms in the aryloxycarbonyl group is not particularly limited but is preferably in a range of 7 or more and 40 or less.

An alkylcarbonyloxy group refers to, for example, a functional group in which one of ether bonds is substituted with an alkylcarbonyl group such as an acetoxy group and may or may not have a substituent. The number of carbon atoms in the alkylcarbonyloxy group is not particularly limited but is preferably in a range of 2 or more and 20 or less.

An arylcarbonyloxy group refers to, for example, a functional group in which one of ether bonds is substituted with an arylcarbonyl group such as a benzoyloxy group and may or may not have a substituent. The number of carbon atoms in the arylcarbonyloxy group is not particularly limited but is preferably in a range of 7 or more and 40 or less.

The carbamoyl group, amino group, and silyl group may or may not have a substituent. In the case of having a substituent, examples of the substituent include an alkyl group, a cycloalkyl group, an aryl group, and a heteroaryl group, and these substituents may further have a substituent.

In a case in which adjacent groups are bonded to each other to form a ring structure, for example, $R^6$ and $R^7$ are bonded to each other to form a conjugated or non-conjugated fused ring when explained by Formula (3). As a constituent element of the fused ring, nitrogen, oxygen, sulfur, phosphorus, and silicon atoms may be contained in addition to carbon, and the fused ring may be further fused with another ring.

Next, A in Formula (3) will be described. An arylene group refers to a divalent (having two bonding sites) aromatic hydrocarbon group and may be unsubstituted or substituted. Examples of the substituent in the case of being substituted include the alkyl group, heteroaryl group, and halogen described above. Preferred specific examples of the arylene group include a phenylene group, a naphthylene group, a biphenylene group, a phenanthrylene group, an anthrylene group, a terphenylene group, a pyrenylene group, a fluorenylene group, and a perylenylene group.

A heteroarylene group refers to a divalent heteroaromatic ring group and may be unsubstituted or substituted. Preferred specific examples of the heteroarylene group include divalent groups derived from a heteroaromatic ring such as benzofuran, dibenzofuran, benzothiophene, dibenzothiophene, benzodithiophene, benzosilole, and dibenzosilole in addition to a pyridylene group, a pyrazylene group, a quinolinylene group, an isoquinolylene group, a quinoxarylene group, an acridinylene group, an indolylene group, and a carbazolylene group.

l and m in Formula (3) each represent an integer 0 to 10, and l+m≥1. l and m are each preferably 1 or more and still more preferably l+m≥4 since the adhesive property to CNT is improved and the dispersibility of CNT is improved by containing a thiophene unit in the structure. In addition, it is preferable that l+m≤12 from the viewpoint of easy monomer synthesis and subsequent polymerization.

n represents the degree of polymerization of the conjugated polymer and is in a range of 2 to 1,000. n is preferably in a range of 3 to 500 in consideration of the easy attachment to CNT. In the present invention, the degree of polymerization n is a value determined from the weight average molecular weight. The weight average molecular weight is measured by GPC (gel permeation chromatography) and is determined by being converted using a polystyrene standard sample.

Moreover, it is preferable that the conjugated polymer is soluble in a solvent and at least one of $R^6$ to $R^{11}$ is an alkyl group from the viewpoint of easy formation of CNT composite.

Examples of the conjugated polymer include those having the following structures.

[Chemical formula 2]
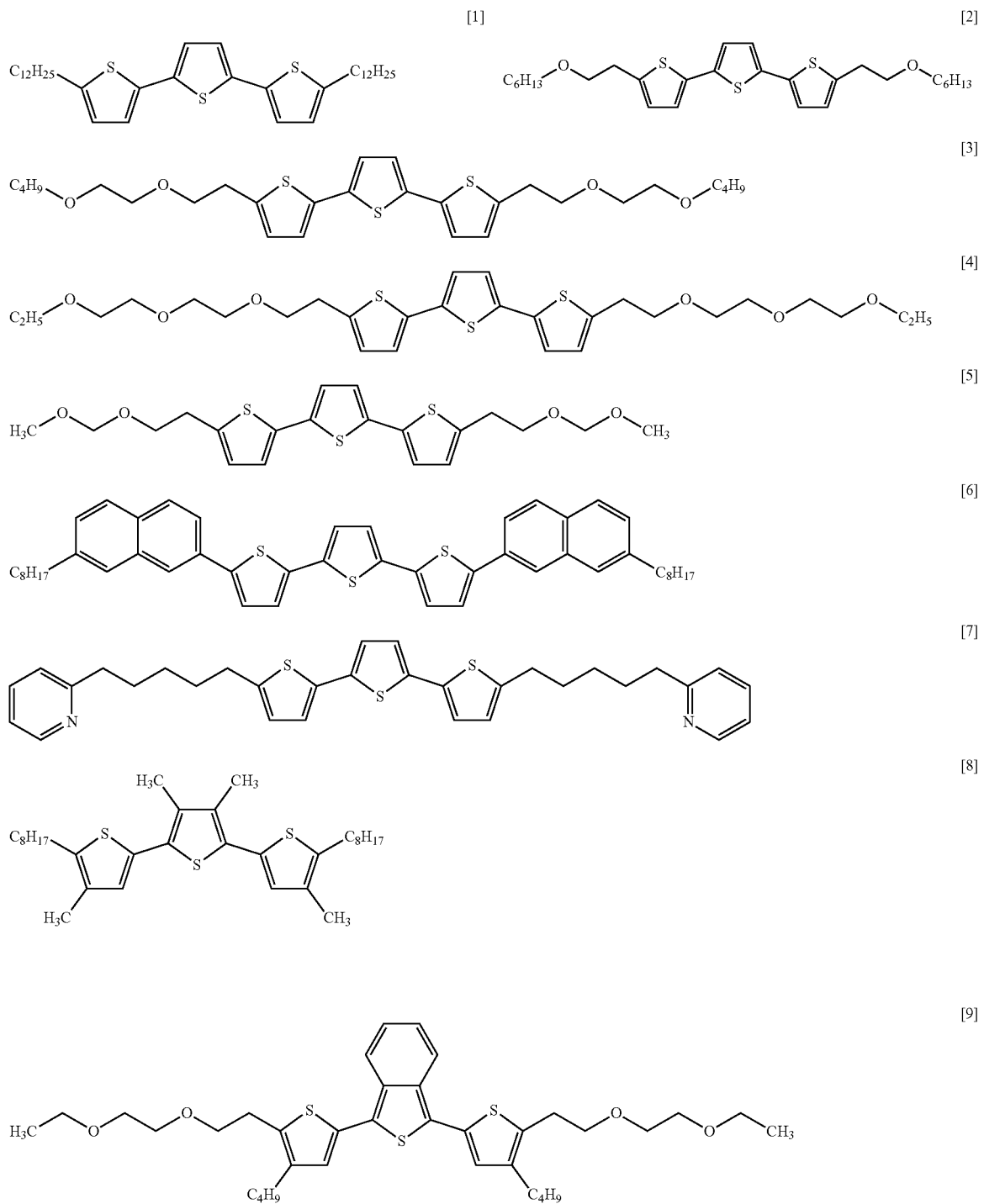
[Chemical formula 3]
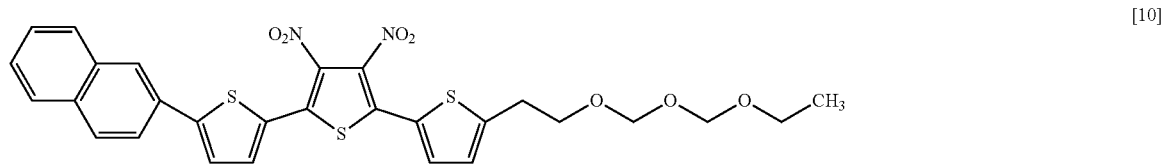

-continued
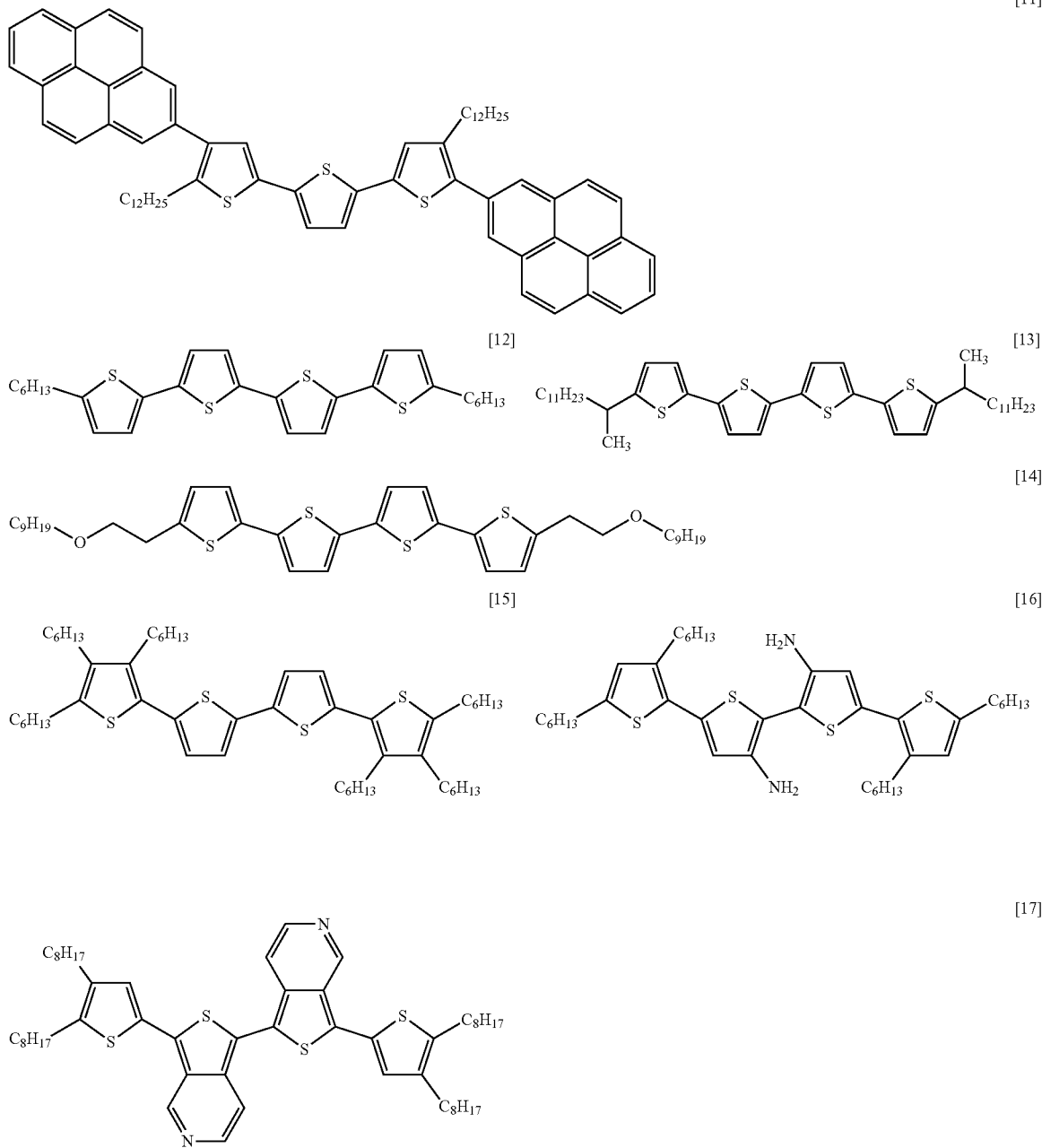
[Chemical formula 4]
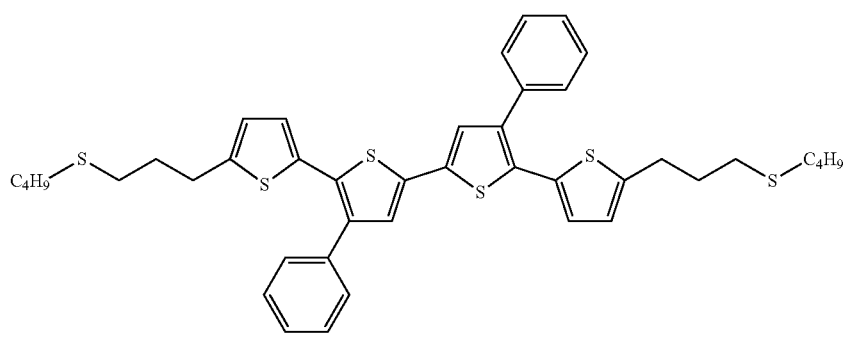

-continued
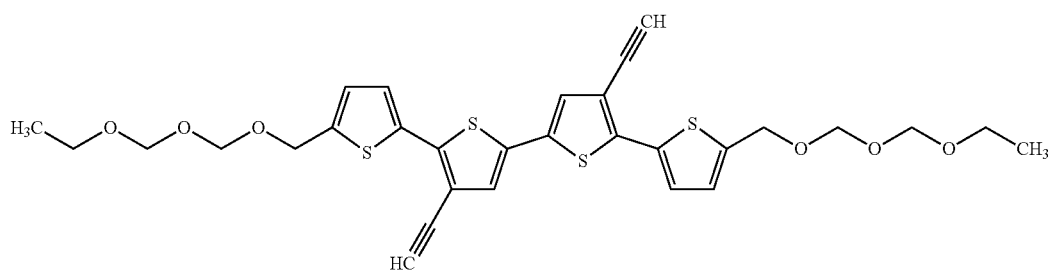
[19]
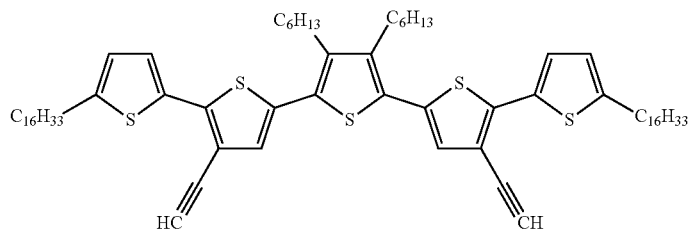
[20]
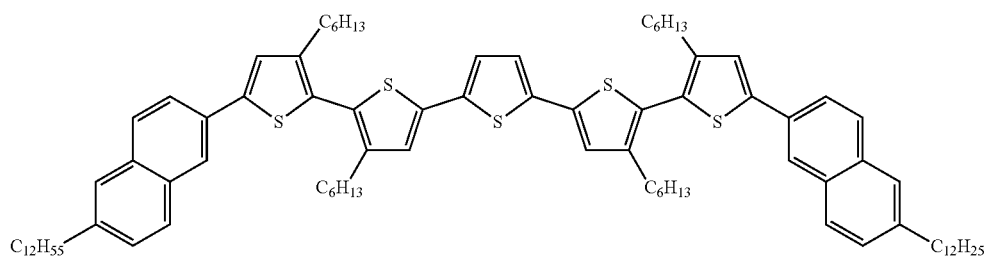
[21]
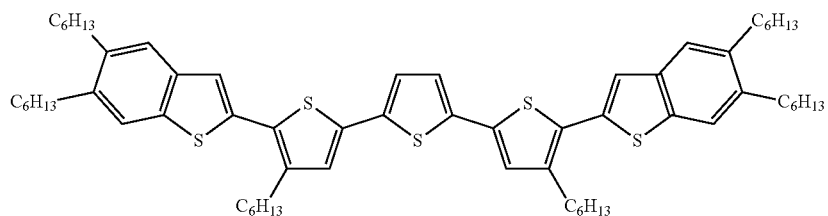
[22]
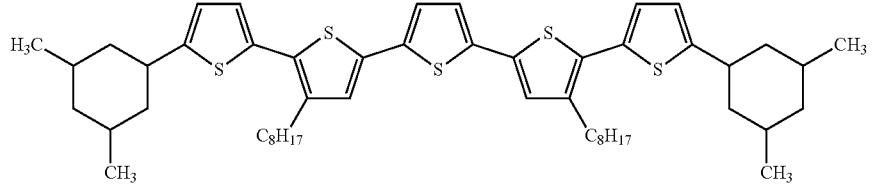
[23]
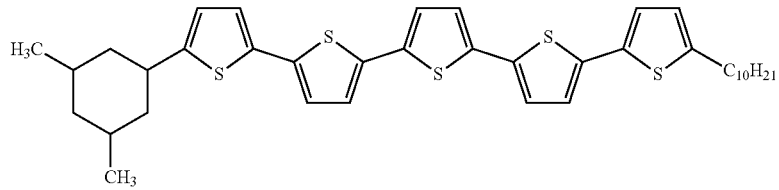
[24]
[Chemical formula 5]
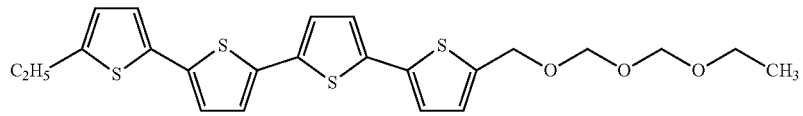
[25]

-continued
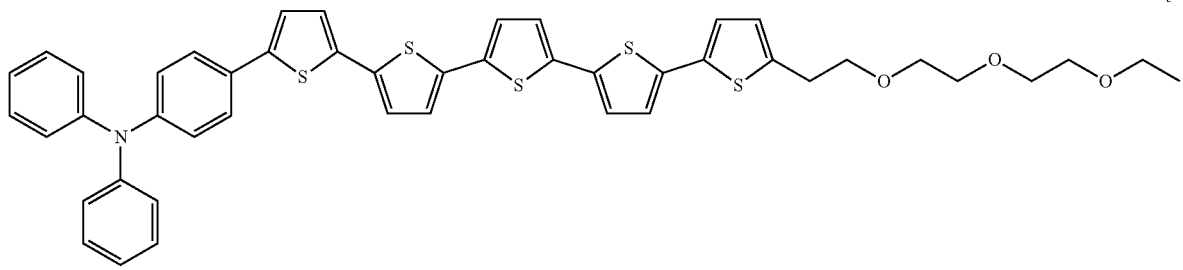
[26]
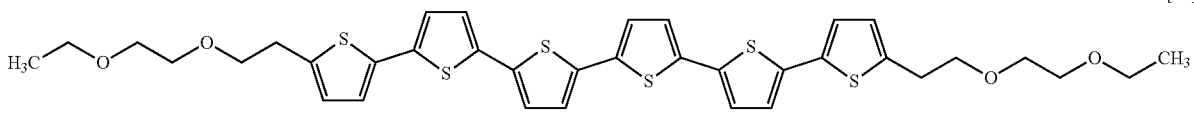
[27]
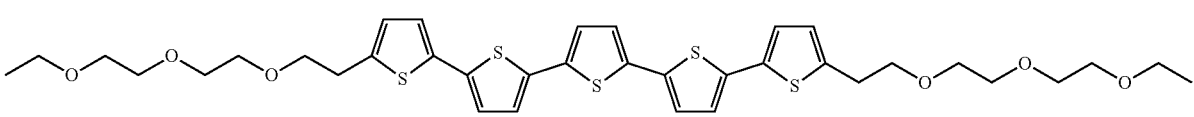
[28]
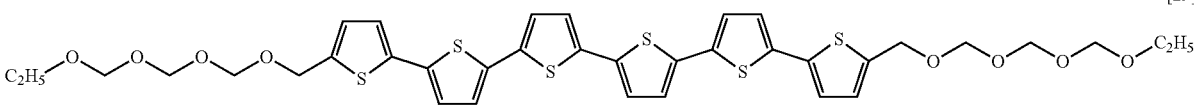
[29]
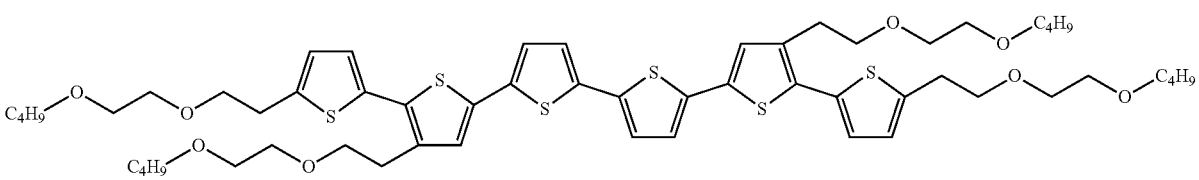
[30]
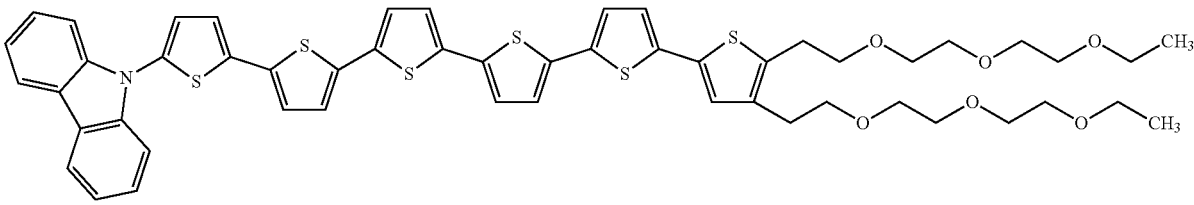
[31]
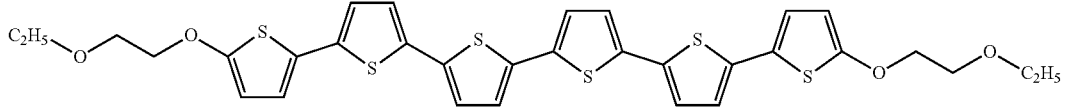
[32]
[Chemical formula 6]
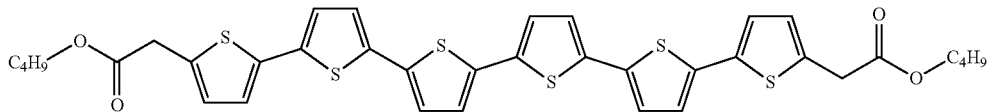
[33]
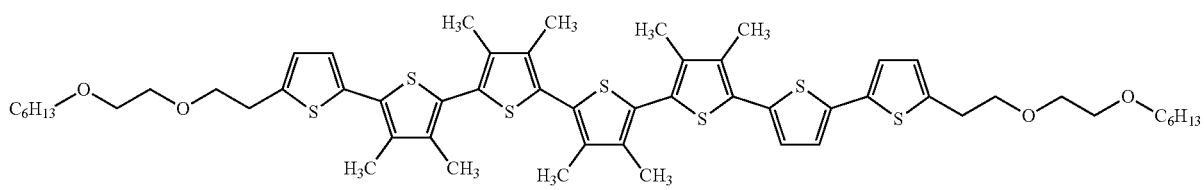
[34]

-continued
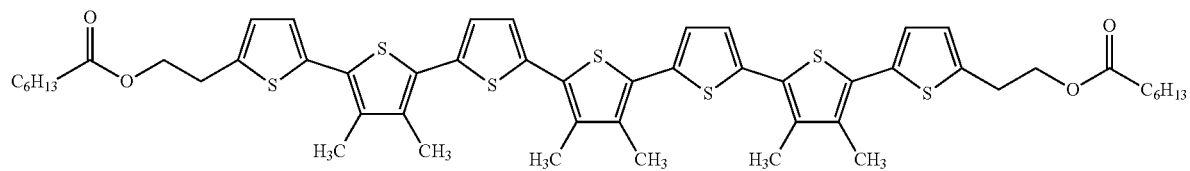
[35]
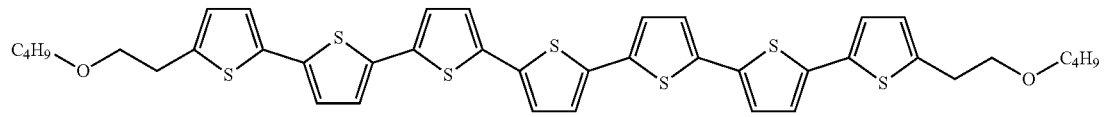
[36]
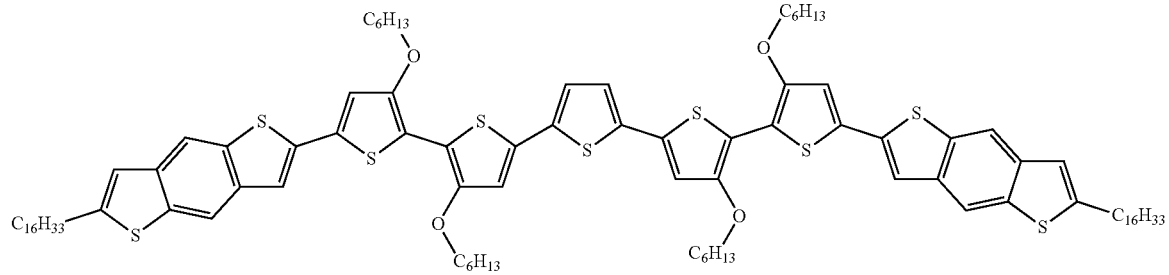
[37]
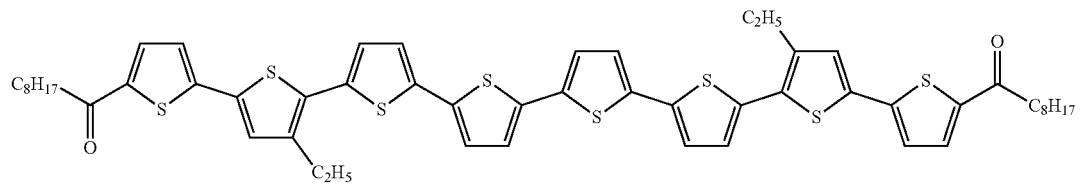
[38]
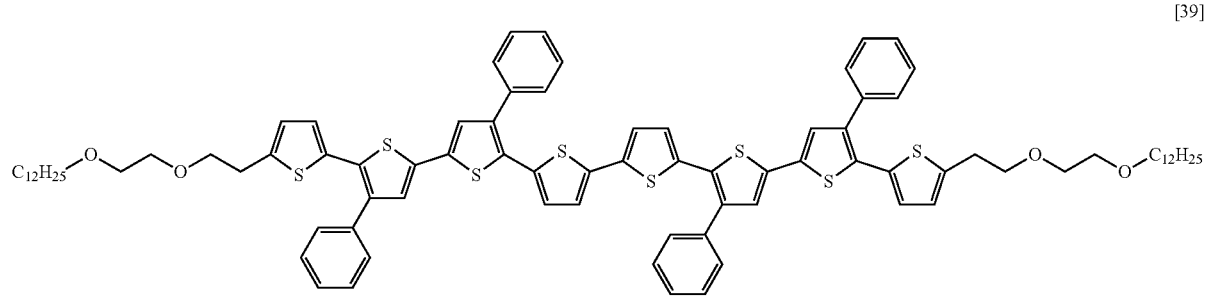
[39]
[Chemical formula 7]
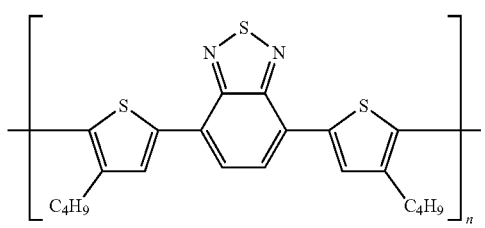
[40]
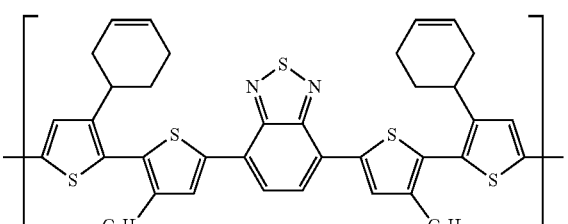
[41]
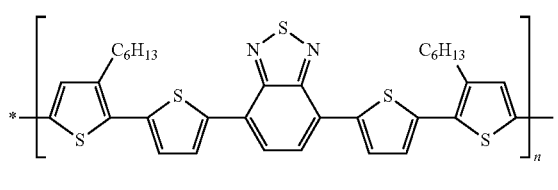
[42]
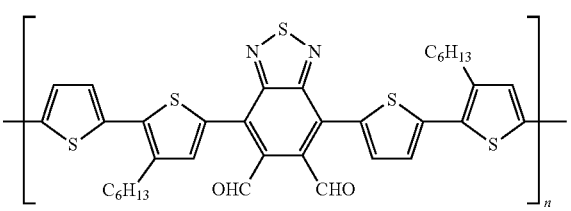
[43]

-continued
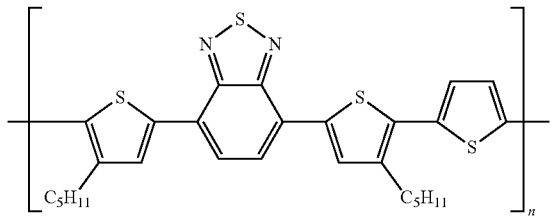
[44]
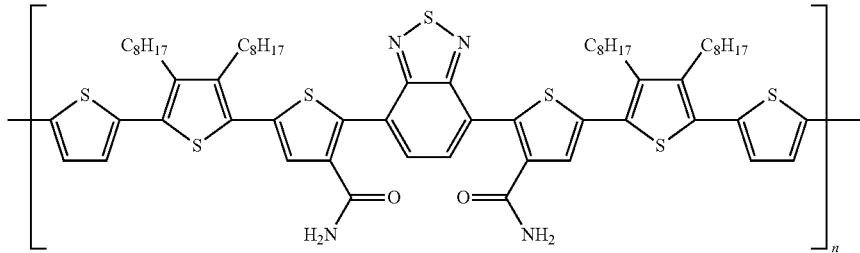
[45]
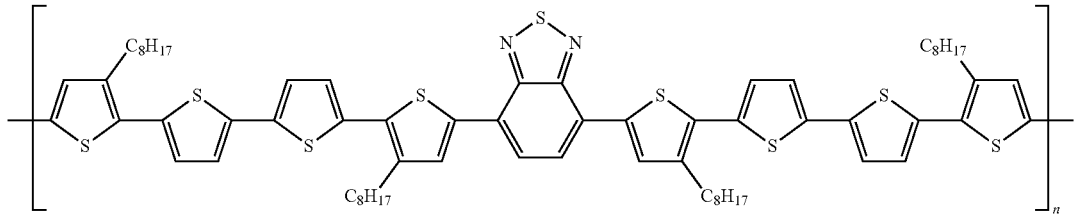
[46]
[Chemical formula 8]
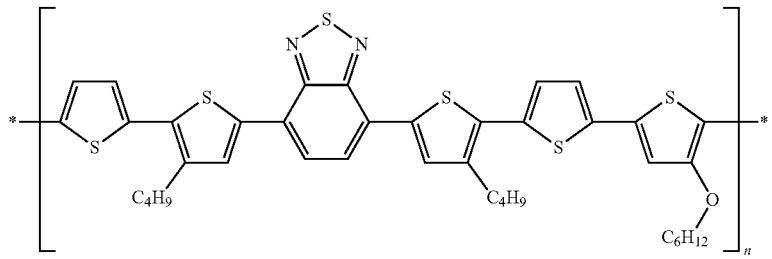
[47]
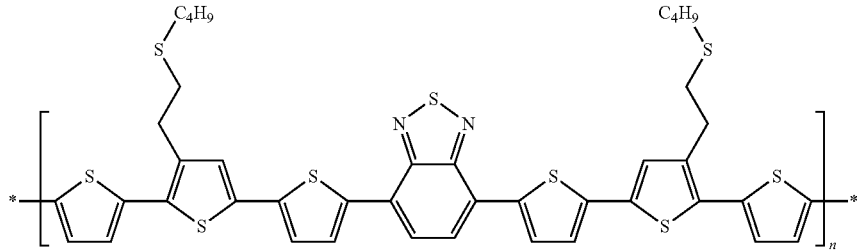
[48]
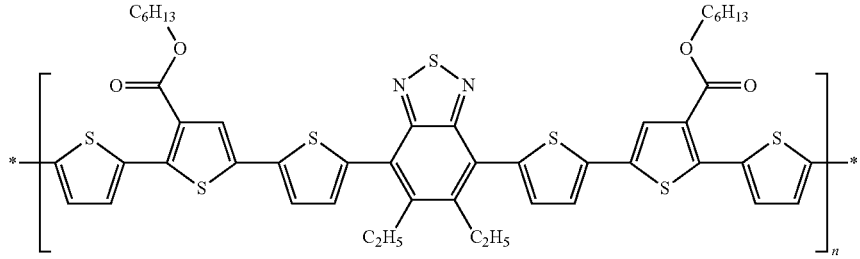
[49]

-continued
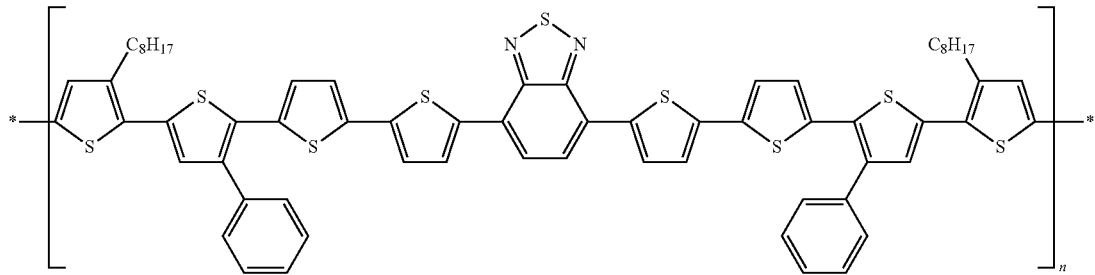
[50]
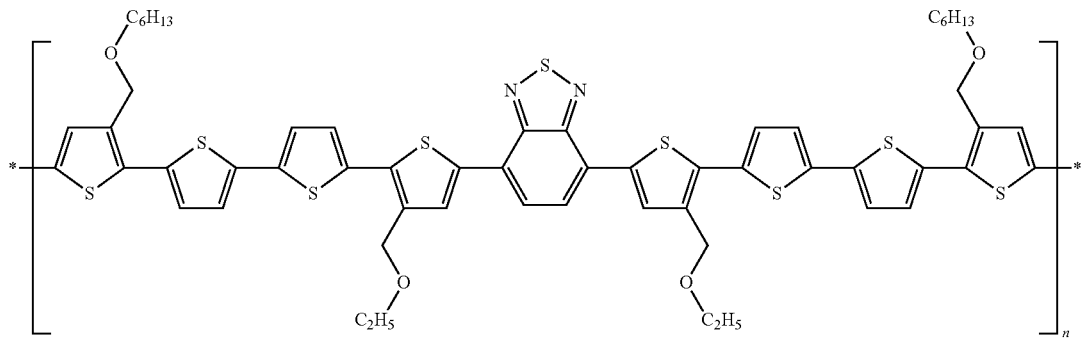
[51]
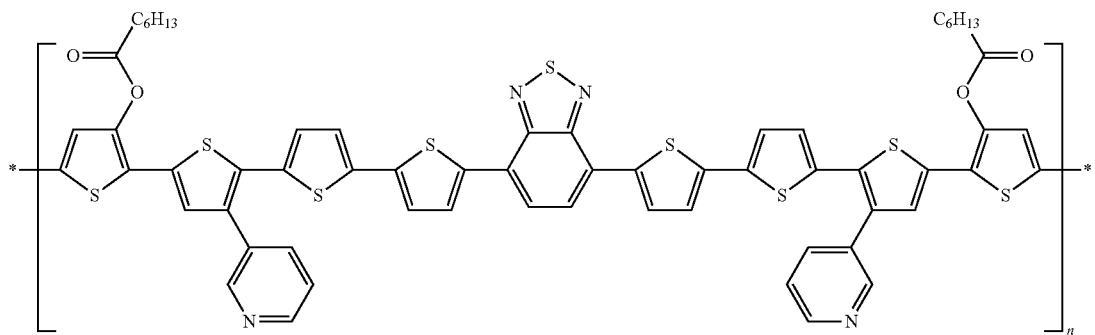
[52]
[Chemical formula 9]
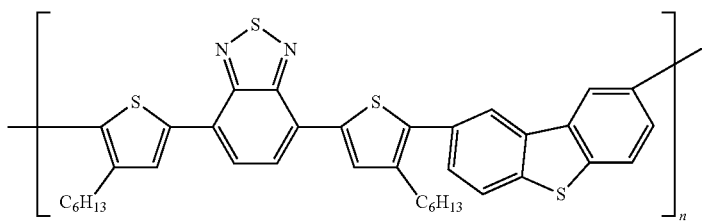
[53]
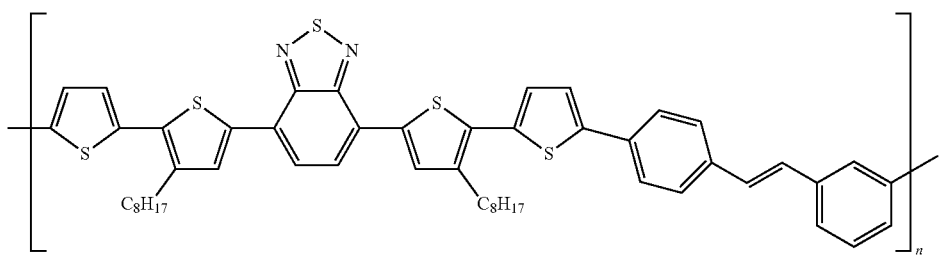
[54]

-continued
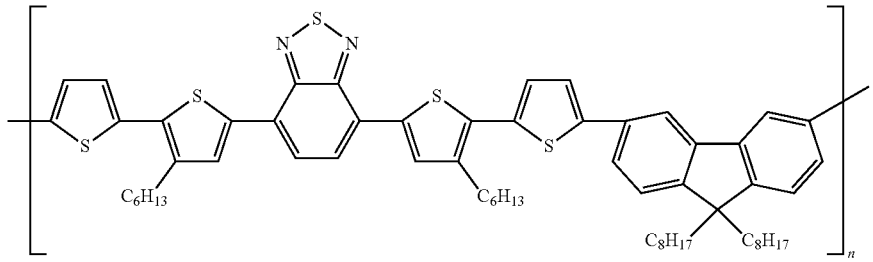
[55]
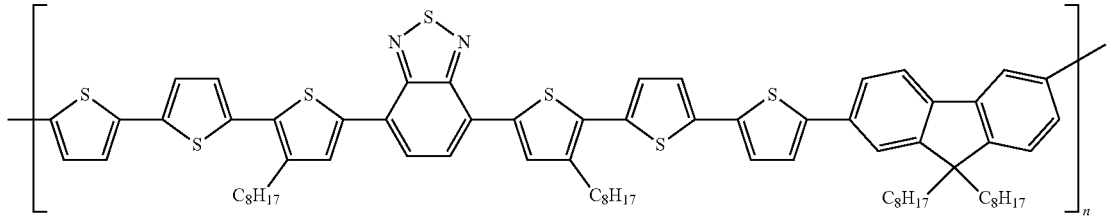
[56]
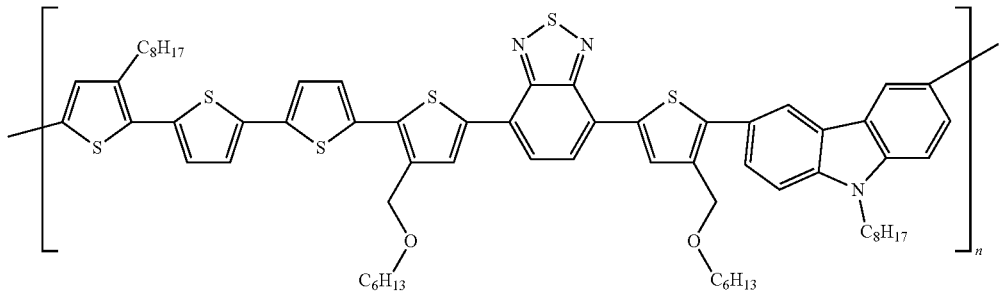
[57]
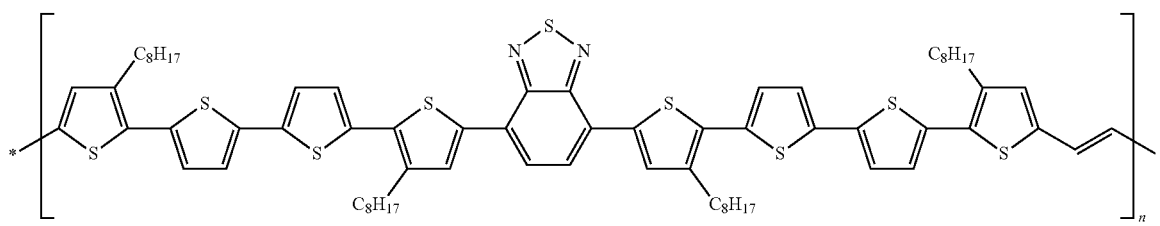
[58]
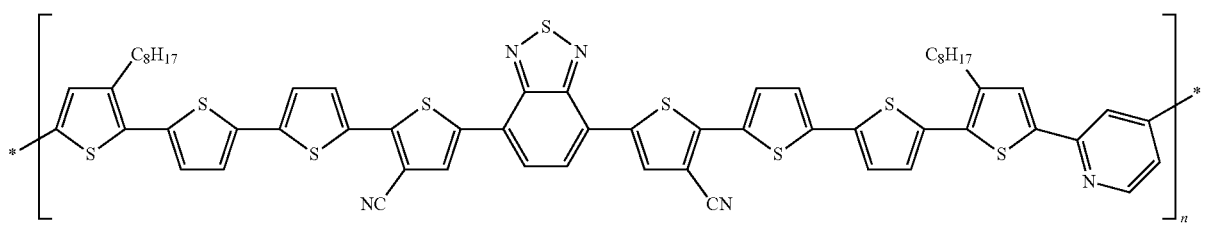
[59]
[Chemical formula 10]
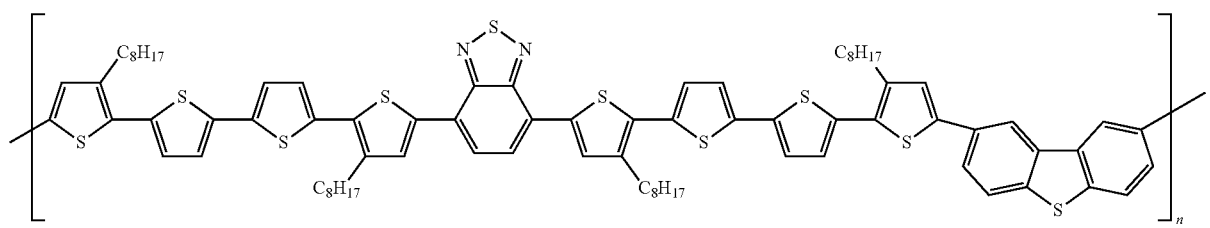
[60]

[61]
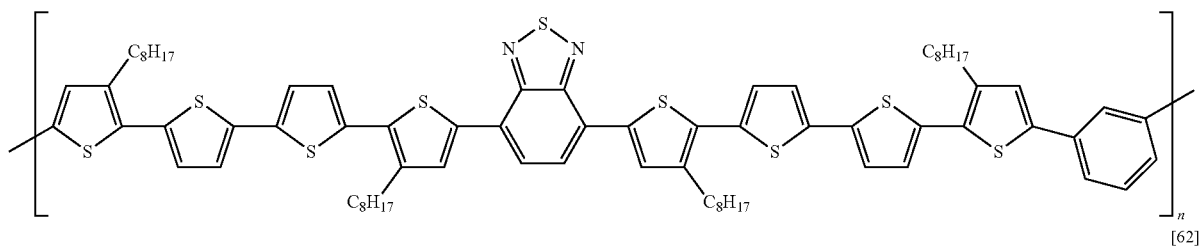
[62]
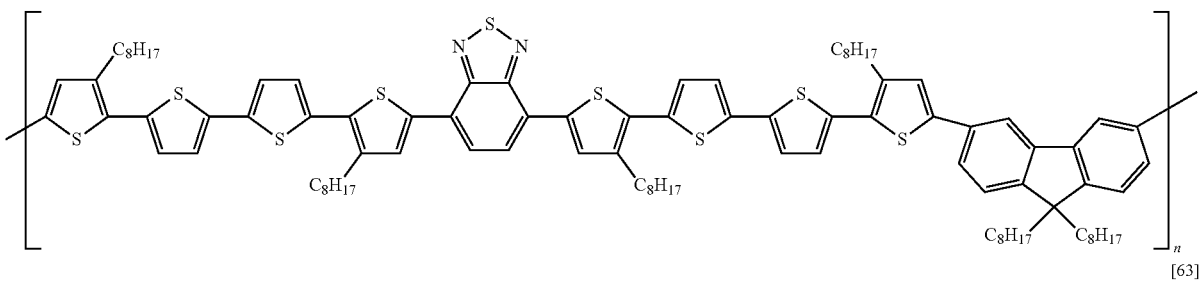
[63]
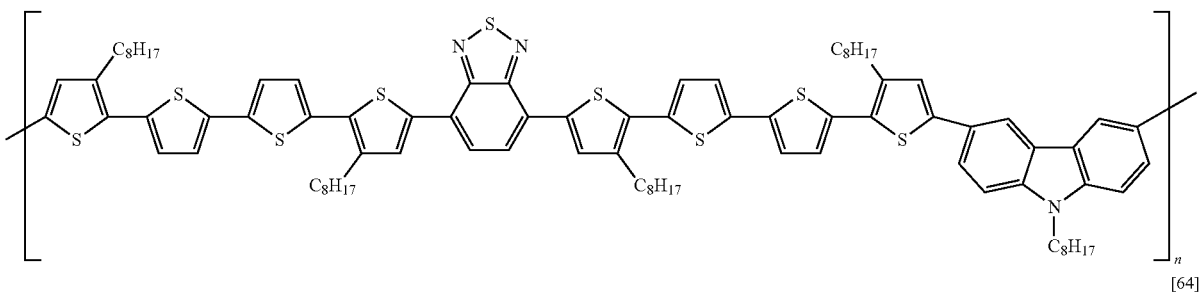
[64]
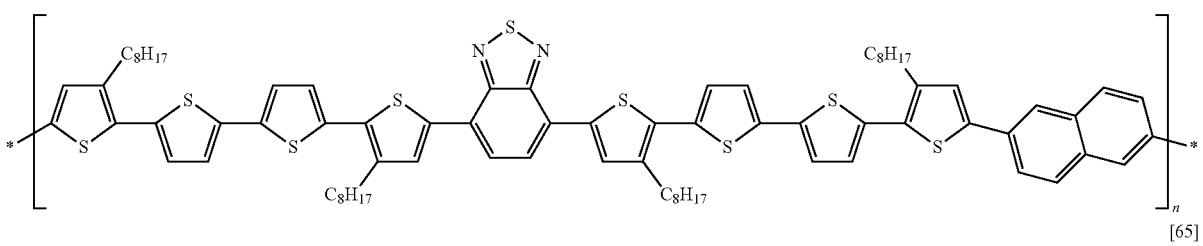
[65]
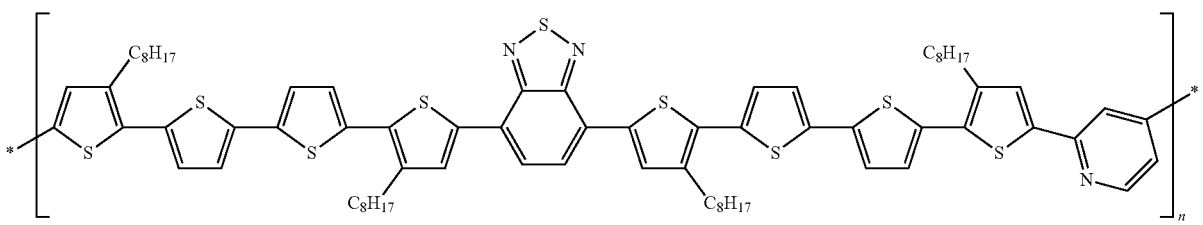
[Chemical formula 11]
[66]
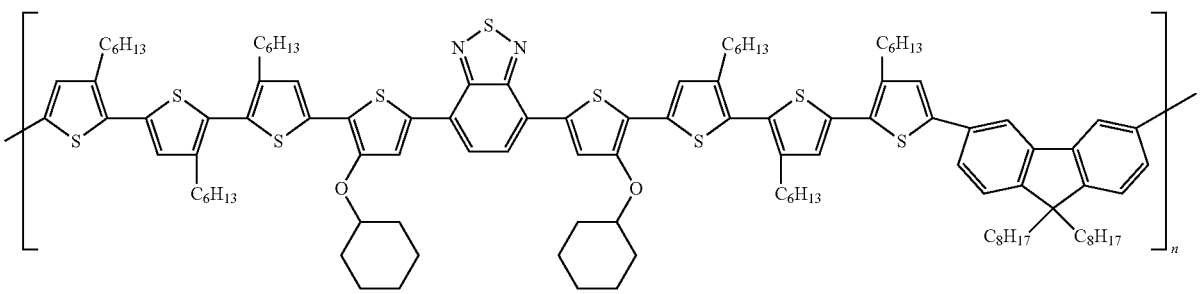

[67]
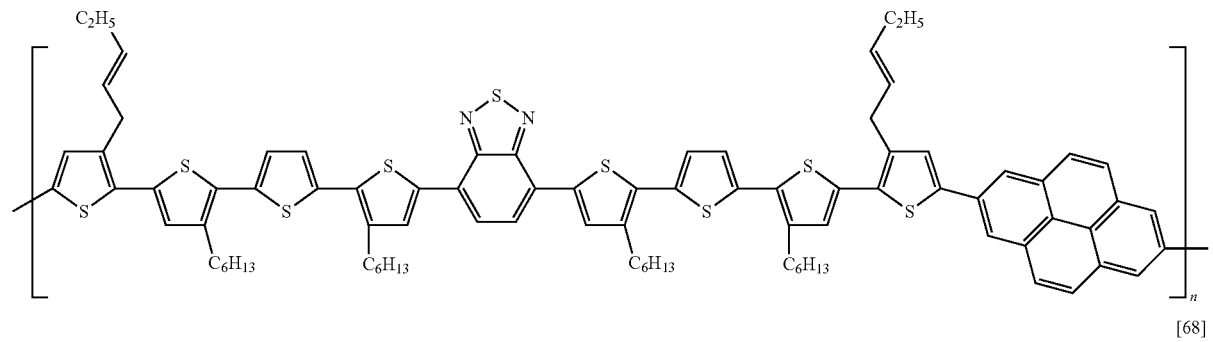
[68]
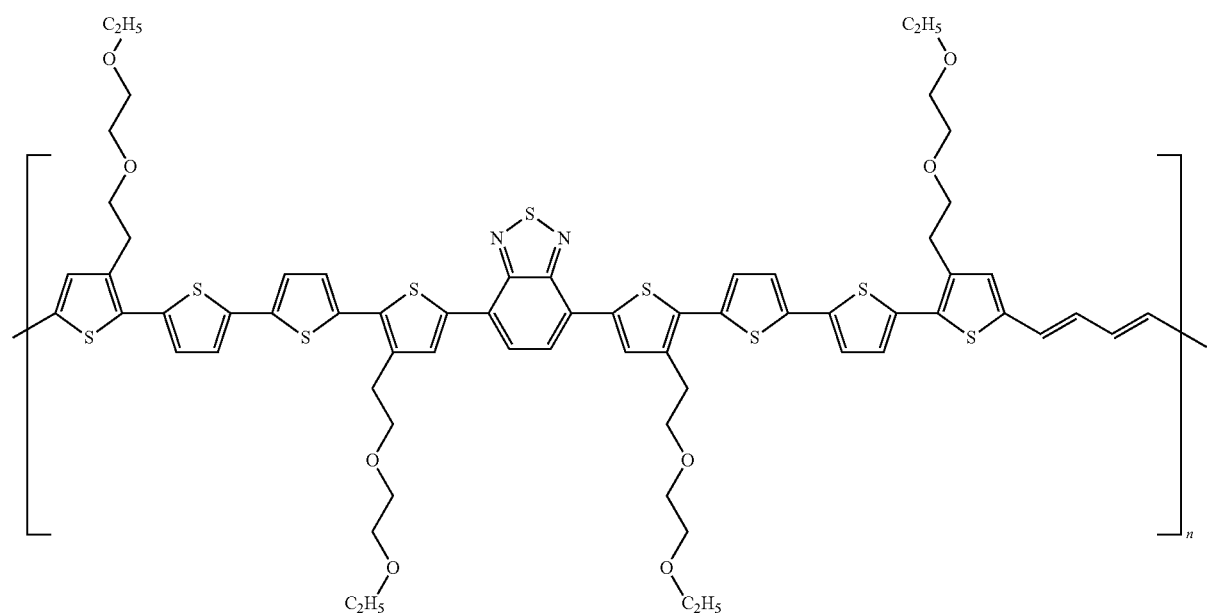
[69]
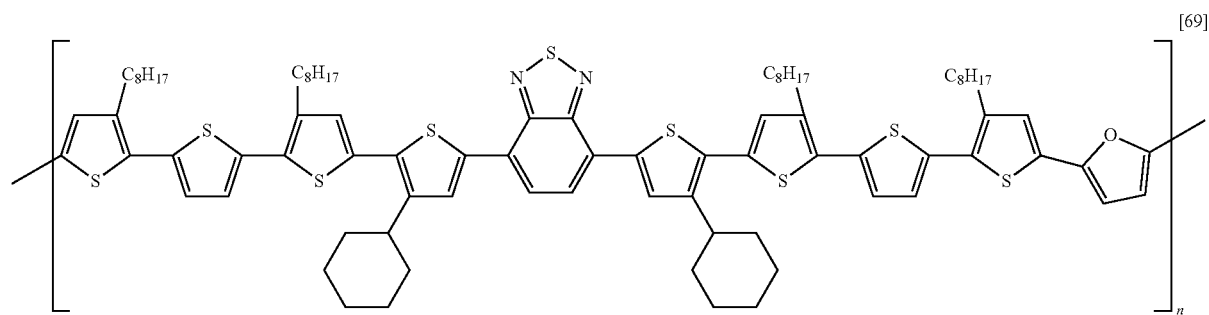
[70]
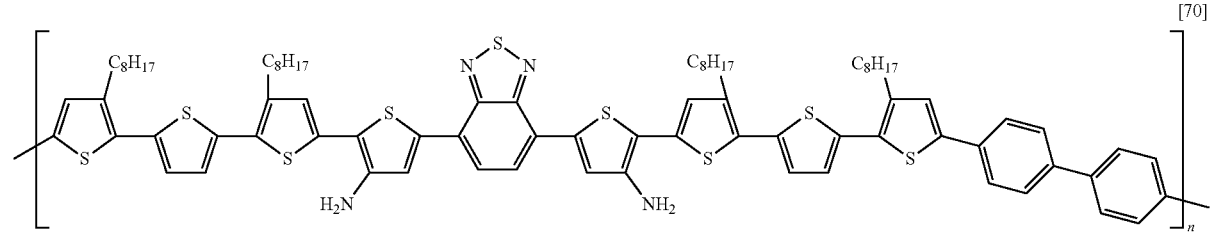

-continued

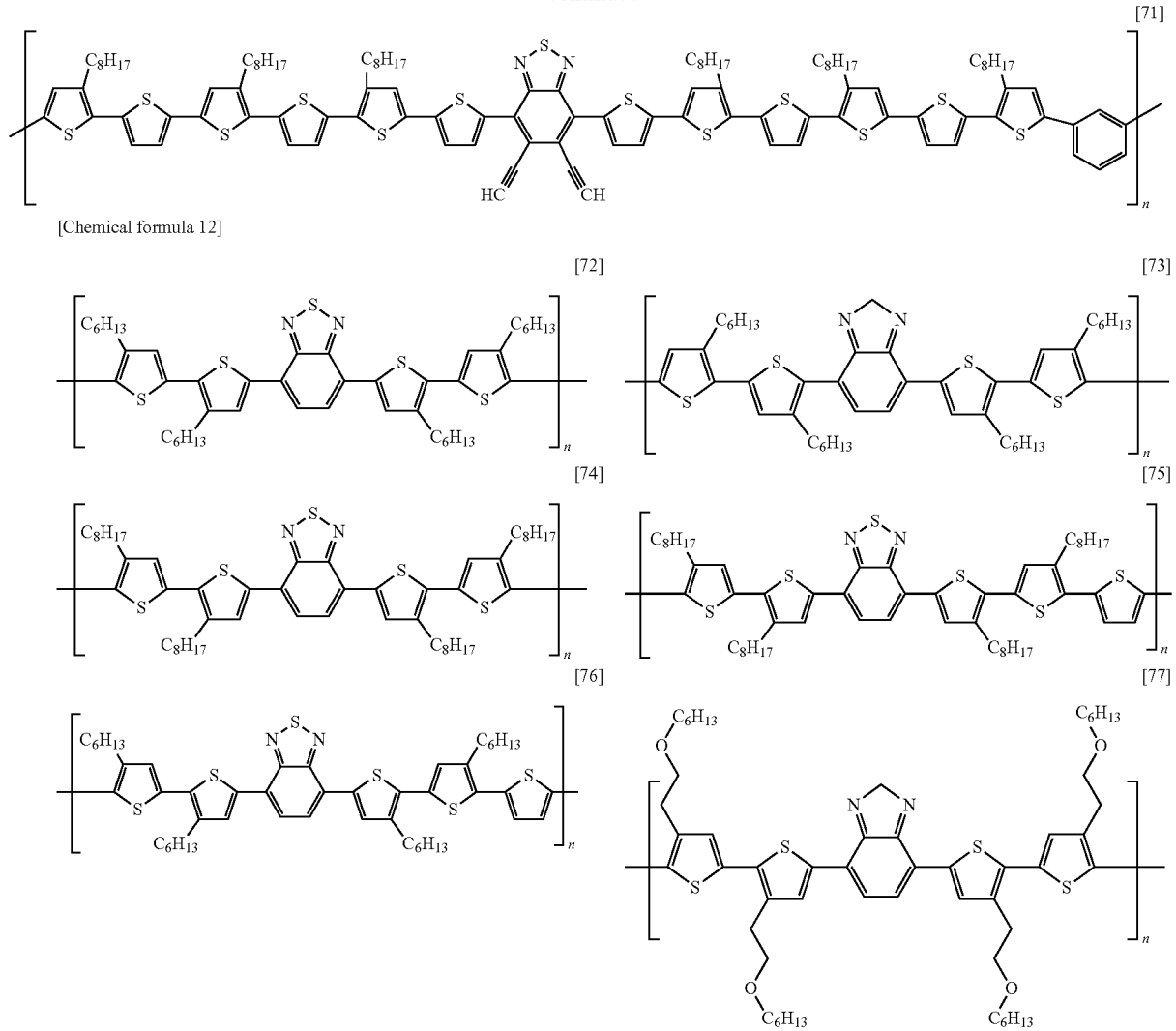

In addition, the conjugated polymer can be synthesized by a known method. Examples of a method for coupling thiophenes to each other include a method in which a halogenated thiophene is coupled with a thiopheneboronic acid or a thiopheneboronate in the presence of a palladium catalyst and a method in which a halogenated thiophene is coupled with thiophene Grignard reagent in the presence of a nickel or palladium catalyst. Moreover, in the case of coupling a thiophene unit with another unit as well, another halogenated unit and a thiophene unit can be coupled with each other by a similar method. In addition, a conjugated polymer can be obtained by introducing a polymerizable functional group into the end of the monomer thus obtained and allowing the polymerization to proceed in the presence of a palladium catalyst or a nickel catalyst.

It is preferable to remove impurities such as the raw materials used in the synthesis process and by-products from the conjugated polymer. As a method for removing impurities, it is possible to use, for example, silica gel columnography, a Soxhlet extraction method, a filtration method, an ion exchange method, a chelation method, and the like. Two or more of these methods may be combined.

The semiconductor layer may further contain an organic semiconductor and an insulating material in a range in which the electric properties are not impaired. The film thickness of the semiconductor layer is preferably 1 nm or more and 100 nm or less. A uniform thin film is easily formed as the film thickness is in this range. The film thickness is more preferably 1 nm or more and 50 nm or less and still more preferably 1 nm or more and 20 nm or less. The film thickness can be measured using an atomic force microscope.

As a method for forming the semiconductor layer, it is also possible to use a dry method such as resistive heating evaporation, electron beam, sputtering, and CVD but it is preferable to use a coating method from the viewpoint of manufacturing cost and adaptation to a large area. Specifically, it is possible to preferably use a spin coating method, a blade coating method, a slit die coating method, a screen printing method, a bar coater method, a mold method, a printing and transferring method, a dipping and pulling method, an ink jet method and the like. The coating method can be selected depending on the coating film properties to be attained such as the control of coating film thickness and the control of orientation. In addition, the formed coating film may be subjected to an annealing treatment in the air, under reduced pressure, or in an atmosphere of an inert gas such as nitrogen or argon.

(Coating Layer)

The coating layer to be formed of an insulating material applied so as to be in contact with the semiconductor layer on the side opposite to the gate insulating layer in a region between the source electrode and the drain electrode is not particularly limited as long as the electric properties of the semiconductor layer can be changed in order that the electric properties of the source electrode and the drain electrode in the memory element are different from each other. For example, an acrylic resin, an epoxy resin, a novolak resin, a phenol resin, a polyimide precursor resin, a polyimide resin, a polysiloxane resin, a fluorine-based resin, a polyvinyl acetal resin, or the like can be used. Examples of other resins include styrene derivatives such as styrene, p-methylstyrene, o-methylstyrene, m-methylstyrene, p-hydroxystyrene, o-hydroxystyrene, m-hydroxystyrene, α-methylstyrene, chloromethylstyrene, and hydroxymethylstyrene, a resin having a structure derived from a vinyl monomer such as 1-vinyl-2-pyrrolidone, and a resin having a cyclic hydrocarbon structure such as cycloolefin. Incidentally, the vinyl monomer is not limited to these monomers and may be used singly or in combination of two or more thereof. Furthermore, in addition to the insulating material described above, inorganic materials such as silicon oxide, alumina, and zirconia and compounds containing a nitrogen atom such as amide-based compounds, imide-based compounds, urea-based compounds, amine-based compounds, imine-based compounds, aniline-based compounds, and nitrile-based compounds may be contained. The electric properties of the semiconductor layer can be further changed by containing the compounds in the coating layer. Moreover, the semiconductor layer can also be protected from the external environment such as oxygen and moisture by the coating layer.

The film thickness of the coating layer is generally 50 nm or more and 10 μm or less and preferably 100 nm or more and 3 μm or less. Each of the coating layers may be composed of a single layer or a plurality of layers.

The method for forming the coating layer is not particularly limited, and it is also possible to use a dry method such as resistive heating evaporation, electron beam, sputtering, and CVD, but it is preferable to use a coating method from the viewpoint of manufacturing cost and adaptation to a large area. As the coating method, specifically, it is possible to preferably use a spin coating method, a blade coating method, a slit die coating method, a screen printing method, a bar coater method, a mold method, a printing and transferring method, a dipping and pulling method, an ink jet method, a drop casting method and the like. The coating method can be selected depending on the coating film properties to be attained such as the control of coating film thickness and the control of orientation.

When the coating layer is formed by a coating method, the solvent in which the insulating material to be used in the second insulating layer is dissolved is not particularly limited, and examples thereof include ethers such as ethylene glycol monomethyl ether, ethylene glycol monoethyl ether, propylene glycol monomethyl ether, propylene glycol monoethyl ether, propylene glycol mono-n-butyl ether, propylene glycol mono-t-butyl ether, ethylene glycol dimethyl ether, ethylene glycol diethyl ether, ethylene glycol dibutyl ether, and diethylene glycol ethyl methyl ether; esters such as ethylene glycol monoethyl ether acetate, propylene glycol monomethyl ether acetate, propyl acetate, butyl acetate, isobutyl acetate, 3-methoxybutyl acetate, 3-methyl-3-methoxybutyl acetate, methyl lactate, and ethyl lactate, and butyl lactate; ketones such as acetone, methyl ethyl ketone, methyl propyl ketone, methyl butyl ketone, methyl isobutyl ketone, cyclopentanone, and 2-heptanone; alcohols such as butyl alcohol, isobutyl alcohol, pentanol, 4-methyl-2-pentanol, 3-methyl-2-butanol, 3-methyl-3-methoxybutanol, and diacetone alcohol; and aromatic hydrocarbons such as toluene and xylene. Two or more of these may be used. Among these, it is preferable to contain a solvent having a boiling point of 110° C. to 200° C. at 1 atm. When the boiling point is 110° C. or more, the volatilization of solvent at the time of solution application is suppressed, and the coating property is improved. When the boiling point is 200° C. or less, the solvent remaining in the insulating film is little and an insulating layer exhibiting more favorable heat resistance and chemical resistance is obtained. In addition, the formed coating film may be subjected to an annealing treatment in the air, under reduced pressure, or in an inert gas atmosphere (in a nitrogen or argon atmosphere).

<Rectifying Circuit>

The rectifying circuit according to the present invention includes a second semiconductor element having a second semiconductor layer, and the second semiconductor layer is a functional layer exhibiting a rectifying action and the second semiconductor element is a rectifying element. The rectifying circuit according to the present invention includes at least a rectifying element equipped with an insulating substrate, (a) a pair of electrodes consisting of a first electrode and a second electrode provided on the surface of the insulating substrate, and (b) a functional layer which has a rectifying action and is provided between (a) the pair of electrodes and a capacitor. The (b) functional layer exhibiting a rectifying action contains at least one selected from an organic semiconductor, CNT, graphene, or fullerene. The rectifying element is further equipped with (c) an insulating layer and (d) a third electrode, and it is preferable that one of (a) the pair of electrodes and (d) the third electrode are electrically connected to each other and (d) the third electrode is disposed to be electrically insulated from (b) the functional layer exhibiting a rectifying action by (c) the insulating layer. In this case, (a) the pair of electrodes is source and drain electrodes, (c) the insulating layer is a gate insulating layer, and (d) the third electrode is a gate electrode.

Figure 3:
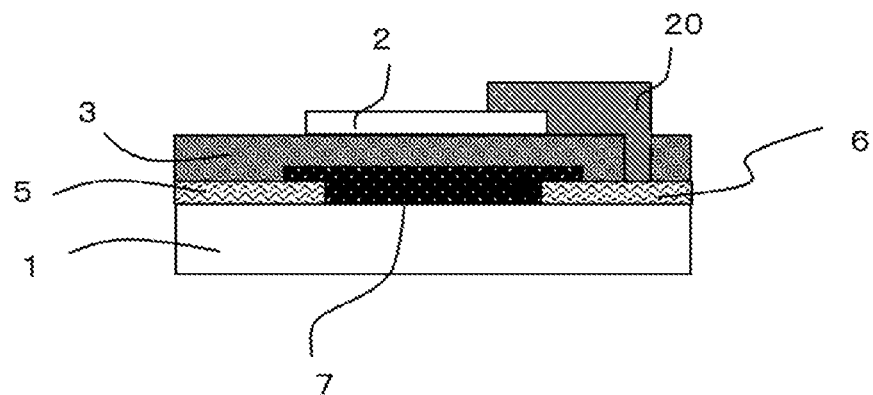
FIG. 3 is a schematic cross-sectional view illustrating an embodiment of a rectifying element of a rectifying circuit of the present invention.

As an example, a schematic cross-sectional view of a rectifying element of the rectifying circuit is illustrated in FIG. 3. A source electrode 5 and a drain electrode 6, which are a pair of electrodes, are provided on the surface of a substrate 1, and a functional layer 7 exhibiting a rectifying action is formed between these electrodes. A gate insulating layer 3 is provided on the functional layer 7 exhibiting a rectifying action, and further a gate electrode 2 is formed on the gate insulating layer 3. The drain electrode 6 and the gate electrode 2 are electrically connected to each other through a wire 20. In addition, the gate electrode 2 is electrically insulated from the functional layer 7 exhibiting a rectifying action by the gate insulating layer 3.

Figure 4:
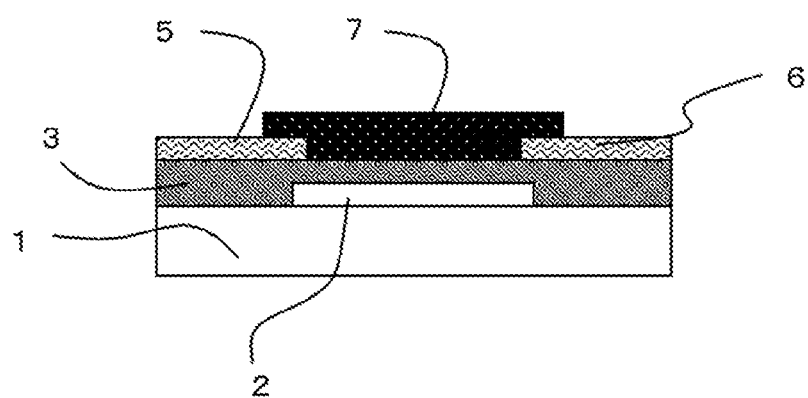
FIG. 4 is a schematic cross-sectional view illustrating an embodiment of a rectifying element of a rectifying circuit of the present invention.

In addition, a schematic cross-sectional view of a rectifying element of the rectifying circuit as another example is illustrated in FIG. 4. A gate electrode 2 is provided on the surface of a substrate 1, and the gate electrode 2 is covered with a gate insulating layer 3. A source electrode 5 and a drain electrode 6, which are a pair of electrodes, are provided on the gate insulating layer 3, and a functional layer 7 exhibiting a rectifying action is formed between these electrodes. The drain electrode 6 and the gate electrode 2 are electrically connected to each other through a wire (not illustrated). In addition, the gate electrode 2 is electrically insulated from the functional layer 7 exhibiting a rectifying action by the gate insulating layer 3.

The structure of the rectifying element described above is a so-called bottom gate and bottom contact structure in which the gate electrode 2 is disposed on the lower side (substrate 1 side) of the functional layer 7 exhibiting a rectifying action and the source electrode 5 and the drain electrode 6 are disposed on the lower surface of the functional layer 7 exhibiting a rectifying action as illustrated in FIG. 4. FIG. 3 illustrates a so-called top gate and bottom contact structure. However, the structure of the rectifying element is not limited to this and may be, for example, a so-called top contact structure in which the source electrode 5 and the drain electrode 6 are disposed on the upper surface of the functional layer 7 exhibiting a rectifying action.

The capacitor constituting the rectifying circuit may be capacitors which are generally used, and the shape thereof and the material to be used are not particularly limited. A transistor, a resistive element and the like may be further included if necessary. In addition, any method may be employed as long as the material for electrically connecting these each other can also achieve electrical conduction, and the width and thickness of the connection portion are arbitrary.

Figure 5:
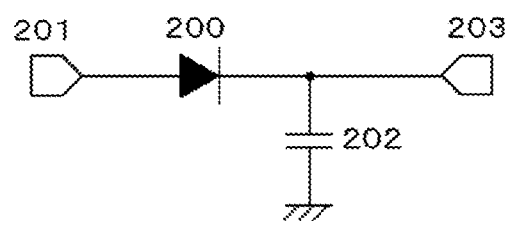
FIG. 5 is a block circuit diagram illustrating an example of a rectifying circuit of the present invention.

A block circuit diagram is illustrated in FIG. 5 as an example of a rectifying circuit fabricated using the rectifying element described above. The rectifying circuit in FIG. 5 is a half-wave rectifying circuit including a rectifying element 200 of a rectifying circuit, an input terminal 201 to which an alternating current is input, a capacitor 202, and an output terminal 203 and is a circuit which rectifies only a half cycle of alternating current. The input terminal 201 and one electrode of the rectifying element 200 of the rectifying circuit are electrically connected to each other, and the output terminal 203, the other electrode of the rectifying element 200 of the rectifying circuit, and one electrode of the capacitor 202 are electrically connected to each other. The other electrode of the capacitor 202 is electrically connected to the ground potential.

The properties of the rectifying element included in the rectifying circuit can be determined, for example, by inputting an alternating current to the rectifying circuit and measuring the output power. A rectifying element attaining a direct current output voltage as large as possible with respect to an input alternating-current voltage is a rectifying element included in a rectifying circuit exhibiting low power loss and favorable properties.

(Insulating Substrate)

The insulating substrate of the rectifying circuit may be formed of any material as long as at least the surface on which the electrode system is disposed is insulating. Examples thereof include those similar to the insulating substrates for the memory array described above.

Incidentally, it is preferable that the memory element of the memory array described above and the rectifying element of the rectifying circuit are not formed on separate insulating substrates but are formed on the same insulating substrate from the viewpoint of manufacturing cost and process simplicity.

(Electrode and Wire)

The material to be used in the electrodes and wires in the rectifying element of the rectifying circuit may be any material as long as it is a conductive material which can be generally used as an electrode. Examples thereof include those similar to the electrode and wire materials for the memory element of the memory array described above.

Incidentally, with regard to the electrodes and wires in the rectifying element of the rectifying circuit, it is preferable that the electrodes and wires in the memory element of the memory array described above and the electrodes and wires in the rectifying element of the rectifying circuit are not formed of different materials but are formed of the same material from the viewpoint of manufacturing cost. Furthermore, with regard to the electrodes and wires in the rectifying element of the rectifying circuit, it is preferable that the respective electrodes and wires in the memory element of the memory array described above and the respective electrodes and wires in the rectifying element of the rectifying circuit are formed in the same step.

(Insulating Layer)

The material to be used in the insulating layer in the rectifying element of the rectifying circuit is not particularly limited, and examples thereof include inorganic materials such as silicon oxide and alumina; organic polymer materials such as polyimide, polyvinyl alcohol, polyvinyl chloride, polyethylene terephthalate, polyvinylidene fluoride, polysiloxane, and polyvinylphenol (PVP); or any mixture of inorganic material powders and organic materials.

Among these, those containing an organic compound having a bond between silicon and carbon are preferable from the viewpoint of adhesive property to the substrate and electrode, and examples thereof include those similar to the materials for the gate insulating layer in the memory element of the memory array described above.

Incidentally, with regard to the insulating layer in the rectifying element of the rectifying circuit, it is preferable that the gate insulating layer in the memory element of the memory array described above and the insulating layer in the rectifying element of the rectifying circuit are not formed of different materials but are formed of the same material from the viewpoint of manufacturing cost. Furthermore, with regard to the insulating layer in the rectifying element of the rectifying circuit, it is preferable that the insulating layer in the memory element of the memory array described above and the gate insulating layer in the rectifying element of the rectifying circuit are formed in the same step from the viewpoint of process simplicity.

(Functional Layer Exhibiting Rectifying Action)

The functional layer exhibiting a rectifying action in the rectifying element of the rectifying circuit contains at least one selected from an organic semiconductor, CNT, graphene, or fullerene. Examples of an organic semiconductor include those similar to the organic semiconductors for the memory element of the memory array described above. Among these, the functional layer exhibiting a rectifying action more preferably contains CNT from the viewpoint of being able to be formed at a low temperature of 200° C. or less and of exhibiting high semiconductor properties. Examples of CNT include those similar to the CNTs for the memory element of the memory array described above.

Incidentally, with regard to the functional layer exhibiting a rectifying action in the rectifying element of the rectifying circuit, it is preferable that the semiconductor layer in the memory element of the memory array described above and the functional layer exhibiting a rectifying action in the rectifying element of the rectifying circuit are not formed of different materials but are formed of the same material from the viewpoint of manufacturing cost. Furthermore, with regard to the functional layer exhibiting a rectifying action in the rectifying element of the rectifying circuit, it is preferable that the semiconductor layer in the memory element of the memory array described above and the functional layer exhibiting a rectifying action in the rectifying element of the rectifying circuit are formed in the same step from the viewpoint of process simplicity.

Moreover, the total length of CNTs present per 1 µm² of the functional layer 7 exhibiting a rectifying action in the rectifying element of the rectifying circuit is preferably 10 µm to 50 µm. It is preferable that the total length is in this range since the rectifying properties of the rectifying element of the rectifying circuit are enhanced and the forward resistance decreases, that is, the power loss is low. The total length of CNTs present per 1 µm² of the functional layer exhibiting a rectifying action in the rectifying element of the rectifying circuit refers to the sum of the lengths of CNTs present in arbitrary 1 µm² of the functional layer exhibiting a rectifying action in the rectifying element of the rectifying circuit. Examples of a method for measuring the total length of CNTs include a method in which arbitrary 1 µm² is selected from the image of the functional layer exhibiting a rectifying action in the rectifying element of the rectifying circuit attained using an atomic force microscope and the lengths of all CNTs contained in the region are measured and summed.

Furthermore, a second insulating layer may be formed on the side opposite to the insulating layer with respect to the functional layer exhibiting a rectifying action. By forming the second insulating layer, it is possible to protect the functional layer exhibiting a rectifying action from the external environment such as oxygen and moisture.

The material to be used in the second insulating layer is not particularly limited, and specific examples thereof include inorganic materials such as silicon oxide and alumina; organic polymer materials such as polyimide and derivatives thereof, polyvinyl alcohol, polyvinyl chloride, polyethylene terephthalate, polyvinylidene fluoride, polysiloxane and derivatives thereof, and polyvinylphenol (PVP) and derivatives thereof; or any mixture of inorganic material powders and organic polymer materials and any mixture of organic low molecular weight materials and organic polymer materials. Among these, it is preferable to use an organic polymer material which can be prepared by a coating method. In particular, it is preferable to use an organic polymer material selected from the group consisting of polyfluoroethylene, polynorbornene, polysiloxane, polyimide, polystyrene, polycarbonate and derivatives thereof, polyacrylic acid derivatives, polymethacrylic acid derivatives, and copolymers containing these from the viewpoint of uniformity of the insulating layer. It is particularly preferable to use an organic polymer material selected from the group consisting of polysiloxane, polystyrene, polyvinyl phenol, and polymethyl methacrylate since it is possible to protect the functional layer exhibiting a rectifying action without increasing the electric resistance of the functional layer exhibiting a rectifying action, namely, the forward resistance of the rectifying element.

The film thickness of the second insulating layer is preferably 50 nm to 10 µm and more preferably 100 nm to 3 µm. The second insulating layer may be a single layer or a plurality of layers. Moreover, one layer may be formed of a plurality of insulating materials or may be formed by laminating a plurality of insulating materials.

The method for forming the second insulating layer is not particularly limited, and it is also possible to use a dry method such as resistive heating evaporation, electron beam, sputtering, and CVD, but it is preferable to use a coating method from the viewpoint of manufacturing cost and adaptation to a large area. As the coating method, specifically, it is possible to preferably use a spin coating method, a blade coating method, a slit die coating method, a screen printing method, a bar coater method, a mold method, a printing and transferring method, a dipping and pulling method, an ink jet method, a drop casting method and the like. The coating method can be selected depending on the coating film properties to be attained such as the control of coating film thickness and the control of orientation.

When the second insulating layer is formed by a coating method, the solvent in which the insulating material to be used in the second insulating layer is dissolved is not particularly limited, and examples thereof include ethers such as ethylene glycol monomethyl ether, ethylene glycol monoethyl ether, propylene glycol monomethyl ether, propylene glycol monoethyl ether, propylene glycol mono-n-butyl ether, propylene glycol mono-t-butyl ether, ethylene glycol dimethyl ether, ethylene glycol diethyl ether, ethylene glycol dibutyl ether, and diethylene glycol ethyl methyl ether; esters such as ethylene glycol monoethyl ether acetate, propylene glycol monomethyl ether acetate, propyl acetate, butyl acetate, isobutyl acetate, 3-methoxybutyl acetate, 3-methyl-3-methoxybutyl acetate, methyl lactate, and ethyl lactate, and butyl lactate; ketones such as acetone, methyl ethyl ketone, methyl propyl ketone, methyl butyl ketone, methyl isobutyl ketone, cyclopentanone, and 2-heptanone; alcohols such as butyl alcohol, isobutyl alcohol, pentanol, 4-methyl-2-pentanol, 3-methyl-2-butanol, 3-methyl-3-methoxybutanol, and diacetone alcohol; and aromatic hydrocarbons such as toluene and xylene. Two or more of these may be used. Among these, it is preferable to contain a solvent having a boiling point of 110° C. to 200° C. at 1 atm. When the boiling point is 110° C. or more, the volatilization of solvent at the time of solution application is suppressed, and the coating property is improved. When the boiling point is 200° C. or less, the solvent remaining in the insulating film is little and an insulating layer exhibiting more favorable heat resistance and chemical resistance is obtained. In addition, the formed coating film may be subjected to an annealing treatment in the air, under reduced pressure, or in an inert gas atmosphere (in a nitrogen or argon atmosphere).

<Logic Circuit>

The logic circuit according to the present invention includes a third semiconductor element having a third semiconductor layer, and the third semiconductor layer is a channel layer in the logic element and the third semiconductor element is a logic element. The logic circuit according to the present invention includes at least a plurality of logic elements which is equipped with an insulating substrate; a source electrode, a drain electrode, and a gate electrode; a channel layer in contact with the source electrode and drain electrode; and a gate insulating layer insulating the channel layer from the gate electrode and in which the channel layer contains at least one selected from an organic semiconductor, CNT, graphene, or fullerene.

Moreover, it is preferable that the logic circuit includes a plurality of fourth semiconductor elements in addition to the third semiconductor element. The fourth semiconductor elements are equipped with an insulating substrate; a source electrode, a drain electrode, and a gate electrode; a fourth semiconductor layer in contact with the source electrode and drain electrode; and a gate insulating layer which insulates the fourth semiconductor layer from the gate electrode. The fourth semiconductor layer contains at least one selected from an organic semiconductor, CNT, graphene, or fullerene. The fourth semiconductor layer is a channel layer, and the fourth semiconductor elements are a logic element. In this case, the third semiconductor element is a logic element including a p-channel transistor, and the fourth semiconductor element is a logic element including an n-channel transistor. Furthermore, it is preferable that the fourth semiconductor element has a second insulating layer in contact with the fourth semiconductor layer on the side opposite to the gate insulating layer with respect to the fourth semiconductor layer.

Figure 6:
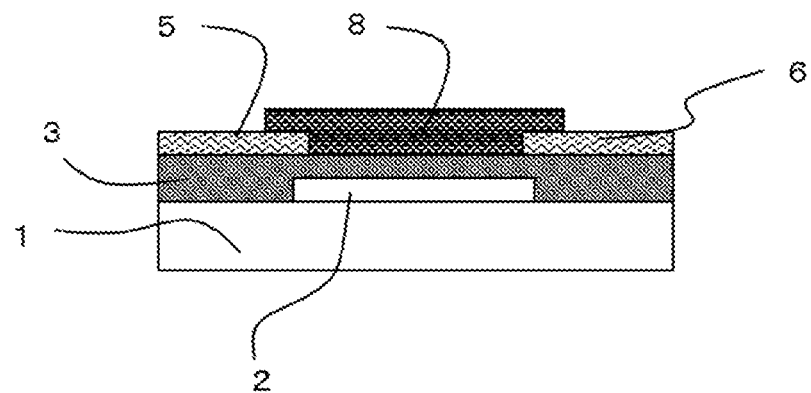
FIG. 6 is a schematic cross-sectional view illustrating an embodiment of a logic element of a logic circuit of the present invention.

A schematic cross-sectional view illustrating an example of a logic element of a logic circuit is illustrated in FIG. 6. The logic element has a gate electrode 2 formed on a substrate 1, a gate insulating layer 3 covering the gate electrode 2, a source electrode 5 and a drain electrode 6 provided thereon, and a channel layer 8 provided between these electrodes. The channel layer 8 contains at least one selected from an organic semiconductor, CNT, graphene, or fullerene. The structure of the logic element is a so-called bottom gate and bottom contact structure in which the gate electrode 2 is disposed on the lower side (substrate 1 side) of the channel layer 8 and the source electrode 5 and the drain electrode 6 are disposed on the lower surface of the channel layer 8. However, the structure of the logic element is not limited to this and may be, for example, a so-called top gate structure in which the gate electrode 2 is disposed on the upper side (the side opposite to the substrate 1) of the channel layer 8 or a so-called top contact structure in which the source electrode 5 and the drain electrode 6 are disposed on the upper surface of the channel layer 8.

Figure 7:
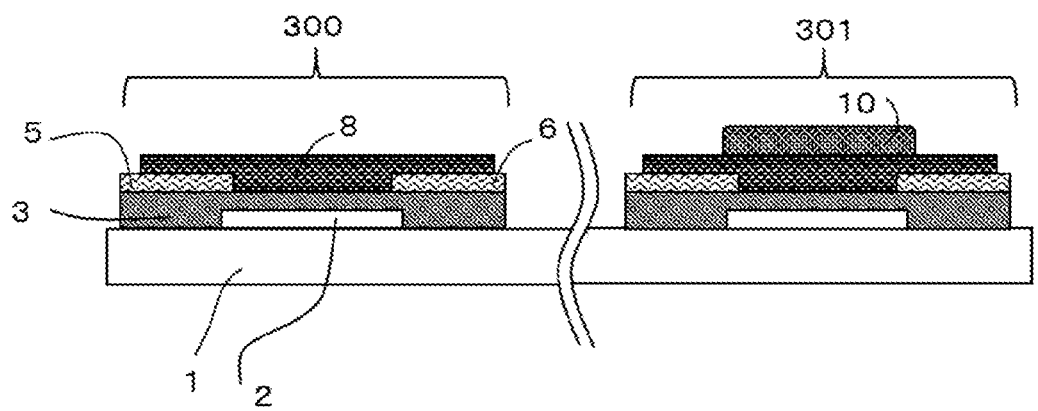
FIG. 7 is a schematic cross-sectional view illustrating an embodiment of a logic element of a logic circuit of the present invention.

A schematic cross-sectional view illustrating another example of a logic element of a logic circuit is illustrated in FIG. 7. A p-channel transistor 300 and an n-channel transistor 301 are formed on the surface of a substrate 1. The p-channel transistor 300 has a gate electrode 2 formed on the substrate 1, a gate insulating layer 3 covering the gate electrode 2, a source electrode 5 and a drain electrode 6 provided thereon, and a channel layer 8 provided between these electrodes. The n-channel transistor 301 has a gate electrode 2 formed on the substrate 1, a gate insulating layer 3 covering the gate electrode 2, a source electrode 5 and a drain electrode 6 provided thereon, a channel layer 8 provided between these electrodes, and a second insulating layer 10 of the n-channel transistor covering the semiconductor layer on the upper side of the channel layer 8. Each of the channel layers 8 contains at least one selected from an organic semiconductor, CNT, graphene, or fullerene. The structure of each of the p-channel transistor 300 and n-channel transistor 301 is a so-called bottom gate and bottom contact structure in which the gate electrode is disposed on the lower side (substrate 1 side) of the channel layer and the source electrode and the drain electrode are disposed on the lower surface of the channel layer. However, the structure of the logic element is not limited to this and may be, for example, a so-called top gate structure in which the gate electrode 2 is disposed on the upper side (the side opposite to the substrate 1) of the channel layer 8 or a so-called top contact structure in which the source electrode 5 and the drain electrode 6 are disposed on the upper surface of the channel layer 8.

(Insulating Substrate)

The insulating substrate of the logic circuit may be formed of any material as long as at least the surface on which the electrode system is disposed is insulating. Examples thereof include those similar to the insulating substrates for the memory array described above.

Incidentally, it is preferable that the memory element of the memory array and the rectifying element of the rectifying circuit described above and the logic element of the logic circuit are not formed on separate insulating substrates but are formed on the same insulating substrate from the viewpoint of manufacturing cost and process simplicity.

(Electrode and Wire)

The material to be used in the electrodes and wires in the logic element of the logic circuit may be any material as long as it is a conductive material which can be generally used as an electrode. Examples thereof include those similar to the electrode and wire materials for the memory element of the memory array described above.

Incidentally, it is preferable that the electrodes and wires in the logic element of the logic circuit and the electrodes and wires in the memory element of the memory array and the rectifying element of the rectifying circuit described above are not formed of different materials but are formed of the same material from the viewpoint of manufacturing cost. Furthermore, it is preferable that the electrodes and wires in the logic element of the logic circuit and the respective electrodes and wires in the memory element of the memory array and the rectifying element of the rectifying circuit described above are formed in the same step.

(Insulating Layer)

The material to be used in the insulating layer in the logic element of the logic circuit is not particularly limited, and examples thereof include inorganic materials such as silicon oxide and alumina; organic polymer materials such as polyimide, polyvinyl alcohol, polyvinyl chloride, polyethylene terephthalate, polyvinylidene fluoride, polysiloxane, and polyvinylphenol (PVP); or any mixture of inorganic material powders and organic materials.

Among these, those containing an organic compound having a bond between silicon and carbon are preferable from the viewpoint of adhesive property to the substrate and electrode, and examples thereof include those similar to the materials for the gate insulating layer in the memory element of the memory array described above.

Incidentally, it is preferable that the insulating layer in the logic element of the logic circuit and the gate insulating layer in the memory element of the memory array and the insulating layer in the rectifying element of the rectifying circuit described above are not formed of different materials but are formed of the same material from the viewpoint of manufacturing cost. Furthermore, it is preferable that the insulating layer in the logic element of the logic circuit and the gate insulating layer in the memory element of the memory array and the insulating layer in the rectifying element of the rectifying circuit described above are formed in the same step from the viewpoint of process simplicity.

(Channel Layer)

The channel layer in the logic element of the logic circuit contains at least one selected from an organic semiconductor, CNT, graphene, or fullerene. Examples of an organic semiconductor include those similar to the organic semiconductors for the memory element of the memory array described above. Among these, the channel layer in the logic element more preferably contains CNT from the viewpoint of being able to be formed at a low temperature of 200° C. or less and of exhibiting high semiconductor properties. Examples of CNT include those similar to the CNTs for the memory element of the memory array described above.

Incidentally, it is preferable that the channel layer in the logic element of the logic circuit and the semiconductor layer in the memory element of the memory array and the functional layer exhibiting a rectifying action in the rectifying element of the rectifying circuit described above are not formed of different materials but are formed of the same material from the viewpoint of manufacturing cost. Furthermore, it is preferable that the channel layer in the logic element of the logic circuit and the semiconductor layer in the memory element of the memory array and the functional layer exhibiting a rectifying action in the rectifying element of the rectifying circuit described above are formed in the same step from the viewpoint of process simplicity.

Moreover, it is preferable that the total length of the carbon nanotubes present per 1 µm² of the third semiconductor layer is 0.7 time or less the total length of the carbon nanotubes present per 1 µm² of the second semiconductor layer. In other words, it is preferable that the total length of the CNTs present per 1 µm² of the channel layer in the logic element of the logic circuit is 0.7 time or less the total length of CNTs present per 1 µm² of the functional layer exhibiting a rectifying action in the rectifying element of the rectifying circuit. It is preferable that the total length is in this range since the threshold voltage of the logic element of the logic circuit decreases and the responsivity is enhanced, that is, the logic element can operate at a high speed. The total length is still more preferably 0.2 time or more and 0.7 time or less. It is preferable that the total length is in this range since the threshold voltage of the logic element of the logic circuit decreases, the mobility is enhanced, and the responsivity is enhanced, that is, the logic element can operate at a high speed. Incidentally, the numerical value range is a range attained by rounding off the last digit of the significant digit of the limit value. In other words, 0.7 time or less is 0.74 time or less and 0.2 time or more is 0.15 time or more.

The total length of CNTs present per 1 µm² of the channel layer in the logic element of the logic circuit refers to the sum of the lengths of CNTs present in arbitrary 1 µm² of the channel layer in the logic element of the logic circuit. Examples of a method for measuring the total length of CNTs include a method in which arbitrary 1 µm² is selected from the image of the channel layer in the logic element of the logic circuit attained using an atomic force microscope and the lengths of all CNTs contained in the region are measured and summed.

Furthermore, an insulating layer may be further formed on the side opposite to the insulating layer with respect to the channel layer. By further forming an insulating layer, it is possible to protect the channel layer from the external environment such as oxygen and moisture. The material, film thickness, forming method and the like of the insulating layer are the same as those of the second insulating layer in the rectifying element of the rectifying circuit described above.

(Second Insulating Layer)

The second insulating layer is formed on the side opposite to the gate insulating layer with respect to the channel layer. The side opposite to the gate insulating layer with respect to the channel layer refers to, for example, the lower side of the channel layer in a case in which the gate insulating layer is provided on the upper side of the channel layer. It is possible to protect the channel layer by forming the second insulating layer.

The second insulating layer contains an organic compound having a bond between a carbon atom and a nitrogen atom. Such an organic compound may be any organic compound, and examples thereof include amide-based compounds, imide-based compounds, urea-based compounds, amine-based compounds, imine-based compounds, aniline-based compounds, and nitrile-based compounds.

Examples of amide-based compounds include polyamide, formamide, acetamide, poly-N-vinylacetamide, N,N-dimethylformamide, acetanilide, benzanilide, N-methylbenzanilide, sulfonamide, nylon, polyvinylpyrrolidone, N-methylpyrrolidone, polyvinyl polypyrrolidone, β-lactam, γ-lactam, δ-lactam, and ε-caprolactam.

Examples of imide-based compounds include polyimide, phthalimide, maleimide, alloxan, and succinimide.

Examples of urea-based compounds include uracil, thymine, urea, and acetohexamide.

Examples of amine-based compounds include methylamine, dimethylamine, trimethylamine, ethylamine, diethylamine, triethylamine, diisopropylethylamine, cyclohexylamine, methylcyclohexylamine, dimethylcyclohexylamine, dicyclohexylamine, dicyclohexylmethylamine, tricyclohexylamine, cyclooctylamine, cyclodecylamine, cyclododecylamine, 1-azabicyclo[2.2.2]octane (quinuclidine), 1,8-diazabicyclo[5.4.0]undec-7-ene (DBU), 1,5-diazabicyclo[4.3.0]non-5-ene (DBN), 1,5,7-triazabicyclo[4.4.0]dec-5-ene (TBD), 7-methyl-1,5,7-triazabicyclo[4.4.0]dec-5-ene (MTBD), poly(melamine-co-formaldehyde), tetramethylethylenediamine, diphenylamine, triphenylamine, and phenylalanine.

Examples of imine-based compounds include ethyleneimine, N-methylhexane-1-imine, N-methyl-1-butyl-1-hexaneimine, propane-2-imine, methanediimine, N-methylethaneimine, and ethane-1,2-diimine.

Examples of aniline-based compounds include aniline and methylaminobenzoic acid.

Examples of nitrile-based compounds include acetonitrile and acrylonitrile. Examples of other compounds include polyurethane, allantoin, 2-imidazolidinone, 1,3-dimethyl-2-imidazolidinone, dicyandiamidine, citrulline, piperidine, imidazole, pyrimidine, julolidine, and poly(melamine-co-formaldehyde), but the other compounds are not limited thereto.

Among these, the second insulating layer preferably contains a compound containing one or more selected from the following Formula (4) or (5) from the viewpoint of improving the properties of the n-channel transistor.

[Chemical formula 13]

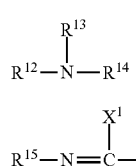

(4)

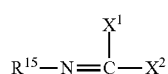

(5)

($R^{12}$ to $R^{15}$ each independently represent a group composed of one or more atoms selected from a hydrogen atom, a carbon atom, a nitrogen atom, an oxygen atom, a silicon atom, a phosphorus atom, or a sulfur atom. $X^1$ and $X^2$ each independently represent any one of groups represented by the following Formulas (6) to (11).)

[Chemical formula 14]

(6)

(7)

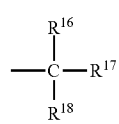

(8)

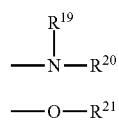

(9)

-continued

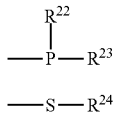

(10)

(11)

($R^{16}$ to $R^{24}$ each independently represent a group composed of one or more atoms selected from a hydrogen atom, a carbon atom, a nitrogen atom, an oxygen atom, a silicon atom, a phosphorus atom, or a sulfur atom.

Furthermore, $R^{12}$ to $R^{24}$ in Formulas (4) to (11) are preferably a hydrocarbon group from the viewpoint of availability of materials.

Among others, the second insulating layer preferably contains a compound having a ring structure from the viewpoint of storage stability of the n-channel transistor. In particular, the compound having a ring structure is more preferably an amine-based compound having a ring structure or a compound which has a ring structure containing a nitrogen atom as a hetero atom and is represented by Formulas (4) and (5). Examples of an amine-based compound having a ring structure include cyclohexylamine, methylcyclohexylamine, dimethylcyclohexylamine, dicyclohexylamine, dicyclohexylmethylamine, tricyclohexylamine, cyclooctylamine, cyclodecylamine, cyclododecylamine, aniline, diphenylamine, and triphenylamine. Examples of a compound having a ring structure containing a nitrogen atom as a hetero atom include polyvinylpyrrolidone, N-methylpyrrolidone, polyvinylpolypyrrolidone, β-lactam, γ-lactam, δ-lactam, ε-caprolactam, polyimide, phthalimide, maleimide, alloxan, succinimide, uracil, thymine, 2-imidazolidinone, 1,3-dimethyl-2-imidazolidinone, quinuclidine, DBU, DBN, TBD, MTBD, piperidine, imidazole, pyrimidine, and julolidine.

Moreover, it is still more preferable that the second insulating layer contains an amidine compound and a guanidine compound. Examples of an amidine compounds include DBU and DBN, and examples of a guanidine compound include TBD and MTBD. These compounds are preferable since the electro-donicity thereof is high and the performance as an n-channel transistor is further improved.

The film thickness of the second insulating layer is preferably 50 nm or more and more preferably 100 nm or more. In addition, the film thickness is preferably 10 μm or less and more preferably 3 μm or less. A uniform thin film can be easily formed by setting the film thickness to this range. The film thickness can be measured using an atomic force microscope and by an ellipsometry method, and the like.

The second insulating layer may be a single layer or a plurality of layers. Moreover, one layer may be formed of a plurality of insulating materials or may be formed by laminating a plurality of insulating materials.

The method for forming the second insulating layer is not particularly limited, and it is also possible to use a dry method such as resistive heating evaporation, electron beam, sputtering, and CVD, but it is preferable to use a coating method from the viewpoint of manufacturing cost and adaptation to a large area. As the coating method, specifically, it is possible to preferably use a spin coating method, a blade coating method, a slit die coating method, a screen printing method, a bar coater method, a mold method, a printing and transferring method, a dipping and pulling method, an ink jet method, a drop casting method and the like. The coating method can be selected depending on the coating film properties to be attained such as the control of coating film thickness and the control of orientation.

When the second insulating layer is formed by a coating method, the solvent in which the insulating material to be used in the second insulating layer is dissolved is not particularly limited, and examples thereof include ethers such as ethylene glycol monomethyl ether, ethylene glycol monoethyl ether, propylene glycol monomethyl ether, propylene glycol monoethyl ether, propylene glycol mono-n-butyl ether, propylene glycol mono-t-butyl ether, ethylene glycol dimethyl ether, ethylene glycol diethyl ether, ethylene glycol dibutyl ether, and diethylene glycol ethyl methyl ether; esters such as ethylene glycol monoethyl ether acetate, propylene glycol monomethyl ether acetate, propyl acetate, butyl acetate, isobutyl acetate, 3-methoxybutyl acetate, 3-methyl-3-methoxybutyl acetate, methyl lactate, and ethyl lactate, and butyl lactate; ketones such as acetone, methyl ethyl ketone, methyl propyl ketone, methyl butyl ketone, methyl isobutyl ketone, cyclopentanone, and 2-heptanone; alcohols such as butyl alcohol, isobutyl alcohol, pentanol, 4-methyl-2-pentanol, 3-methyl-2-butanol, 3-methyl-3-methoxybutanol, and diacetone alcohol; and aromatic hydrocarbons such as toluene and xylene.

Two or more of these may be used. Among these, it is preferable to contain a solvent having a boiling point of 110° C. to 200° C. at 1 atm. When the boiling point is 110° C. or more, the volatilization of solvent at the time of solution application is suppressed, and the coating property is improved. When the boiling point is 200° C. or less, the solvent remaining in the insulating film is little and an insulating layer exhibiting more favorable heat resistance and chemical resistance is obtained. In addition, the formed coating film may be subjected to an annealing treatment in the air, under reduced pressure, or in an atmosphere of an inert gas such as nitrogen or argon.

In the p-channel transistor and n-channel transistor thus formed, the current (source-drain current) flowing between the source electrode and the drain electrode can be controlled by changing the gate voltage, and the mobility can be calculated using the following Equation (a).

$$\mu=(\delta Id/\delta Vg)L \cdot D/(W \cdot \varepsilon r \cdot \varepsilon \cdot Vsd) \tag{a}$$

Where Id denotes the source-drain current (A), Vsd denotes the source-drain voltage (V), Vg denotes the gate voltage (V), D denotes the thickness of the gate insulating layer (m), L denotes the channel length (m), W denotes the channel width (m), εr denotes the relative dielectric constant of the gate insulating layer, and ε denotes the dielectric constant in a vacuum ($8.85 \times 10^{-12}$ F/m).

Moreover, the threshold voltage can be determined from the intersection of the extended line of the linear part in the Id-Vg graph and the Vg axis.

The properties of the logic element of the logic circuit are that the operation is performed as a positive voltage equal to or more than the threshold voltage is applied to the gate electrode and thus source-drain electrical conduction is achieved. For example, a logic element having a low absolute threshold voltage value and a high mobility is a logic element exhibiting high performance and favorable properties.

<Integrated Circuit>

Figure 8:
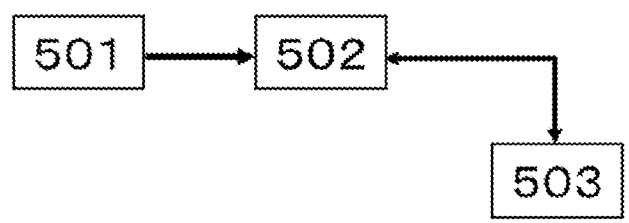
FIG. 8 is a block circuit diagram illustrating an example of an integrated circuit of the present invention.

A block circuit diagram is illustrated in FIG. 8 as an example of the integrated circuit of the present invention. The integrated circuit is equipped with at least the memory array 503, the rectifying circuit 501, and the logic circuit 502. For example, in the integrated circuit, the logic circuit 502 is electrified by the power generated by the rectifying circuit 501, and the data stored in the memory array 503 is read. With regard to the rectifying circuit 501, the logic circuit 502, and the memory array 503, the connection material and method may be any material and method and the width and thickness of the connection portion are arbitrary as long as the respective circuits are electrically connected to each other.

Incidentally, in the present embodiment, only a memory element, a rectifying element, and a logic element are illustrated, but those to be used in the integrated circuit are not limited to these, and every circuit element can be used. Examples thereof typically include a diode, a photoelectric conversion element, a resistive element, a coil, a capacitance element, and an inductor.

It is preferable that the gate electrode in the memory element of the memory array, the gate electrode in the rectifying element of the rectifying circuit, and the gate electrode in the logic element of the logic circuit are all composed of the same material. This is because the kinds of materials decrease and these gate electrodes can be fabricated in the same step. The fact that the respective gate electrodes are composed of the same material means that the elements having the highest molar ratio among the elements contained in the respective gate electrodes are the same as one another. The kinds and content ratios of elements in the gate electrodes can be identified by elemental analysis such as X-ray photoelectron spectroscopy (XPS) and secondary ion mass spectrometry (SIMS).

Moreover, it is preferable that the gate insulating layer in the memory element of the memory array, the gate insulating layer in the rectifying element of the rectifying circuit, and the gate insulating layer in the logic element of the logic circuit are all composed of the same material since the kinds of materials decrease and the gate insulating layers can be fabricated in the same step. The fact that these gate insulating layers are formed of the same material means that the kinds and composition ratios of the elements contained in the compositions constituting the respective gate insulating layers at 1 mol % or more are the same as one another. Whether or not the kinds and composition ratios of elements are the same as one another can be identified by elemental analysis such as X-ray photoelectron spectroscopy (XPS) and secondary ion mass spectrometry (SIMS).

Moreover, it is preferable that the source electrode or/and drain electrode in the memory element of the memory array, the source electrode or/and drain electrode in the rectifying element of the rectifying circuit, and the source electrode and/or drain electrode in the logic element of the logic circuit are all composed of the same material. This is because the kinds of materials decrease and these electrodes can be fabricated in the same step. The fact that the respective electrodes are composed of the same material means that the elements having the highest molar ratio among the elements contained in the respective electrodes are the same as one another. The kinds and content ratios of elements in the electrodes can be identified by elemental analysis such as X-ray photoelectron spectroscopy (XPS) and secondary ion mass spectrometry (SIMS).

It is preferable that the memory element of the memory array, the rectifying element of the rectifying circuit, and the logic element of the logic circuit all have the same structure since the kinds of materials decrease and the elements can be fabricated in the same step. The same structure means that the layers and electrodes formed on a substrate have the same formation order and the same number of layers in the present invention. As the respective elements have the same structure, the respective elements can be all manufactured at the same time, the process is simple, and the production efficiency is improved.

<Manufacturing Method>

(Method for Manufacturing Memory Array)

A method for manufacturing a memory array according to the present invention will be described. The method for manufacturing a memory array according to the present invention includes at least a step of forming a semiconductor layer in a region between the source electrode and the drain electrode in at least one memory element of the plurality of memory elements through coating and drying. In addition, in this manufacturing method, the methods for forming the electrodes, gate insulating layer, and semiconductor layer constituting each memory element included in the memory array to be manufactured are as described above. The memory array according to the present invention can be manufactured by appropriately selecting the order of forming methods of these.

Figure 9:
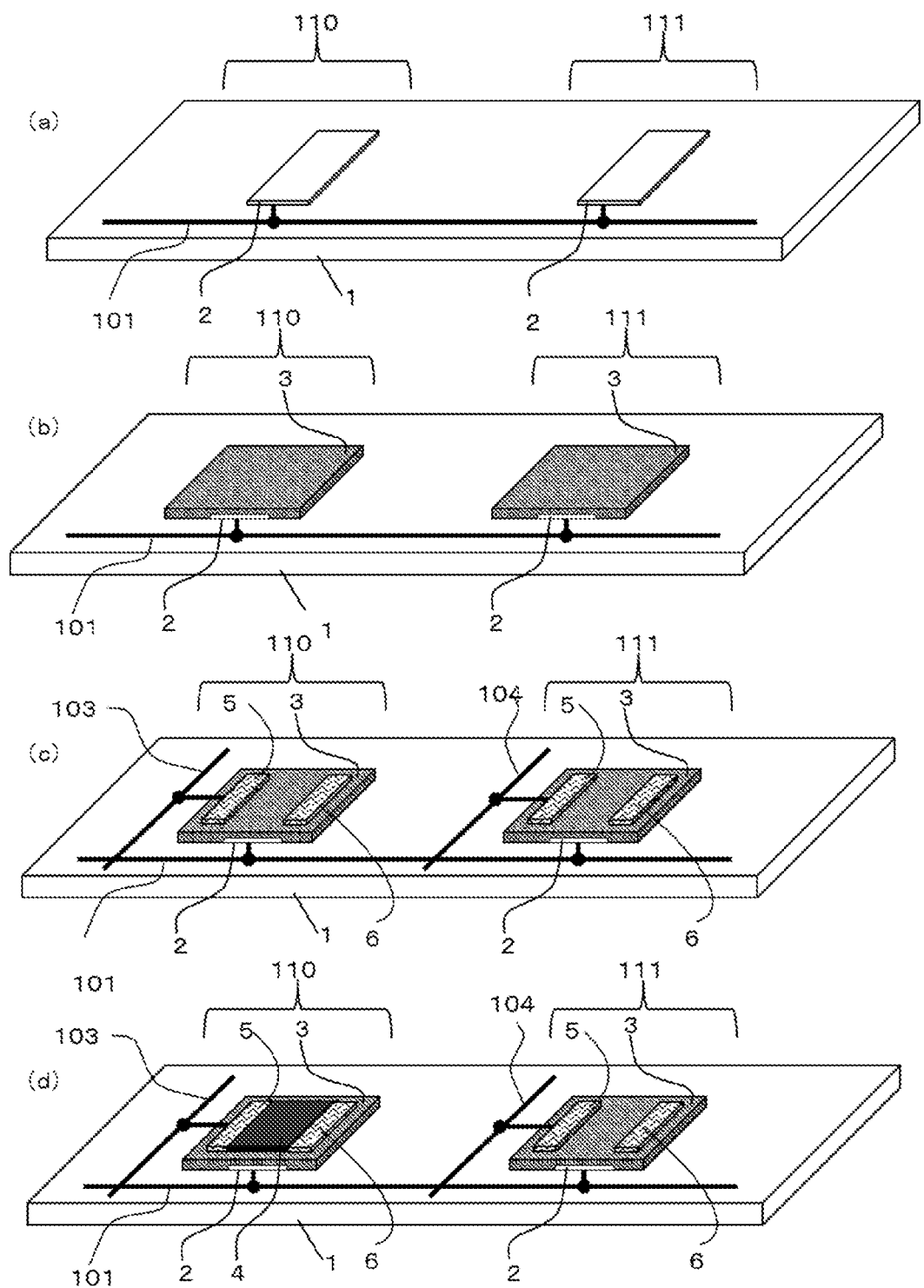
FIG. 9 is a cross-sectional view illustrating an embodiment of a step of manufacturing a memory array of the present invention.

Specifically, a first wire and a gate electrode are first formed as illustrated in FIG. 9(*a*). In this step, at least one first wire (for example, line 101) and a plurality of gate electrodes 2 are simultaneously formed on a substrate 1 by the methods described above, for example, by performing vacuum deposition through a mask. At this time, in a case in which there are wires required other than the line 101 illustrated in FIG. 9, the required number of wires are formed so as to be lined up apart from each other with a predetermined direction as a longitudinal direction. The gate electrodes 2 are formed on the substrate 1 by the same number as that of the plurality of memory elements to be fabricated although two gate electrodes 2 are illustrated in FIG. 9. These plural gate electrodes 2 are electrically connected to at least one wire such as the wire 101 illustrated in FIG. 9.

Next, a gate insulating layer 3 is formed as illustrated in FIG. 9(*b*). In this step, a plurality of gate insulating layers 3 are formed on the substrate 1 in accordance with the plurality of gate electrodes 2 by the method described above, for example, a printing method. Each of these plural gate insulating layers 3 is in contact with the upper side of the gate electrode 2 as well as covers the gate electrode 2 so that the gate electrode 2 is sandwiched between the gate insulating layer 3 and the substrate 1.

Next, the formation of a second wire, a source electrode, and a drain electrode is performed as illustrated in FIG. 9(*c*). In this step, a plurality of wires and plural pairs of source electrode 5 and drain electrode 6 are simultaneously formed by the methods described above, for example, by using the same material and performing vacuum deposition through a mask. At this time, wires 103 and 104 are formed on the substrate 1 so as to be lined up apart from each other with the direction intersecting at least one first wire as a longitudinal direction. In a case in which there are wires required other than the wires 103 and 104 illustrated in FIG. 9(*c*), the required number of wires are formed in the same manner as that for these wires 103 and 104. The source electrode 5 and the drain electrode 6 are illustrated by two pairs (two each) in FIG. 9(*c*) but are each formed on the gate insulating layer 3 by the same number as that of the plurality of memory elements to be fabricated. Each of the plurality of source electrodes 5 is electrically connected to at least one wire such as the wire 103 or 104 illustrated in FIG. 9(*c*).

Next, a coating step is performed as illustrated in FIG. 9(*d*). The coating layer to be formed in this step is a semiconductor layer 4. In this step, a memory element to be coated is selected from a plurality of memory elements on the substrate 1 in accordance with the information to be recorded. Subsequently, the semiconductor layer 4 is formed in a region between the source electrode 5 and drain electrode 6 in a memory element which is selected as a coating target (memory element 110 in FIG. 9(d)) by a coating method. The semiconductor layer 4 is formed by, for example, applying a solution containing CNT in a region between the source electrode 5 and drain electrode 6 of the memory element 110 and drying the solution. On the other hand, the semiconductor layer 4 is not formed on a memory element (memory element 111 in FIG. 9(d)) which is not selected as a coating target among these plural memory elements. In this manner, the plurality of memory elements on the substrate 1 are separately fabricated into two kinds of memory elements having different electric properties from each other (that is, the information to be recorded is different from each other) depending on the presence or absence of the semiconductor layer 4. As a result, it is possible to fabricate a memory array in which unique information determined by arbitrary arrangement of these two kinds of memory elements is recorded.

The coating method in the coating step of the semiconductor layer is not particularly limited but is preferably any one selected from the group consisting of an inkjet method, a dispenser method, and a spray method. Among these, an inkjet method is more preferable as the coating method from the viewpoint of use efficiency of raw materials.

Figure 10:
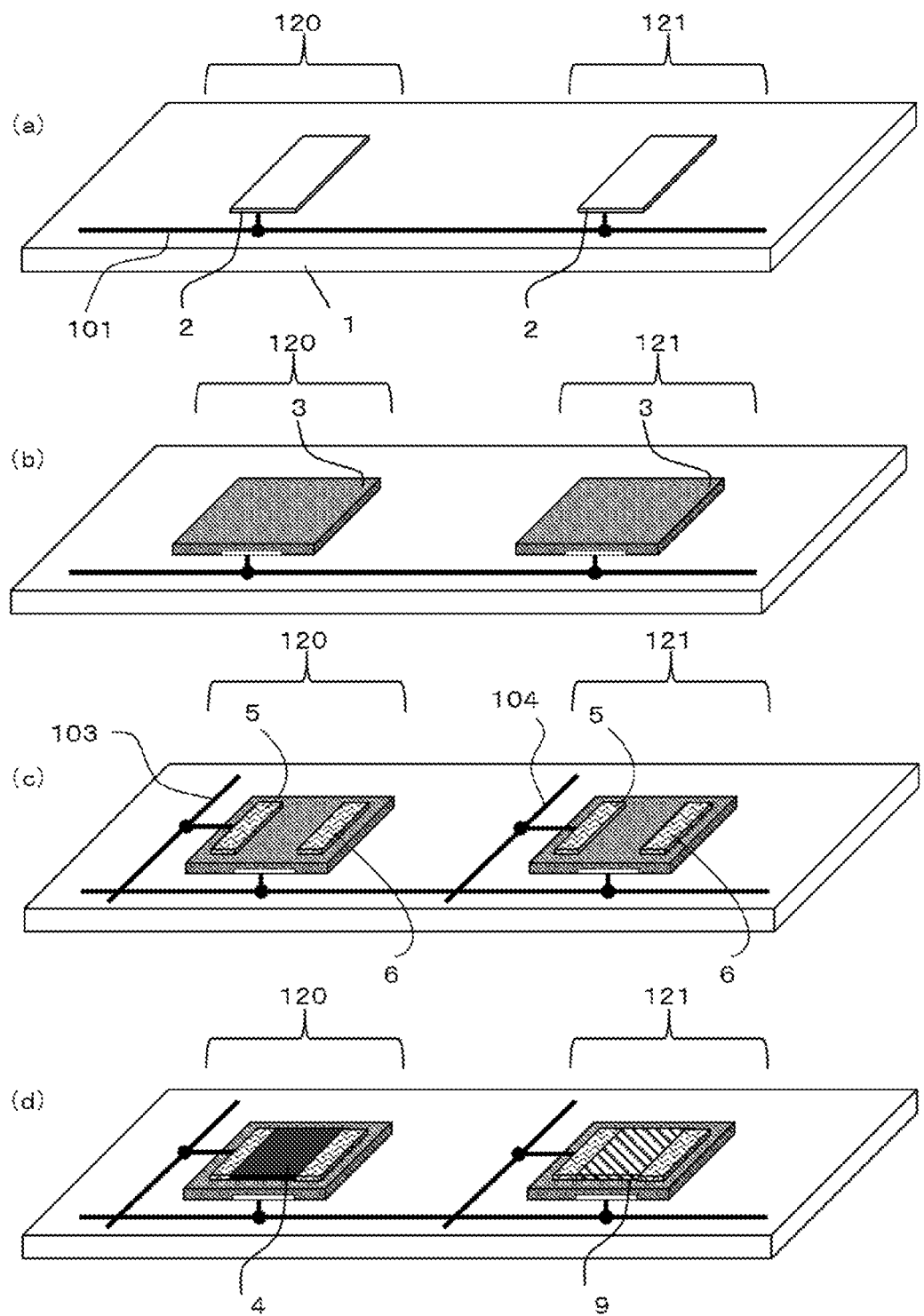
FIG. 10 is a cross-sectional view illustrating an embodiment of a step of manufacturing a memory array of the present invention.

Next, another example of the method for manufacturing a memory array according to the present invention will be specifically described. FIG. 10 is a diagram illustrating another example of the method for manufacturing a memory array. Specifically, a first wire forming step is first performed as illustrated in FIG. 10(a). In this step, at least one first wire (for example, line 101) and a plurality of gate electrodes 2 are simultaneously formed on a substrate 1 by the methods described above, for example, by performing vacuum deposition through a mask. At this time, in a case in which there are wires required other than the line 101 illustrated in FIG. 10(a), the required number of wires are formed so as to be lined up apart from each other with a predetermined direction as a longitudinal direction. The gate electrodes 2 are formed on the substrate 1 by the same number as that of the plurality of memory elements to be fabricated although two gate electrodes 2 are illustrated in FIG. 10(a). These plural gate electrodes 2 are electrically connected to at least one wire such as the wire 101 illustrated in FIG. 10(a).

Next, a gate insulating layer is formed as illustrated in FIG. 10(b). In this step, a plurality of gate insulating layers 3 are formed on the substrate 1 in accordance with the plurality of gate electrodes 2 by the method described above, for example, a printing method. Each of these plural gate insulating layers 3 is in contact with the upper side of the gate electrode 2 as well as covers the gate electrode 2 so that the gate electrode 2 is sandwiched between the gate insulating layer 3 and the substrate 1.

Next, the formation of a second wire, a source electrode, and a drain electrode is performed as illustrated in FIG. 10(c). In this step, a plurality of wires and plural pairs of source electrode 5 and drain electrode 6 are simultaneously formed by the methods described above, for example, by using the same material and performing vacuum deposition through a mask. At this time, wires 103 and 104 are formed on the substrate 1 so as to be lined up apart from each other with the direction intersecting at least one first wire (for example, line 101) as a longitudinal direction. In a case in which there are wires required other than the wires 103 and 104 illustrated in FIG. 10(c), the required number of wires are formed in the same manner as that for these wires 103 and 104. The source electrode 5 and the drain electrode 6 are illustrated by two pairs (two each) in FIG. 10(c) but are each formed on the gate insulating layer 3 by the same number as that of the plurality of memory elements to be fabricated. Each of the plurality of source electrodes 5 is electrically connected to at least one wire such as the wire 103 or 104 illustrated in FIG. 10(c).

Next, a coating step is performed as illustrated in FIG. 10(d). The coating layer to be formed in this step is semiconductor layers 4 and 9 having different electric properties from each other. In this step, the semiconductor layers 4 and 9 are formed by a coating method in a region between the source electrode 5 and drain electrode 6 in each of the plurality of memory elements on the substrate 1 in accordance with the information to be recorded. The semiconductor layers 4 and 9 are formed by, for example, increasing the amount of CNT solution applied when forming the semiconductor layer 4 to be greater than the amount of CNT solution applied when forming the semiconductor layer 9 and thus increasing the film thickness of the semiconductor layer 4 to be thicker than the film thickness of the semiconductor layer 9. Moreover, as another example, the semiconductor layers 4 and 9 can also be formed by adjusting the amount of each semiconductor material applied when forming each of the semiconductor layers 4 and 9 to be constant but adjusting the concentration of CNT solution when forming the semiconductor layer 4 to be higher than the concentration of CNT solution when forming the semiconductor layer 9. By these methods, one of the information "0" and "1" is recorded in a memory element 120 and the other information is recorded in a memory element 121 and thus the arrangement of a plurality of memory elements obtained by arbitrarily combining two kinds of memory elements which record different information from each other, namely, a memory array can be fabricated in the same step. However, methods other than these may be employed as long as the electric properties of the semiconductor layers can be sufficiently differentiated from each other. Moreover, the coating method in this step is preferably any one selected from the group consisting of an inkjet method, a dispenser method, and a spray method in the same manner as in the case of the coating step described above. Among these, an inkjet method is more preferable.

Figure 11:
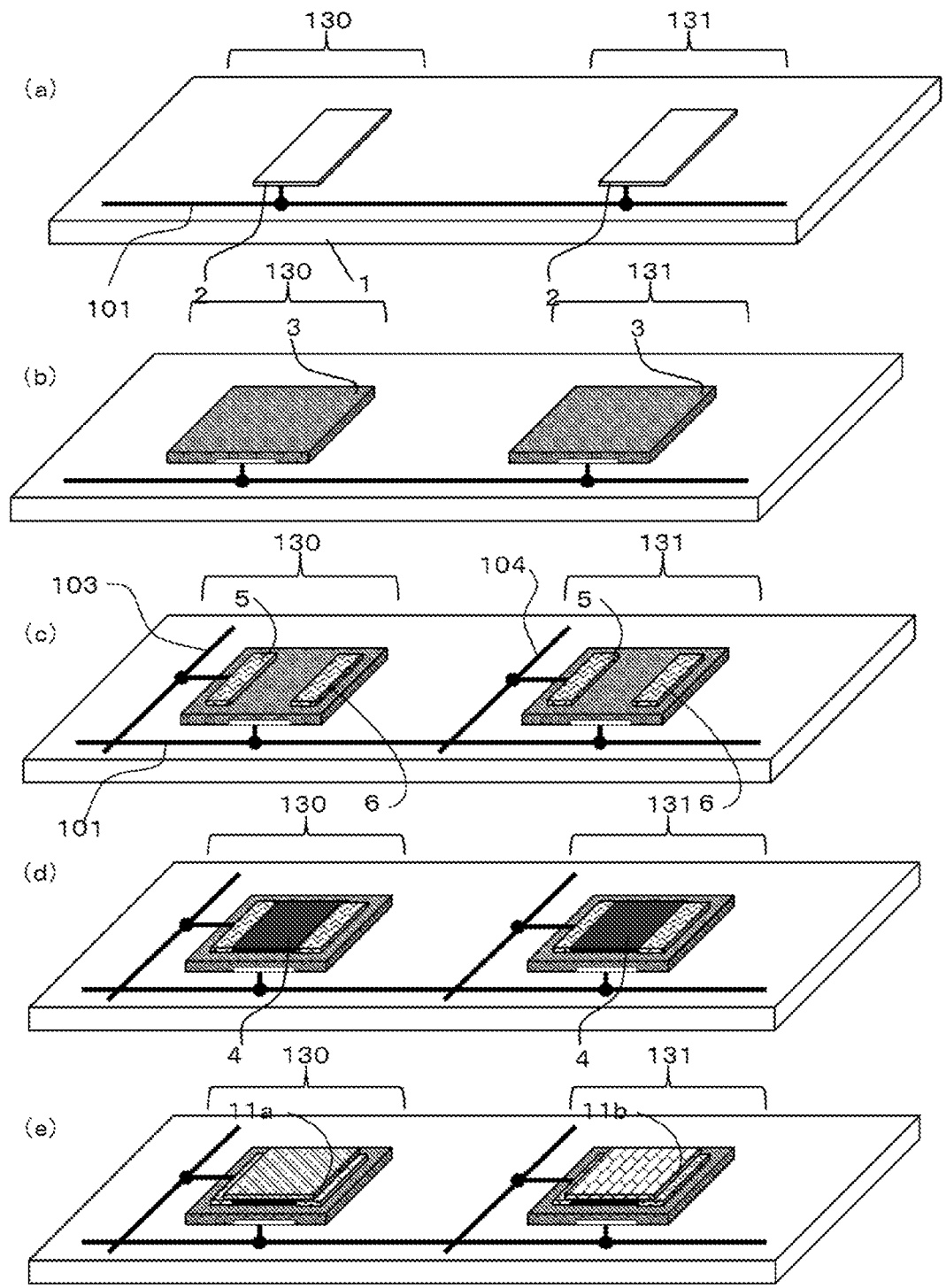
FIG. 11 is a cross-sectional view illustrating an embodiment of a step of manufacturing a memory array of the present invention.

Next, another example of the method for manufacturing a memory array according to the present invention will be specifically described. FIG. 11 is a diagram illustrating another example of the method for manufacturing a memory array. Specifically, a first wire forming step is first performed as illustrated in FIG. 11(a). In this step, at least one first wire (for example, line 101) and a plurality of gate electrodes 2 are simultaneously formed on a substrate 1 by the methods described above, for example, by performing vacuum deposition through a mask. At this time, in a case in which there are wires required other than the line 101 illustrated in FIG. 11(a), the required number of wires are formed so as to be lined up apart from each other with a predetermined direction as a longitudinal direction. The gate electrodes 2 are formed on the substrate 1 by the same number as that of the plurality of memory elements to be fabricated although two gate electrodes 2 are illustrated in FIG. 11(a). These plural gate electrodes 2 are electrically connected to at least one wire such as the wire 101 illustrated in FIG. 11(a).

Next, a gate insulating layer is formed as illustrated in FIG. 11(b). In this step, a plurality of gate insulating layers 3 are formed on the substrate 1 in accordance with the plurality of gate electrodes 2 by the method described above, for example, a printing method. Each of these plural gate insulating layers 3 is in contact with the upper side of the gate electrode 2 as well as covers the gate electrode 2 so that the gate electrode 2 is sandwiched between the gate insulating layer 3 and the substrate 1.

Next, the formation of a second wire, a source electrode, and a drain electrode is performed as illustrated in FIG. 11(*c*). In this step, a plurality of wires (for example, wires 103 and 104) and plural pairs of source electrode 5 and drain electrode 6 are simultaneously formed by the methods described above, for example, by using the same material and performing vacuum deposition through a mask. At this time, wires 103 and 104 are formed on the substrate 1 so as to be lined up apart from each other with the direction intersecting at least one first wire (for example, line 101) as a longitudinal direction. In a case in which there are wires required other than the wires 103 and 104 illustrated in FIG. 11(*c*), the required number of wires are formed in the same manner as that for these wires 103 and 104. The source electrode 5 and the drain electrode 6 are illustrated by two pairs (two each) in FIG. 11(*c*) but are each formed on the gate insulating layer 3 by the same number as that of the plurality of memory elements to be fabricated. Each of the plurality of source electrodes 5 is electrically connected to at least one wire such as the wire 103 or 104 illustrated in FIG. 11(*c*).

Next, a semiconductor layer forming step is performed as illustrated in FIG. 11(*d*). In this step, a semiconductor layer 4 is formed in a region between the source electrode 5 and drain electrode 6 in each of the plurality of memory elements to be fabricated so as to be in contact with the gate insulating layer 3. The semiconductor layer 4 in contact with the upper surface of the gate insulating layer 3 is formed by, for example, applying a solution containing CNT to a region between the source electrode 5 and drain electrode 6 which are constituents of a memory element 130 and drying the solution. The semiconductor layer 4 is formed in a region between the source electrode 5 and drain electrode 6 which are constituents of a memory element 131 in the same manner as this.

Next, a coating step is performed as illustrated in FIG. 11(*e*). The coating layer to be formed in this step is a coating layer 11*a* or a coating layer 11*b* which have different electric properties from each other. In this step, the coating layer 11*a* or the coating layer 11*b* is formed in a region between the source electrode 5 and drain electrode 6 in each of the plurality of memory elements on the substrate 1 in accordance with the information to be recorded so as to be in contact with the semiconductor layer 4 from the side opposite to the gate insulating layer 3. For example, with respect to the memory element 130, a solution which contains an insulating material and is for forming the coating layer 11*a* is applied in a region between the source electrode 5 and the drain electrode 6 so as to cover the semiconductor layer 4, and dried if necessary to form the coating layer 11*a*. With respect to the memory element 131, a solution which contains an insulating material and is for forming the coating layer 11*b* is applied in a region between the source electrode 5 and the drain electrode 6 so as to cover the semiconductor layer 4, and dried if necessary to form the coating layer 11*b*. In this manner, the plurality of memory elements on the substrate 1 are separately fabricated into two kinds of memory elements having different electric properties from each other (that is, the information to be recorded is different from each other) depending on the coating layer (coating layer 11*a* or coating layer 11*b*). As a result, it is possible to fabricate a memory array in which unique information determined by arbitrary arrangement of these two kinds of memory elements is recorded. In addition, the method for imparting different electric properties to the memory elements 130 and 131 may be a method in which only either of the coating layer 11*a* or 11*b* is formed in addition to the method described above.

Moreover, the coating method in this step is preferably any one selected from the group consisting of an inkjet method, a dispenser method, and a spray method in the same manner as in the case of the coating step described above. Among these, an inkjet method is more preferable.

As described above, when the memory array of the present invention is manufactured, a collective process in which the respective constituents of all the memory elements to be fabricated are collectively formed on the same substrate can be used in each step before a semiconductor layer is formed. Thereafter, it is possible to selectively form a semiconductor layer only on a specific memory element by a coating method or to separately form two kinds of semiconductor layers having different electric properties from each other on every memory element by a coating method.

In any of the methods for manufacturing a memory array described above, memory elements capable of recording either information of "0" or "1" can be separately fabricated in the same step by a simple method called a coating method.

Any of such manufacturing methods is advantageous in terms of process and cost when manufacturing a large number of memory arrays having different recorded information from each other. The respective memory arrays having different recorded information from each other have different arrangements in which memory elements for recording "0" information and memory elements for recording "1" information are arbitrarily combined from each other. When it is attempted to form the memory arrays so that the arrangements of these two kinds of memory elements are different from each other for every memory array, the processes and cost usually increase for the reasons, for example, that a photomask corresponding to every memory array is required. According to the method for manufacturing a memory array of the present invention, the position of the memory element on which a coating layer such as a semiconductor layer is formed can be easily changed for every memory array without using a mask and this makes it possible to manufacture many kinds of memory arrays in which the arrangements of these two kinds of memory elements are different from each other. For this reason, it is possible to manufacture a large number of memory arrays having different recorded information from each other by a simple process and at low cost.

(Method for Manufacturing Rectifying Circuit)

A method for manufacturing a rectifying circuit according to the present invention will be described. The method for manufacturing a rectifying circuit according to the present invention includes at least a step of forming a functional layer exhibiting a rectifying action in a region between the source electrode and the drain electrode in the rectifying element of the rectifying circuit through coating and drying. In addition, in this manufacturing method, the methods for forming the electrodes, gate insulating layer, and functional layer exhibiting a rectifying action, which constitute the rectifying element to be manufactured are as described above. The rectifying element of the rectifying circuit according to the present invention can be manufactured by appropriately selecting the order of forming methods of these. Furthermore, a rectifying circuit can be manufactured by electrically connecting a capacitor constituting the rectifying circuit to the rectifying element. The capacitor may be a generally used capacitor, and the manufacturing method thereof is not particularly limited. A transistor, a resistive element and the like may be further electrically connected if necessary. In addition, the method for electrically connecting these to each other may also be any method as long as electrical conduction can be achieved, and the width and thickness of the connection portion are arbitrary.

Figure 12:
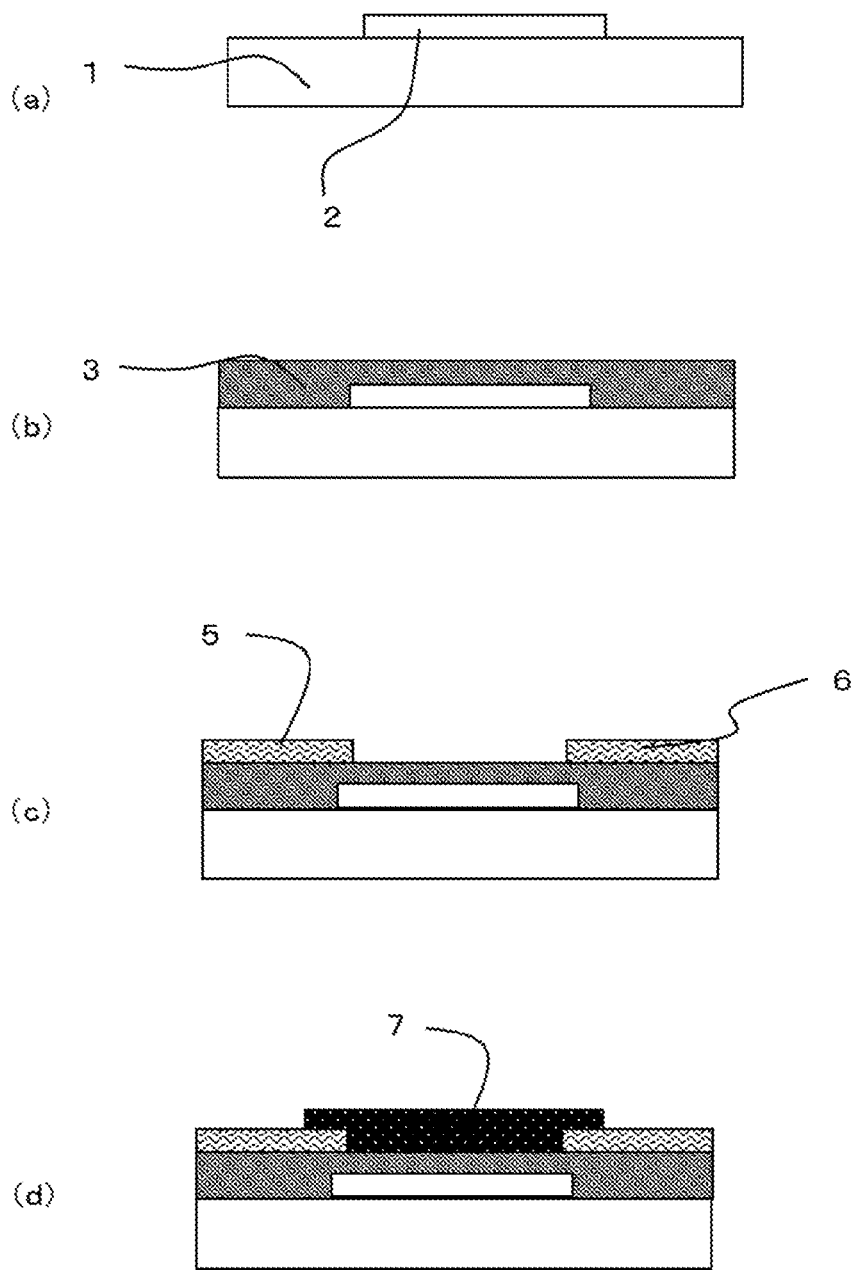
FIG. 12 is a cross-sectional view illustrating an embodiment of a step of manufacturing a rectifying element of a rectifying circuit of the present invention.

The method for manufacturing the rectifying element of the rectifying circuit is not particularly limited, but an example will be described with reference to FIG. 12. First, as illustrated in FIG. 12(a), a gate electrode 2 is formed on a substrate 1 by the method described above. Next, a gate insulating layer 3 is formed as illustrated in FIG. 12(b). Next, as illustrated in FIG. 12(c), a source electrode 5 and a drain electrode 6 are simultaneously formed on the upper portion of the gate insulating layer 3 using the same material by the method described above. Next, as illustrated in FIG. 12(d), a functional layer 7 exhibiting a rectifying action is formed between the source electrode 5 and the drain electrode 6 by the method described above. The coating method in the coating step of the functional layer exhibiting a rectifying action is not particularly limited but is preferably any one selected from the group consisting of an inkjet method, a dispenser method, and a spray method. Among these, an inkjet method is more preferable as the coating method from the viewpoint of use efficiency of raw materials. Next, although not illustrated, the drain electrode 6 and the gate electrode 2 are electrically connected to each other through a conductor wire, whereby a rectifying element of a rectifying circuit can be fabricated.

(Method for Manufacturing Logic Circuit)

A method for manufacturing a logic circuit according to the present invention will be described. The method for manufacturing a logic circuit according to the present invention includes at least a step of forming a channel layer in a region between the source electrode and the drain electrode in the logic element of the logic circuit through coating and drying. In addition, in this manufacturing method, the methods for forming the electrodes, gate insulating layer, and channel layer constituting the logic element to be manufactured are as described above. The logic element of the logic circuit according to the present invention can be manufactured by appropriately selecting the order of the methods for forming these.

The method for manufacturing a logic element of a logic circuit is not particularly limited, but it is preferable that the p-channel transistor and the n-channel transistor are not separately formed but are simultaneously formed from the viewpoint of manufacturing cost and process simplicity in the case of including a p-channel transistor and an n-channel transistor. For this reason, it is preferable that these have the same structure.

Here, simultaneous formation refers to that two electrodes and layers are formed together by performing the process required to form the electrodes and layers one time.

All of these steps can be applied even in a case in which the structures of the p-channel transistor and n-channel transistor are different from each other, but it is easier to apply these steps in a case in which these have the same structure.

Figure 13:
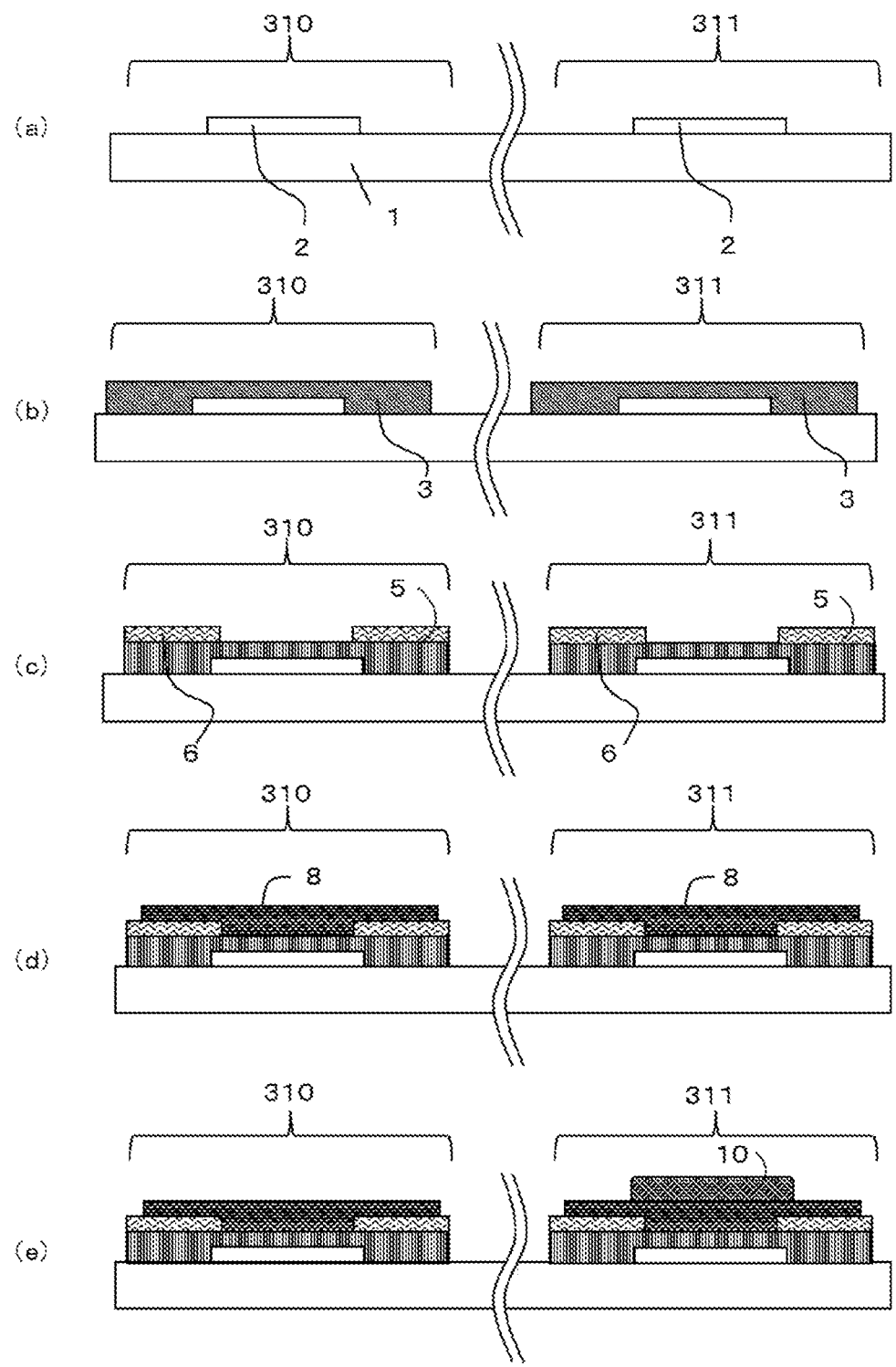
FIG. 13 is a cross-sectional view illustrating an embodiment of a step of manufacturing a logic element of a logic circuit of the present invention.

Hereinafter, an example of the method for manufacturing a logic element of a logic circuit will be specifically described. First, as illustrated in FIG. 13(a), a gate electrode 2 is formed in a p-channel transistor region 310 on a substrate 1 and a gate electrode 2 is formed in an n-channel transistor 311 by the method described above. Next, as illustrated in FIG. 13(b), a gate insulating layers 3 of the p-channel transistor 310 and n-channel transistor 311 are formed. Next, as illustrated in FIG. 13(c), a source electrode 5 and a drain electrode 6 are simultaneously formed on the upper portion of the gate insulating layers 3 of the p-channel transistor 310 and n-channel transistor 311 using the same material by the method described above. Next, as illustrated in FIG. 13(d), a channel layer 8 is formed between the source electrode 5 and drain electrode 6 of the p-channel transistor 310 and between the source electrode 5 and drain electrode 6 of the n-channel transistor 311 by the method described above. Next, as illustrated in FIG. 13(e), a second insulating layer 10 is formed so as to cover the channel layer 8 of the n-channel transistor by the method described above, whereby the logic element of the logic circuit can be fabricated.

Incidentally, it is preferable that the gate electrodes 2 of the p-channel transistor 310 and n-channel transistor 311 are formed of the same material since the use efficiency of material is improved and the kinds of materials decrease. For the same reason, it is preferable that the channel layers 8 of the p-channel transistor 310 and n-channel transistor 311 are formed of the same material. In addition, the coating method in the coating step of the channel layer 8 is not particularly limited but is preferably any one selected from the group consisting of an inkjet method, a dispenser method, and a spray method. Among these, an inkjet method is more preferable as the coating method from the viewpoint of use efficiency of raw materials.

(Method for Manufacturing Integrated Circuit)

A method for manufacturing an integrated circuit according to the present invention will be described. In the method for manufacturing an integrated circuit according to the present invention, the methods for forming the memory array, rectifying circuit, and logic circuit to be manufactured are as described above. The integrated circuit according to the present invention can be manufactured by forming these circuits.

In the method for manufacturing an integrated circuit of the present invention, it is preferable that all of the first semiconductor layer, the second semiconductor layer, and the third semiconductor layer are formed through coating and drying. In other words, it is preferable to include a step of forming all of the semiconductor layer, the functional layer exhibiting a rectifying action, and the channel layer through coating and drying. Furthermore, in the method for manufacturing an integrated circuit of the present invention, it is preferable that all of the first semiconductor layer, the second semiconductor layer, and the third semiconductor layer are formed through coating and drying in the same step. In other words, it is preferable that all of the semiconductor layer, the functional layer exhibiting a rectifying action, and the channel layer are formed through coating and drying in the same step.

Incidentally, it is preferable to include the following steps (1) to (4) from the viewpoints of the use efficiency of material, fewer kinds of materials, and the process simplicity.

(1) A step of forming a gate electrode of the first semiconductor element, a gate electrode of the second semiconductor element, and a gate electrode of the third semiconductor element in the same step;

(2) a step of forming a gate insulating layer of the first semiconductor element, a gate insulating layer of the second semiconductor element, and a gate insulating layer of the third semiconductor element in the same step;

(3) a step of forming a source electrode or/and a drain electrode of the first semiconductor element, and a source electrode or/and a drain electrode of the second semiconductor element, and a source electrode and/or a drain electrode of the third semiconductor element in the same step; and (4) a step of forming the first semiconductor layer, the second semiconductor layer, and the third semiconductor layer in the same step.

In other words, it is preferable to include the following steps (1) to (4).

(1) A step of forming gate electrodes in a memory element of a memory array, a rectifying element of a rectifying circuit, and a logic element of a logic circuit in the same step;

(2) a step of forming gate insulating layers in a memory element of a memory array, a rectifying element of a rectifying circuit, and a logic element of a logic circuit in the same step;

(3) a step of forming source electrodes or/and drain electrodes in a memory element of a memory array, a rectifying element of a rectifying circuit, and a logic element of a logic circuit in the same step; and (4) a step of forming a semiconductor layer in a memory element of a memory array, a functional layer exhibiting a rectifying action in a rectifying element of a rectifying circuit, and a channel layer in a logic element of a logic circuit in the same step.

Incidentally, it is preferable that the compositions to be applied for forming the first semiconductor layer, the second semiconductor layer, and the third semiconductor layer are all the same composition from the viewpoints of the use efficiency of material and fewer kinds of materials. In other words, it is preferable that the compositions to be applied for forming the semiconductor layer, the functional layer exhibiting a rectifying action, and the channel layer are all the same composition.

In addition, it is preferable that the concentration of the composition to be applied for forming the second semiconductor layer is different from the concentration of the composition to be applied for forming the third semiconductor layer. In other words, it is preferable that the concentration of the composition to be applied for forming a functional layer exhibiting a rectifying action in a rectifying element of a rectifying circuit is different from the concentration of the composition to be applied for forming a channel layer in a logic element of a logic circuit. Alternatively, it is preferable that the amount of the composition to be applied for forming the second semiconductor layer is different from the amount of the composition to be applied for forming the third semiconductor layer. In other words, it is preferable that the amount of the composition to be applied for forming a functional layer exhibiting a rectifying action in a rectifying element of a rectifying circuit is different from the amount of the composition to be applied for forming a channel layer in a logic element of a logic circuit. This makes it possible to achieve low power loss of the rectifying element of the rectifying circuit and the operation of the logic element of the logic circuit at a high speed.

<Radio Communication Device>

Next, a radio communication device including the integrated circuit of the present invention will be described. This radio communication device is a device for performing electrical communication by receiving carrier waves transmitted from an antenna mounted on a reader/writer, for example, RFID by RFID tags. As a specific operation, for example, a radio signal transmitted from an antenna mounted on a reader/writer is received by an antenna of an RFID tag and is converted into a direct current by the rectifying circuit, and the RFID tag is electrified. Next, the electrified RFID tag receives a command from the radio signal and performs an operation according to the command. After that, a response of the result corresponding to the command is transmitted from the antenna of the RFID tag to the antenna of the reader/writer as a radio signal. Incidentally, the operation corresponding to the command is performed in a logic circuit including at least known demodulation circuit, operation control logic circuit, modulation circuit, and the like.

Figure 14:
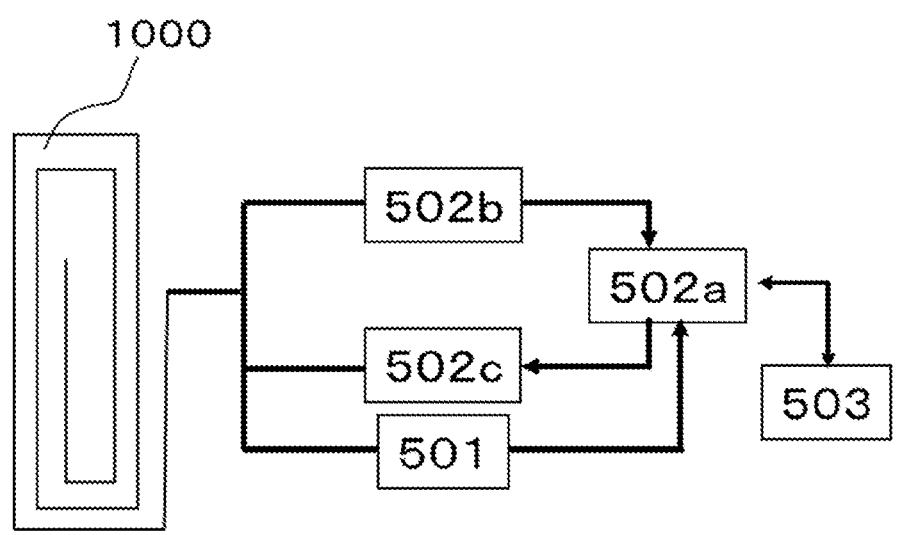
FIG. 14 is a block diagram illustrating an example of a radio communication device including an integrated circuit of the present invention.

The radio communication device of the present invention includes at least the integrated circuit described above and an antenna electrically connected to the integrated circuit. Examples of a more specific configuration include a radio communication device which includes a rectifying circuit 501 which rectifies a modulated wave signal received from the outside by an antenna 1000 and supplies power to each portion and a logic circuit including a demodulation circuit 502b which demodulates the modulated wave signal and sends the demodulated wave signal to a control circuit 502a, a modulation circuit 502c which modulates the data sent from the control circuit 502a and sends the modulated data to the antenna 1000, and the control circuit 502a which writes the data demodulated by the demodulation circuit 502b to a memory array 503, reads data from the memory array 503, and transmits the data to the modulation circuit 502c and in which the respective circuit portions are electrically connected to each other, for example, as illustrated in FIG. 14. The logic circuit may further include a capacitor, a resistive element, a diode, and the like, if necessary.

The antenna, the capacitor, the resistive element, the diode, and the like may be generally used ones, and the shapes thereof and the materials to be used are not particularly limited. In addition, the material for electrically connecting these to each other may be any material as long as it is a conductive material which can be generally used. The connection method may be any method as long as electrical conduction can be achieved, and the width and thickness of the connection portion are arbitrary.

EXAMPLES

Hereinafter, the present invention will be described more specifically with reference to Examples. Incidentally, the present invention is not limited to the following Examples.

Semiconductor Solution Preparation Example 1;
Semiconductor Solution A

To 50 mL of chloroform, 1.0 mg of CNT1 was added, and the mixture was subjected to dispersion for 1 hour using an ultrasonic cleaning machine. Furthermore, 5 mL of this dispersion was taken, diluted to 100 mL, and further subjected to dispersion for 2 hours using an ultrasonic cleaning machine to obtain a CNT dispersion A. The obtained CNT dispersion A was filtered using a membrane filter (pore size: 10 µm, diameter: 25 mm, Omnipore Membrane manufactured by Merck KGaA) to remove CNTs having a length of 10 µm or more, thereby obtaining a semiconductor solution A.

Semiconductor Solution Preparation Example 2;
Semiconductor Solution B1 and Semiconductor
Solution B2

First, 1.0 mg of CNT1 (manufactured by CNI (Changchun New Industries Optoelectronics Tech. Co., Ltd.), single-walled CNT, 95% purity) was added to a solution of 2.0 mg of poly(3-hexylthiophene) (P3HT) (manufactured by Merck KGaA) in 10 ml of chloroform, and the mixture was subjected to ultrasonic stirring for 4 hours at an output of 20% using an ultrasonic homogenizer (VCX-500, manufactured by TOKYO RIKAKIKAI CO., LTD.) while being subjected to ice cooling, thereby obtaining a CNT dispersion B (concentration of CNT composite with respect to solvent: 0.96 g/l).

Next, a semiconductor solution for forming a semiconductor layer was prepared. The CNT dispersion B was filtered using a membrane filter (pore size: 10 μm, diameter: 25 mm, Omnipore Membrane manufactured by Merck KGaA) to remove CNT composites having a length of 10 μm or more. To the filtrate obtained, 5 ml of o-DCB (manufactured by FUJIFILM Wako Pure Chemical Corporation) was added, and then chloroform as a low boiling point solvent was distilled off using a rotary evaporator to replace the solvent with o-DCB, thereby obtaining a CNT dispersion B'. A semiconductor solution B1 (concentration of CNT composite with respect to solvent: 0.03 g/l) was obtained by adding 3 mL of o-DCB to 1 ml of the CNT dispersion B', and a semiconductor solution B2 (concentration of CNT composite with respect to solvent: 0.06 g/l) was obtained by adding 1.5 mL of o-DCB to 1 mL of the CNT dispersion B'.

Composition Preparation Example 1; Gate Insulating Layer Solution A

In 203.36 g of propylene glycol monobutyl ether (boiling point: 170° C.), 61.29 g (0.45 mol) of methyltrimethoxysilane, 12.31 g (0.05 mol) of 2-(3,4-epoxycyclohexyl)ethyltrimethoxysilane, and 99.15 g (0.5 mol) of phenyltrimethoxysilane were dissolved, and 54.90 g of water and 0.864 g of phosphoric acid were added to this while performing stirring. The solution obtained was heated at a bath temperature of 105° C. for 2 hours to raise the internal temperature to 90° C., and components mainly including methanol as a by-product were distilled off. Subsequently, the resultant solution was heated at a bath temperature of 130° C. for 2.0 hours to raise the internal temperature to 118° C., and components mainly including water and propylene glycol monobutyl ether were distilled off, and then the resultant solution was cooled to room temperature, thereby obtaining a polysiloxane solution A having a solid concentration of 26.0% by weight. The weight average molecular weight of the polysiloxane obtained was 6,000.

A gate insulating layer solution A was obtained by weighing 10 g of the polysiloxane solution A obtained, mixing the polysiloxane solution A with 54.4 g of propylene glycol monoethyl ether acetate (hereinafter, referred to as PGMEA), and stirring the mixture at room temperature for 2 hours.

Example 1

The memory element of the memory array illustrated in FIG. 2, the rectifying element of the rectifying circuit illustrated in FIG. 2, and the logic element of the logic circuit illustrated in FIG. 6 were fabricated. First, chromium and gold were vacuum-deposited on a glass substrate 1 (film thickness: 0.7 mm) in thicknesses of 5 nm and 50 nm, respectively through a mask by a resistive heating method, thereby forming the gate electrodes 2 and first wires 101 and 102 in the memory elements 110, 111, 112, and 113 of the memory array illustrated in FIG. 2, the gate electrode 2 in the rectifying element of the rectifying circuit illustrated in FIG. 2, and the gate electrode 2 in the logic element of the logic circuit illustrated in FIG. 6. Next, the substrate was spin-coated (2000 rpm×30 seconds) with Ethyl Silicate 28 (trade name, manufactured by COLCOAT CO., LTD.) and a heat treatment was performed at 200° C. for 1 hour in a nitrogen stream to form a gate insulating layer 3 of each element having a film thickness of 600 nm. Next, gold was vacuum-deposited to have a film thickness of 50 nm by a resistive heating method, and a photoresist (trade name "LC100-10cP", manufactured by The Dow Chemical Company) was applied (1000 rpm×20 seconds) thereon by a spin coating method and heated and dried at 100° C. for 10 minutes.

Subsequently, the photoresist film fabricated as described above was subjected to pattern exposure through a mask using a parallel light mask aligner (PLA-501F manufactured by Canon Inc.), then subjected to shower development with a 2.38% by weight aqueous solution of tetramethylammonium hydroxide (trade name "ELM-D", manufactured by MITSUBISHI GAS CHEMICAL COMPANY, INC.) for 70 seconds using an automatic development apparatus (AD-2000 manufactured by TAKIZAWA CO., LTD.), and then washed with water for 30 seconds. Thereafter, the photoresist film was subjected to an etching treatment with an etching treatment liquid (trade name "AURUM-302", manufactured by KANTO CHEMICAL CO., INC.) for 5 minutes and then washed with water for 30 seconds. Subsequently, the resist was stripped off by being immersed in a stripper (trade name "AZ Remover 100", manufactured by Merck KGaA) for 5 minutes, washed with water for 30 seconds, and then heated and dried at 120° C. for 20 minutes, thereby forming source electrodes 5 and drain electrodes 6 of the memory element, rectifying element, and logic element and second wires 103 and 104 of the memory array.

The widths of the source electrodes 5 and drain electrodes 6 in the memory element of the memory array and the logic element of the logic circuit were set to 200 μm, and the distances between these electrodes were set to 20 μm. The widths of the source electrode 5 and drain electrode 6 in the rectifying element of the rectifying circuit were set to 500 μm, and the distance between these electrodes was set to 20 μm. The memory elements 110 and 113 of the memory array, the rectifying element of the rectifying circuit, and the logic element of the logic circuit were coated with 100 pl of the semiconductor solution A on the substrate 1 on which the respective electrodes were formed as described above by an inkjet method and subjected to a heat treatment at 150° C. for 30 minutes on a hot plate in a nitrogen stream, thereby forming a semiconductor layer in the memory element of the memory array, a functional layer exhibiting a rectifying action in the rectifying element of the rectifying circuit, and a channel layer in the logic element of the logic circuit. The integrated circuit of Example 1 was thus obtained. Next, an image of the channel layer in the logic element of the logic circuit was acquired using an atomic force microscope Dimension Icon (manufactured by Bruker Corporation), and the total length of CNT composites present per arbitrary 1 μm² was measured and found to be 8 μm. In addition, the total length of CNT composites present per 1 μm² of the semiconductor layer in the rectifying element of the rectifying circuit was measured in the same manner and found to be 8 μm.

(Evaluation)

Next, the electric properties between the source electrode and drain electrode in the memory element constituting the memory array of Example 1 were measure, that is, the source-drain current (Id) when the voltage (Vg) of the gate electrode in the memory element was changed was measured. This measurement was performed in the air using a semiconductor property evaluation system 4200-SCS (manufactured by Keithley Instruments, LLC.). Specifically, the values of Id at Vg=−3V and Vsd=−5V were thus measured. The results are presented in Table 1. As can be seen from Table 1, there was a sufficient difference in Id flowing between the source electrode and the drain electrode in the memory element 110 and memory element 113 which had the semiconductor layer 4 and the memory element 111 and memory element 112 which did not have the semiconductor layer 4 in Example 1. From this result, it has been confirmed that information different from each other is recorded in the memory element 110 and memory element 113 and information different from each other is recorded in the memory element 111 and the memory element 112 in Example 1.

Next, the current-voltage properties of the rectifying element of the rectifying circuit of Example 1 were measured. The measurement was performed by a two-terminal method in which the gate electrode and the drain electrode were electrically connected to each other through a gold wire, the source electrode was set as input, and the gate electrode and the drain electrode were set as output. The measurement was performed in the air (temperature: 20° C., humidity: 35%), and it was confirmed that a rectifying action was attained. Next, the rectifying circuit illustrated in FIG. 5 was fabricated using the rectifying element of a rectifying circuit described above. The capacitance value of a capacitor 202 is 100 [pF]. The source electrode in the rectifying element of the rectifying circuit was connected to an input terminal 201, and the gate electrode and drain electrode in the rectifying element of the rectifying circuit were connected to the capacitor 202 and an output terminal 203. The electrode on the side opposite to the capacitor 202 was electrically connected to the ground potential. When 1 GHz of alternating-current voltage (voltage amplitude: ±5 [V]) was input to the input terminal 201, the direct-current voltage output to the output terminal 203 had an average value of 1.0 [V] and a variation of 0.8 [V].

Next, the properties between the source-drain current (Id) and the source-drain voltage (Vsd) were measured when the gate voltage (Vg) of the logic element of the logic circuit in Example 1 was changed. This measurement was performed in the air using a semiconductor property evaluation system 4200-SCS (manufactured by Keithley Instruments, LLC.). The mobility in the linear region was determined from the change in the value of Id at Vsd=−5V when Vg=+30 to −30V, and the threshold voltage was determined from the intersection of the extended line of the linear part in the Id-Vg graph and the Vg axis.

Example 2

An integrated circuit was fabricated in the same manner as in Example 1 except that the semiconductor solution B2 was used instead of the semiconductor solution B1 in the formation of the functional layer exhibiting a rectifying action in the rectifying element of the rectifying circuit. Next, an image of the channel layer in the logic element of the logic circuit was acquired using an atomic force microscope Dimension Icon (manufactured by Bruker Corporation), and the total length of CNT composites present per arbitrary 1 µm$^2$ was measured and found to be 10 µm. In addition, the total length of CNT composites present per 1 µm$^2$ of the functional layer exhibiting a rectifying action in the rectifying element of the rectifying circuit was measured in the same manner and found to be 25 µm.

Example 3

An integrated circuit was fabricated in the same manner as in Example 2 except that the functional layer exhibiting a rectifying action in the rectifying element of the rectifying circuit was formed by dropping 1000 pl of the semiconductor solution B1. The total length of CNT composites present per 1 µm$^2$ of the channel layer in the logic element of the logic circuit was measured in the same manner as in Example 1 and found to be 11 µm. In addition, the total length of CNT composites present per 1 µm$^2$ of the functional layer exhibiting a rectifying action in the rectifying element of the rectifying circuit was measured and found to be 53 µm.

Example 4

An integrated circuit was fabricated in the same manner as in Example 2 except that the functional layer exhibiting a rectifying action in the rectifying element of the rectifying circuit was formed by dropping 300 pl of the semiconductor solution B1 and the channel layer in the logic element of the logic circuit was formed by dropping 70 pl of the semiconductor solution B1. The total length of CNT composites present per 1 µm$^2$ of the channel layer in the logic element of the logic circuit was measured in the same manner as in Example 1 and found to be 8 µm. In addition, the total length of CNT composites present per 1 µm$^2$ of the functional layer exhibiting a rectifying action in the rectifying element of the rectifying circuit was measured and found to be 15 µm.

Example 5

An integrated circuit was fabricated in the same manner as in Example 2 except that the functional layer exhibiting a rectifying action in the rectifying element of the rectifying circuit was formed by dropping 5000 pl of the semiconductor solution B1 and the channel layer in the logic element of the logic circuit was formed by dropping 3000 pl of the semiconductor solution B1. The total length of CNT composites present per 1 µm$^2$ of the channel layer in the logic element of the logic circuit was measured in the same manner as in Example 1 and found to be 82 µm. In addition, the total length of CNT composites present per 1 µm$^2$ of the functional layer exhibiting a rectifying action in the rectifying element of the rectifying circuit was measured and found to be 102 µm.

Example 6

An integrated circuit was fabricated in the same manner as in Example 2 except that the channel layer in the logic element of the logic circuit was formed by dropping 250 pl of the semiconductor solution B1. The total length of CNT composites present per 1 µm$^2$ of the channel layer in the logic element of the logic circuit was measured in the same manner as in Example 1 and found to be 18 µm. In addition, the total length of CNT composites present per 1 µm$^2$ of the functional layer exhibiting a rectifying action in the rectifying element of the rectifying circuit was measured and found to be 27 µm.

Example 7

An integrated circuit was fabricated in the same manner as in Example 2 except that the channel layer in the logic element of the logic circuit was formed by dropping 10 pl of the semiconductor solution B1. The total length of CNT composites present per 1 μm² of the channel layer in the logic element of the logic circuit was measured in the same manner as in Example 1 and found to be 2 μm. In addition, the total length of CNT composites present per 1 μm² of the functional layer exhibiting a rectifying action in the rectifying element of the rectifying circuit was measured and found to be 23 μm.

Example 8

The memory element of the memory array illustrated in FIG. 2, the rectifying element of the rectifying circuit illustrated in FIG. 4, and the logic element (p-channel transistor and n-channel transistor) of the logic circuit illustrated in FIG. 7 were fabricated. First, chromium and gold were vacuum-deposited on a glass substrate 1 (film thickness: 0.7 mm) in thicknesses of 5 nm and 50 nm, respectively through a mask by a resistive heating method, thereby forming the gate electrodes 2 and first wires 101 and 102 in the memory elements 110, 111, 112, and 113 of the memory array, the gate electrode in the rectifying element of the rectifying circuit, and the gate electrode in the logic element (p-channel transistor and n-channel transistor) of the logic circuit. Next, the substrate was spin-coated (2000 rpm×30 seconds) with Ethyl Silicate 28 (trade name, manufactured by COLCOAT CO., LTD.) and a heat treatment was performed at 200° C. for 1 hour in a nitrogen stream to form a gate insulating layer 3 of each element having a film thickness of 600 nm. Next, gold was vacuum-deposited to have a film thickness of 50 nm by a resistive heating method, and a photoresist (trade name "LC100-10cP", manufactured by The Dow Chemical Company) was applied (1000 rpm× 20 seconds) thereon by a spin coating method and heated and dried at 100° C. for 10 minutes.

Subsequently, the photoresist film fabricated as described above was subjected to pattern exposure through a mask using a parallel light mask aligner (PLA-501F manufactured by Canon Inc.), then subjected to shower development with a 2.38% by weight aqueous solution of tetramethylammonium hydroxide (trade name "ELM-D", manufactured by MITSUBISHI GAS CHEMICAL COMPANY, INC.) for 70 seconds using an automatic development apparatus (AD-2000 manufactured by TAKIZAWA CO., LTD.), and then washed with water for 30 seconds. Thereafter, the photoresist film was subjected to an etching treatment with an etching treatment liquid (trade name "AURUM-302", manufactured by KANTO CHEMICAL CO., INC.) for 5 minutes and then washed with water for 30 seconds. Subsequently, the resist was stripped off by being immersed in a stripper (trade name "AZ Remover 100", manufactured by Merck KGaA) for 5 minutes, washed with water for 30 seconds, and then heated and dried at 120° C. for 20 minutes, thereby forming source electrodes 5 and drain electrodes 6 of the memory element, rectifying element, and logic element and second wires 103 and 104 of the memory array.

The widths of the source electrodes 5 and drain electrodes 6 in the memory element of the memory array and the logic element of the logic circuit were set to 200 μm, and the distances between these electrodes were set to 20 μm. The widths of the source electrode 5 and drain electrode 6 in the rectifying element of the rectifying circuit were set to 500 μm, and the distance between these electrodes was set to 20 μm. The memory elements 110 and 113 of the memory array, the rectifying element of the rectifying circuit, and the logic element (p-channel transistor and n-channel transistor) of the logic circuit were coated with 100 pl of the semiconductor solution B1, 100 pl of the semiconductor solution B2, and 200 pl of the semiconductor solution B1, respectively on the substrate 1 on which the electrodes were formed as described above by an inkjet method and subjected to a heat treatment at 150° C. for 30 minutes on a hot plate in a nitrogen stream, thereby forming a semiconductor layer in the memory element, a channel layer in the logic element, and a functional layer exhibiting a rectifying action in the rectifying element. Next, 50 μL of DBU (manufactured by Tokyo Chemical Industry Co., Ltd.) was dropped on the channel layer in the n-channel transistor of the logic circuit so as to cover the channel layer and subjected to a heat treatment at 150° C. for 1 hour in a nitrogen stream to form a second insulating layer, thereby obtaining an n-channel transistor. The integrated circuit of Example 8 was thus obtained. The total length of CNT composites present per 1 μm² of the channel layer in the logic element of the logic circuit was measured in the same manner as in Example 1 and found to be 16 μm. In addition, the total length of CNT composites present per 1 μm² of the functional layer exhibiting a rectifying action in the rectifying element of the rectifying circuit was measured and found to be 24 μm.

Example 9

An integrated circuit was fabricated in the same manner as in Example 2 except that the gate insulating layer solution A was used instead of the Ethyl Silicate 28. The total length of CNT composites present per 1 μm² of the channel layer in the logic element of the logic circuit was measured in the same manner as in Example 1 and found to be 11 μm. In addition, the total length of CNT composites present per 1 μm² of the functional layer exhibiting a rectifying action in the rectifying element of the rectifying circuit was measured and found to be 28 μm.

TABLE 1

| | | | Semiconductor solution | | | | |
|---|---|---|---|---|---|---|---|
| | Circuit | Configuration | Semiconductor solution | Concentration (g/L) | Coated amount | CNT total length | Gate insulating layer solution |
| Example 1 | Memory | FIG. 2 | Semiconductor solution A | 0.02 | 100 pl | | Ethyl silicate |
| | Rectifying | FIG. 4 | Semiconductor solution A | 0.02 | 100 pl | 8 um | Ethyl silicate |
| | Logic | FIG. 6 | Semiconductor solution A | 0.02 | 100 pl | 8 um | Ethyl silicate |
| Example 2 | Memory | FIG. 2 | Semiconductor solution B1 | 0.03 | 100 pl | | Ethyl silicate |
| | Rectifying | FIG. 4 | Semiconductor solution B2 | 0.06 | 100 pl | 25 um | Ethyl silicate |
| | Logic | FIG. 6 | Semiconductor solution B1 | 0.03 | 100 pl | 10 um (0.4 time that in rectifying circuit) | Ethyl silicate |

TABLE 1-continued

| | Circuit | Configuration | Semiconductor solution | Concentration (g/L) | Coated amount | CNT total length | Gate insulating layer solution |
|---|---|---|---|---|---|---|---|
| Example 3 | Memory | FIG. 2 | Semiconductor solution B1 | 0.03 | 100 pl | | Ethyl silicate |
| | Rectifying | FIG. 4 | Semiconductor solution B1 | 0.03 | 1000 pl | 53 um | Ethyl silicate |
| | Logic | FIG. 6 | Semiconductor solution B1 | 0.03 | 100 pl | 11 um (0.2 time that in rectifying circuit) | Ethyl silicate |
| Example 4 | Memory | FIG. 2 | Semiconductor solution B1 | 0.03 | 100 pl | | Ethyl silicate |
| | Rectifying | FIG. 4 | Semiconductor solution B1 | 0.03 | 300 pl | 15 um | Ethyl silicate |
| | Logic | FIG. 6 | Semiconductor solution B1 | 0.03 | 70 pl | 8 um (0.5 time that in rectifying circuit) | Ethyl silicate |
| Example 5 | Memory | FIG. 2 | Semiconductor solution B1 | 0.03 | 100 pl | | Ethyl silicate |
| | Rectifying | FIG. 4 | Semiconductor solution B1 | 0.03 | 5000 pl | 102 um | Ethyl silicate |
| | Logic | FIG. 6 | Semiconductor solution B1 | 0.03 | 3000 pl | 82 um (0.8 time that in rectifying circuit) | Ethyl silicate |
| Example 6 | Memory | FIG. 2 | Semiconductor solution B1 | 0.03 | 100 pl | | Ethyl silicate |
| | Rectifying | FIG. 4 | Semiconductor solution B2 | 0.06 | 100 pl | 27 um | Ethyl silicate |
| | Logic | FIG. 6 | Semiconductor solution B1 | 0.03 | 250 pl | 18 um (0.7 time that in rectifying circuit) | Ethyl silicate |
| Example 7 | Memory | FIG. 2 | Semiconductor solution B1 | 0.03 | 100 pl | | Ethyl silicate |
| | Rectifying | FIG. 4 | Semiconductor solution B2 | 0.06 | 100 pl | 23 um | Ethyl silicate |
| | Logic | FIG. 6 | Semiconductor solution B1 | 0.03 | 10 pl | 2 um (0.1 time that in rectifying circuit) | Ethyl silicate |
| Example 8 | Memory | FIG. 2 | Semiconductor solution B1 | 0.03 | 100 pl | | Ethyl silicate |
| | Rectifying | FIG. 4 | Semiconductor solution B2 | 0.06 | 100 pl | 24 um | Ethyl silicate |
| | Logic | FIG. 7 | Semiconductor solution B1 | 0.03 | 200 pl | 16 um (0.7 time that in rectifying circuit) | Ethyl silicate |
| Example 9 | Memory | FIG. 2 | Semiconductor solution B1 | 0.03 | 100 pl | | Gate insulating layer solution A |
| | Rectifying | FIG. 4 | Semiconductor solution B2 | 0.06 | 100 pl | 28 um | Gate insulating layer solution A |
| | Logic | FIG. 6 | Semiconductor solution B1 | 0.03 | 100 pl | 11 um (0.4 time that in rectifying circuit) | Gate insulating layer solution A |

TABLE 2

| | Current value in semiconductor element of memory array [uA] | | | | Evaluation result of rectifying circuit | Evaluation result of logic circuit | | Threshold voltage (absolute value) [V] | |
|---|---|---|---|---|---|---|---|---|---|
| | Memory element 110 | Memory element 111 | Memory element 112 | Memory element 113 | | Mobility [cm$^2$/Vs] | | | |
| Example 1 | 0.09 | 1 nA or less | 1 nA or less | 0.07 | Output voltage: 1.0 V (Variation: 0.8 V) | 0.05 | — | 9.8 | — |
| Example 2 | 1.15 | 1 nA or less | 1 nA or less | 1.02 | Output voltage: 3.1 V (Variation: 0.7 V) | 0.89 | — | 1.2 | — |
| Example 3 | 1.08 | 1 nA or less | 1 nA or less | 0.95 | Output voltage: 3.5 V (Variation: 1.3 V) | 0.79 | — | 1.4 | — |
| Example 4 | 1.10 | 1 nA or less | 1 nA or less | 0.89 | Output voltage: 2.7 V (Variation: 0.9 V) | 0.75 | — | 1.1 | — |
| Example 5 | 1.13 | 1 nA or less | 1 nA or less | 0.92 | Output voltage: 2.8 V (Variation: 1.6 V) | 0.95 | — | 2.9 | — |
| Example 6 | 1.15 | 1 nA or less | 1 nA or less | 0.89 | Output voltage: 3.6 V (Variation: 0.7 V) | 0.91 | — | 1.5 | — |
| Example 7 | 1.13 | 1 nA or less | 1 nA or less | 0.98 | Output voltage: 3.5 V (Variation: 0.6 V) | 0.56 | — | 1.2 | — |
| Example 8 | 1.23 | 1 nA or less | 1 nA or less | 1.04 | Output voltage: 3.2 V (Variation: 0.6 V) | 0.89 (p-channel type) | 0.75 (n-channel type) | 1.5 (p-channel type) | 1.3 |
| Example 9 | 1.09 | 1 nA or less | 1 nA or less | 0.90 | Output voltage: 3.9 V (Variation: 0.4 V) | 1.01 | — | 0.7 | — |

DESCRIPTION OF REFERENCE SIGNS

1: Substrate
2: Gate electrode
3: Gate insulating layer
4: Semiconductor layer
5: Source electrode
6: Drain electrode
7: Functional layer exhibiting rectifying action
8: Channel layer
9: Semiconductor layer
10: Second insulating layer of n-channel transistor
11a, 11b: Coating layer
20: Wire
100: Memory array
101, 102: First wire
103, 104: Second wire
110, 111, 112, 113: Memory element of memory array
120, 121, 130, 131: Memory element of memory array
200: Rectifying element of rectifying circuit 201: Input terminal
202: Capacitor
203: Output terminal
300, 310: p-Channel transistor
301, 311: n-Channel transistor
501: Rectifying circuit
502: Logic circuit
502a: Control circuit
502b: Demodulation circuit
502c: Modulation circuit
503: Memory array
1000: Antenna

The invention claimed is:

1. An integrated circuit, comprising at least:
a memory array that stores data;
a rectifying circuit that rectifies an alternating current and generates a direct-current voltage; and
a logic circuit that reads data stored in the memory array, wherein
the memory array includes a first semiconductor memory element having a first semiconductor layer,
the rectifying circuit includes a second semiconductor rectifying element having a second semiconductor layer,
the logic circuit includes a third semiconductor logic element having a third semiconductor layer,
the second semiconductor layer is a functional layer exhibiting a rectifying action and the third semiconductor layer is a channel layer of a logic element, and
the first semiconductor layer, the second semiconductor layer, and the third semiconductor layer are all formed of the same material including at least one selected from carbon nanotubes, graphene, or fullerene, wherein carbon nanotubes present per 1 µm² in the third semiconductor layer have a total length that is 0.7 times or less a total length of carbon nanotubes present per 1 µm² in the second semiconductor layer.

2. The integrated circuit according to claim 1, wherein the first semiconductor layer, the second semiconductor layer, and the third semiconductor layer all contain carbon nanotubes.

3. The integrated circuit according to claim 1, wherein the first semiconductor memory element, the second semiconductor rectifying element, and the third semiconductor logic element are elements including
a gate electrode,
a source electrode or/and a drain electrode in contact with each of the first semiconductor layer, the second semiconductor layer, and the third semiconductor layer, and
a gate insulating layer that insulates the gate electrode from each of the first semiconductor layer, the second semiconductor layer, and the third semiconductor layer, and
the gate electrode of the first semiconductor memory element, the gate electrode of the second semiconductor rectifying element, and the gate electrode of the third semiconductor logic element are all formed of the same material, the source electrode or/and drain electrode of the first semiconductor memory element, the source electrode or/and drain electrode of the second semiconductor rectifying element, and the source electrode or/and drain electrode of the third semiconductor logic element are all formed of the same material, and the gate insulating layer of the first semiconductor memory element, the gate insulating layer of the second semiconductor recitfying element, and the gate insulating layer of the third semiconductor logic element are all formed of the same material.

4. The integrated circuit according to claim 1, wherein at least one of the first semiconductor layer, the second semiconductor layer, or the third semiconductor layer contains a carbon nanotube composite having a conjugated polymer attached to at least a part of a surface of a carbon nanotube.

5. The integrated circuit according to claim 1, wherein the logic circuit further includes a fourth semiconductor logic element having a fourth semiconductor layer, the third semiconductor logic element includes a p-channel transistor, and the fourth semiconductor logic element includes an n-channel transistor.

6. The integrated circuit according to claim 1, wherein the gate insulating layer contains at least polysiloxane containing a silane compound represented by Formula (1) as a polymerization component:

$$R^1{}_m Si(OR^2)_{4-m} \qquad (1)$$

wherein
R¹ represents a hydrogen atom, an alkyl group, a cycloalkyl group, a heterocyclic group, an aryl group, a heteroaryl group, or an alkenyl group, and if there is a plurality R¹s, the R¹s may be the same as or different from each other,
R² represents an alkyl group or a cycloalkyl group, and if there is a plurality of R²s, the R²s may be the same as or different from each other and
m represents an integer of 1 to 3.

7. A method for manufacturing the integrated circuit according to claim 1, the method comprising a step of forming all of the first semiconductor layer, the second semiconductor layer, and the third semiconductor layer through coating and drying.

8. The method for manufacturing an integrated circuit according to claim 7, wherein the coating method is any one selected from the group consisting of an inkjet method, a dispenser method, and a spray method.

9. The method for manufacturing an integrated circuit according to claim 7, wherein all of the first semiconductor layer, the second semiconductor layer, and the third semiconductor layer are formed through coating and drying in the same step.

10. The method for manufacturing an integrated circuit according to claim 7, wherein compositions to be applied for forming the first semiconductor layer, the second semiconductor layer, and the third semiconductor layer are all the same composition.

11. The method for manufacturing an integrated circuit according to claim 7, wherein a concentration of a composition to be applied for forming the second semiconductor layer is different from a concentration of a composition to be applied for forming the third semiconductor layer.

12. The method for manufacturing an integrated circuit according to claim 7, wherein a content of a composition to be applied for forming the second semiconductor layer is different from a content of a composition to be applied for forming the third semiconductor layer.

13. The method for manufacturing an integrated circuit according to claim 7, comprising the following steps (1) to (4);
(1) a step of forming a gate electrode of the first semiconductor memory element, a gate electrode of the second semiconductor rectifying element, and a gate electrode of the third semiconductor logic element in the same step;

(2) a step of forming a gate insulating layer of the first semiconductor memory element, a gate insulating layer of the second semiconductor rectifying element, and a gate insulating layer of the third semiconductor logic element in the same step;
(3) a step of forming a source electrode or/and a drain electrode of the first semiconductor memory element, a source electrode or/and a drain electrode of the second semiconductor rectifying element, and a source electrode or/and a drain electrode of the third semiconductor logic element in the same step; and
(4) a step of forming the first semiconductor layer, the second semiconductor layer, and the third semiconductor layer in the same step.

14. A radio communication device comprising the integrated circuit according to claim 1 and an antenna electrically connected to the integrated circuit.

\* \* \* \* \*